(12) United States Patent
Wu et al.

(10) Patent No.: US 11,474,167 B1
(45) Date of Patent: Oct. 18, 2022

(54) METHOD AND AN APPARATUS FOR DETECTING A MAGNETIC FIELD

(71) Applicant: National University of Singapore, Singapore (SG)

(72) Inventors: Yihong Wu, Singapore (SG); Hang Xie, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 17/401,482

(22) Filed: Aug. 13, 2021

(51) Int. Cl.
*G01R 33/07* (2006.01)

(52) U.S. Cl.
CPC .................................. *G01R 33/07* (2013.01)

(58) Field of Classification Search
CPC ..... G01R 33/07; G01R 33/075; G01R 33/093
See application file for complete search history.

(56) References Cited

U.S. PATENT DOCUMENTS

| 3,840,898 | A | 10/1974 | Bajorek et al. | |
|---|---|---|---|---|
| 2017/0279038 | A1* | 9/2017 | Wu | H01L 43/08 |
| 2018/0358542 | A1* | 12/2018 | Mihajlovic | G11C 11/1659 |
| 2019/0172998 | A1* | 6/2019 | Tan | H01F 10/329 |
| 2020/0006627 | A1* | 1/2020 | Manipatruni | G11C 11/1659 |
| 2020/0211609 | A1* | 7/2020 | Wang | G11C 11/161 |

OTHER PUBLICATIONS

Mellnik, et al., Spin-transfer torque generated by a topological insulator. Nature, vol. 511, 2014, pp. 449-451.
Mikuszeit, et al., "Spin-orbit Torque Driven Chiral Magnetization Reversal in Ultrathin Nanostructures", Physical Review B, vol. 92, 2015, pp. 144424-1-144424-5.
Miron, et al., "Current-driven Spin Torque Induced by the Rashba Effect in a Ferromagnetic Metal Layer", Nature Materials, vol. 9, 2010, pp. 230-234.
Miron, et al., "Perpendicular Switching of a Single Ferromagnetic Layer Induced By In-plane Current Injection", Nature, 2011, vol. 476, pp. 189-193.

(Continued)

*Primary Examiner* — Alvaro E Fortich
(74) *Attorney, Agent, or Firm* — Botos Churchill IP Law

(57) ABSTRACT

A method for detecting a magnetic field using a spin-orbit torque magnetic field sensor is described. The spin-orbit torque magnetic field sensor comprises a magnetic layer having a switchable magnetic state. The method comprises: (i) providing an alternating current to the sensor for creating an oscillatory spin-orbit torque in the magnetic layer to switch the switchable magnetic state between two magnetic states; and (ii) measuring an output voltage of the sensor, the output voltage being dependent on the magnetic field and is a time average of a time-varying anomalous Hall voltage generated in the magnetic layer in response to the oscillatory spin-orbit torque and the magnetic field. The time-varying anomalous Hall voltage is a function of the alternating current and a Hall resistance of the magnetic layer, and the Hall resistance is associated with a duration in which the switchable magnetization is in each of the two magnetic states and the duration is associated with a magnitude and a polarity of the magnetic field. An apparatus for performing the method is also described.

20 Claims, 24 Drawing Sheets

(56) References Cited

OTHER PUBLICATIONS

Oh, et al., "Field-free Switching of Perpendicular Magnetization Through Spin-orbit Torque in Antiferromagnet/ferromagnet/oxide Structures", Nature Nanotechnology, 2016, vol. 11, pp. 878-884.
Ostwal, et al., "Spin-orbit Torque-controlled Magnetic Tunnel Junction With Low Thermal Stability for Tunable Random Number Generation", IEEE Magnetics Letters, vol. 10, 2019, pp. 4503305-1-4503305-4.
Pai, et al., "Spin Transfer Torque Devices Utilizing the Giant Spin Hall Effect of Tungsten", Applied Physical Letters, vol. 101, 2012, pp. 122404-1-122404-4.
Parkin, et al., "Magnetically Engineered Spintronic Sensors and Memory", Proceedings of the IEEE, vol. 91, 2003, pp. 661-680.
Pizzini, et al., "Chirality-Induced Asymmetric Magnetic Nucleation in Pt/Co/AlOx Ultrathin Microstructures", Physical Review Letters, vol. 113, 2014, pp. 047203-047203-5.
Ripka, et al., "Advances in Magnetic Field Sensors", IEEE Sensors Journal, vol. 10, 2010, pp. 1108-1116.
Safeer, et al., "Room-Temperature Spin Hall Effect in Graphene/MoS2 van der Waals Heterostructures", Nano Letters, vol. 19, 2019, pp. 1074-1082.
Shao, et al., "Strong Rashba-Edelstein Effect-Induced Spin-Orbit Torques in Monolayer Transition Metal Dichalcogenide/Ferromagnet Bilayers", Nano Letters, vol. 16, 2016, pp. 7514-7520.
Shi, et al., "All-electric Magnetization Switching and Dzyaloshinskii-Moriya Interaction in WTe2/ferromagnet Heterostructures, Nat. Nanotechnology", vol. 14, 2019, pp. 945-949.
Shi, et al., "Efficient Charge-spin Conversion and Magnetization Switching Through the Rashba Effect at Topological-insulator/Ag interfaces", Physical Review B, vol. 97, 2018, pp. 041115-1-041115-5.
Shimabukuro, et al., "Electric Field Effects on Magnetocrystalline Anisotropy in Ferromagnetic Fe Monolayers", Physica E, vol. 42, 2010, pp. 1014-1017.
Silva, et al., "Linearization Strategies for High Sensitivity Magnetoresistive Sensors", The European Physical Journal Applied Physics, 2015, vol. 72, pp. 10601-1-10601-20.
Sinova, et al., "Spin Hall effects", Reviews Modern Physics, 2015, vol. 87, pp. 1213-1259.
Steihl, et al., "Layer-dependent Spin-orbit Torques Generated By the Centrosymmetric Transition Metal Dichalcogenide MoTe2", Physical Review B, vol. 100, 2019, 184402-1-184402-12.
Tanaka, et al., "Intrinsic Spin Hall Effect and Orbital Hall Effect in 4d and 5d Transition Metals", Physical Review B, vol. 77, 2008, pp. 165117-1-165117-16.
Tumanski, "Modern Magnetic Field Sensors—a Review", Organ, vol. 10, 2013, pp. 1-11.
Van Den Brink, et al., "Field-free Magnetization Reversal by Spin-Hall Effect and Exchange Bias", Nature Communications, 2016, vol. 7, Article No. 10854, pp. 1-14.
Wang, et al., "Advances in Giant Magnetoresistance Biosensors With Magnetic Nanoparticle Tags: Review and Outlook", IEEE Transactions on Magnetics, vol. 44, 2008, pp. 1687-1702.
Wu, "Nano Spintronics for Data Storage", Encyclopedia of Nanoscience and Nanotechnology, edited by H. S. Nalwa (American Scientific Publishers, Stevenson Ranch, 2003), vol. 7, p. 493-544.
Wu, et al., "Room-Temperature Spin-Orbit Torque from Topological Surface States", Physical Review Letters, vol. 123, 2019, pp. 207205-1-207205-6.
Xie, et al., "In Situ Study of Oxygen and Mg Effects on Current-induced Magnetization Switching in Pt/Co Bilayers in Ultrahigh Vacuum", Applied Physical Letters, vol. 116, 2020, pp. 122404-1-122404-4.
Xu, et al., "High Spin Hall Conductivity in Large-Area Type-II Dirac Semimetal PtTe2", Advanced Materials, vol. 32, 2020, pp. 2000513-1-2000513-9.
Xu, et al., "Macro-spin Modeling and Experimental Study of Spin-orbit Torque Biased Magnetic Sensors", Journal Applied Physics, vol. 122, 2017, 193904-1-193904-12.
Xu, et al., "Spin Hall Magnetoresistance Sensor Using AuxPt1-x As the Spin-orbit Torque Biasing Layer", Applied Physics Letters, vol. 115, 2019, pp. 182406-1-182406-5.
Xu, et al., "Ultrathin All-in-one Spin Hall Magnetic Sensor With Built-in AC Excitation Enabled By Spin Current", Advanced Materials Technology, vol. 3, 2018, pp. 1800073-1-1800073-9.
Xu, et al., Eddy Current Testing of Metal Cracks Using Spin Hall Magnetoresistance Sensor and Machine Learning, EEE Sensors Journal, vol. 20, 2020, pp. 10502-10510.
Yang, et al., "Multistate Magnetization Switching Driven by Spin Current From a Ferromagnetic Layer", Physical Review Applied, vol. 13, 2020, pp. 034072-1-034072-9.
Yang, et al., "Semitransparent Anisotropic and Spin Hall Magnetoresistance Sensor Enabled By Spin-orbit Torque Biasing", Applied Physics Letters, vol. 111, 2017, 032402-1-032402-5.
You, et al., "Switching of Perpendicularly Polarized Nanomagnets with Spin Orbit Torque without an External Magnetic Field by Engineering a Tilted Anisotropy", Proceedings of the National Academies of Science, 2015, US, vol. 112, pp. 10310-10315.
Yu, et al., "Switching of Perpendicular Magnetization by Spin-orbit Torques in the Absence of External Magnetic Fields", Nature Nanotechnology, 2014, vol. 9, pp. 548-554.
Zhang, "Spin Hall Effect in the Presence of Spin Diffusion", Physical Review Letters, 2000, vol. 85, pp. 393-396.
Zhang, et al., "Band Structure and Spin Texture of Bi2Se3 3d Ferromagnetic Metal Interface", Physical Review B, vol. 94, 2016, pp. 014435-1-014435.
Zhang, et al., "Spin-orbit Torque Induced Magnetization Switching in Nanoscale Ta/CoFeB/MgO", Applied Physics Letters, vol. 107, 2015, pp. 012401-1-012401-4.
Zhao, et al., "Observation of Charge to Spin Conversion in Weyl Semimetal WTe2 at Room Temperature", Physical Review Research, vol. 2, 2020, pp. 013286-1-013286-8.
Avci, et al., "Fieldlike and Antidamping Spin-orbit Torques in As-grown and Annealed Ta/CoFeB/MgO Layers", Physical Review B, 2014, vol. 89, pp. 214419-1-214419-40.
Baek, et al., "Spin Currents and Spin-orbit Torques in Ferromagnetic Trilayers", Nature Materials, vol. 17, 2018, pp. 509-513.
Baumgartner, et al., "Spatially and Time-resolved Magnetization Dynamics Driven By Spin-orbit Torques", Nature Nanotechnology, vol. 12, 2017, pp. 980-986.
Borders, et al., "Integer Factorization Using Stochastic Magnetic Tunnel Junctions", Nature, vol. 573, 2019, pp. 390-393.
Bychkov, et al., Properties of a 2D Electron Gas With Lifted Spectral Degeneracy, JETP Lett, 1984, vol. 39, pp. 78-81.
Camsari, et al., "Implementing P-bits With Embedded MTJ", IEEE Electron Device Letters, vol. 38, 2017, pp. 1767-1770.
Camsari, et al., "Stochastic p-Bits for Invertible Logic", Physical Review X, vol. 7, 2017, pp. 031014-1-0310140-19.
Cao, et al., "Spin Orbit Torques Induced Magnetization Reversal Through Asymmetric Domain Wall Propagation in Ta/CoFeB/MgO Structures", Science Reports, vol. 8, 2018, pp. 1355-1-1355-9.
Chappert, et al., "The Emergence of Spin Electronics in Data Storage", Nature Materials, vol. 6, 2007, pp. 813-823.
Daughton, et al., "Magnetic Field Sensors Using GMR Multilayer", IEEE Transactions on Magnetics, vol. 30, 1994, pp. 4608-4610.
Debashis, et al., "Correlated Fluctuations in Spin Orbit Torque Coupled Perpendicular Nanomagnets", Physical Review B, vol. 101, 2020, pp. 094405-1-094405-9.
D'Yakonov, et al., "Possibility of Orienting Electron Spins With Current", JETP Letters, 1971, vol. 13, pp. 467-469.
Edelstein, "Spin Polarization of Conduction Electrons Induced by Electric Current in Two-Dimensional Asymmetric Electron Systems", Solid State Communications, 1990, vol. 73, pp. 233-235.
Emori, et al., "Current-driven Dynamics of Chiral Ferromagnetic Domain Walls", Nature Materials, vol. 12, 2013, pp. 611-616.
Fan, et al., "Spin Pumping and Large Field-like Torque at Room Temperature in Sputtered Amorphous WTe2-x Films", APL Materials, vol. 8, pp. 041102-1-041102-6.
Feng, et al., "Effects of Oxidation of Top and Bottom Interfaces on the Electric, Magnetic, and Spin-Orbit Torque Properties of Pt/Co/AlOx Trilayers", Physical Review Applied, vol. 13, 2020, pp. 044029-1-044029-17.

(56) References Cited

OTHER PUBLICATIONS

Finocchio, et al., "Switching of a Single Ferromagnetic Layer Driven By Spin Hall Effect", Applied Physical Letters, vol. 102, 2013, pp. 212410-1-212410-5.

Fukami, et al., "A Spin-orbit Torque Switching Scheme With Collinear Magnetic Easy Axis and Current Configuration", Nature Nanotechnology, 2016, vol. 11, pp. 621-626.

Fukami, et al., "Magnetization Switching by Spin-orbit Torque in an Antiferromagnet-ferromagnet Bilayer System", Nature Materials, 2016, vol. 15, pp. 535-541.

Garello, et al., "Symmetry and Magnitude of Spin-orbit Torques in Ferromagnetic Heterostructures", Nature Nanotechnology, vol. 8, 2013, pp. 587-593.

Garello, et al., "Symmetry and Magnitude of Spin-Orbit Torques in Ferromagnetic Heterostructures", Nature Nanotechnoly, 2013, vol. 8, pp. 587-1-587-27.

Garello, et al., "Ultrafast Magnetization Switching By Spin-orbit Torques", Applied Physics Letters, vol. 105, 2014, pp. 212402-1-212402-5.

Ghosh, et al., "Interface-Enhanced Spin-Orbit Torques and Current-Induced Magnetization Switching of Pd/Co/AlOx Layers", Physical Review Applied, vol. 7, 2017, pp. 014004-1-014004-9.

Grosz, et al., "Planar Hall Effect sensors With Subnanotesla Resolution", IEEE Magnetics Letters, vol. 4, 2013, pp. 6500104-1-6500104-4.

Guimarães, et al., Spin-Orbit Torques in NbSe2/Permalloy Bilayers. Nano Letters, vol. 18, 2018, pp. 1311-1316.

Guo, et al., "Reduction of Magnetic 1/f Noise in Miniature Anisotropic Magnetoresistive Sensors", Applied Physics Letters, vol. 106, 2015, pp. 212402-1-212402-3.

Han, et al., "Room-Temperature Spin-Orbit Torque Switching Induced by a Topological Insulator", Physical Review Letters, vol. 119, 2017, pp. 077702-1-077702-5.

Hayashi, et al., Quantitative Characterization of the Spin-orbit Torque Using Harmonic Hall Voltage Measurements. Physical Review B, 2014, vol. 89, pp. 144425-1-144425-46.

Hentschke, et al., "Stochastic Magnetic Field Micro-Sensor", Proceedings Ninth Annual IEEE International ASIC Conference and Exhibit, IEEE, 1996, pp. 11-14.

Hirsch, "Spin Hall Effect", Physical Review Letters, vol. 83, 1999, pp. 1834-1837.

Hoffman, "Spin Hall Effects in Metals", IEEE Transactions on Magnetics, vol. 49, 2013, pp. 5172-5193.

Kim, et al., Layer Thickness Dependence of the Current-induced Effective Field Vector in Ta|CoFeB|MgO, Nature Materials, vol. 12, 2013, pp. 240-245.

Koroteev, et al., "Strong Spin-Orbit Splitting on Bi Surfaces", Physical Review Letters, vol. 93, 2004, pp. 046403-1-046403-4.

Kuijk, et al., "The Barber Pole, a Linear Magnetoresistive Head", IEEE Transactions on Magnetics, 1975, vol. 11, pp. 1215-1217.

Kurenkov, et al., "Device-size Dependence of Field-free Spin-orbit Torque Induced Magnetization Switching in Antiferromagnet/ferromagnet Structures", Applied Physics Letters, vol. 110, 2017, pp. 092410-1-092410-5.

Lau, et al., "Spin-orbit Torque Switching Without an External Field Using Interlayer Exchange Coupling", Nature Nanotechnology, 2016, vol. 11, pp. 758-762.

Lee, et al., "Central Role of Domain Wall Depinning for Perpendicular Magnetization Switching Driven By Spin Torque From the Spin Hall Effect", Physical Review B, vol. 89, 2014, pp. 024418-1-024418-8.

Lee, et al., "Enhanced Spin-orbit Torque Via Interface Engineering in Pt/CoFeB/MgO Heterostructures", APL Materials, vol. 7, pp. 031110-1-031110-8.

Lee, et al., "Threshold Current for Switching of a Perpendicular Magnetic Layer Induced by Spin Hall Effect", Applied Physics Letters, vol. 102, 2013, pp. 12410-1-12410-5.

Lenz, et al., "Magnetic Sensors and Their Applications", IEEE Sensors Journal, vol. 6, 2006, pp. 631-649.

Li, et al., "Large and Robust Charge-to-Spin Conversion in Sputtered Weyl Semimetal WTex with Structural Disorder", arXiv preprint arXiv:2001.04054 (2020).

Li, et al., "Materials Requirements of High-Speed and Low-Power Spin-Orbit-Torque Magnetic Random-Access Memory", IEEE Journal Electron Devices Society, vol. 8, 2020, pp. 674-680.

Li, et al., "Spin-momentum Locking and Spin-orbit Torques in Magnetic Nano-Heterojunctions Composed of Weyl Semimetal WTe2", Nature Communications, vol. 9, 2018, 3990-1-3990-10.

Liu, et al., Current-induced Switching of Perpendicularly Magnetized Magnetic Layers Using Spin Torque From the Spin Hall Effect. Physical Review Letters, 2012, vol. 109, pp. 096602-1-096602-5.

Liu, et al., "Spin-torque Ferromagnetic Resonance Induced By the Spin Hall Effect", Physical Review Letters, vol. 106, 2011, pp. 036601-1-036601-4.

Lu, et al., "Spin-Torque Switching with the Giant Spin Hall Effect of Tantalum", Science, 2012, 336, pp. 555-558.

Luo, et al., "Magnetic Angular Position Sensor Enabled By Spin-orbit Torque", Applied Physics Letters, vol. 112, 2018, pp. 262405-1-262405-5.

Macneil, et al., "Control of Spin-orbit Torques Through Crystal Symmetry in WTe2/ferromagnet Bilayers", Natural Physics, 2017, vol. 13, pp. 300-305.

Macneill, et al., "Thickness Dependence of Spin-orbit Torques Generated by WTe2", Physical Review B, vol. 96, 2017, 054450-1-054450-8.

Manchon, et al., "Current-induced Spin-orbit Torques in Ferromagnetic and Antiferromagnetic Systems", Rev. Mod. Phys., 2019, vol. 91, 035004, pp. 1-80.

Xie, et al., "Spin Torque Gate Magnetic Field Sensor", Physical Review Applied, vol. 15, 2021, pp. 024041-1-024041-19.

Xie, et al., "Spin Torque Gate Magnetic Field Sensor", Preprint, National University of Singapore, pp. 1-19.

\* cited by examiner

502
Sine wave

504
Sawtooth wave

506
Triangle wave

602
Sine wave

604
Sawtooth wave

606
Triangle wave

702
Sine wave

704
Sawtooth wave

706
Triangle wave

METHOD AND AN APPARATUS FOR DETECTING A MAGNETIC FIELD

TECHNICAL FIELD

The present disclosure relates to a method and an apparatus for detecting a magnetic field.

BACKGROUND

A large variety of magnetic field sensors have been developed for use in consumer, industrial and scientific applications. These magnetic field sensors include fluxgate sensors, fiber-optic sensors, Hall-effect sensors, superconducting quantum interference device (SQUID) sensors, optical pumping sensors, magnetoresistance (MR) sensors, and giant magneto-impedance (GMI) sensors. The MR sensors, in particular, are attractive for low to moderate magnetic field detection due to their high sensitivity, compactness, and ease of integration with other types of devices. The MR sensors generally operate based on the detection of changes in longitudinal resistance when the MR sensor is subject to an external magnetic field. However, MR sensors, such as the anisotropic magnetoresistance (AMR) sensors, the giant magnetoresistance (GMR) sensors and the tunnel magnetoresistance (TMR) sensors, typically require a complex device structure due to the need for additional magnetic biasing layers for sensor linearization and domain stabilization. This requires additional efforts and increases the cost of developing and fabricating these MR sensors.

The complexity of MR sensors originates directly from the underlying physical effects which underpin the operation of these MR sensors. For example, AMR sensors uses the AMR effect, where a resistivity of an AMR material is given by $\rho(\theta)=\rho_\perp+(\rho_{//}-\rho_\perp)\cos^2\theta$, where $\theta$ is the angle between a sensing current applied to the AMR sensor and the magnetization direction, $\rho_\perp$ is the resistivity when $\theta=\pi/2$, and $\rho_{//}$ is the resistivity when $\theta=0$ or $\pi$. The angle $\theta$ can be varied by an external magnetic field (H), and this AMR effect can therefore be used for magnetic field sensing. However, it is clear from the resistivity equation that a response of the AMR sensor is non-linear (since $\theta$ is proportional to H) and that the sensitivity is almost zero when $\theta=0°$. The aforementioned problems can be resolved by setting $\theta=45°$ at zero magnetic field, and various schemes have been deployed to achieve this by forming a transverse bias on the AMR material layer. One such scheme is a soft adjacent layer (SAL) scheme which provides a soft ferromagnetic layer that generates a fringe field for biasing the magnetization of the sensing layer of the AMR sensor at a 45° angle at zero applied magnetic field. However, it suffers from other drawbacks such as the current shunting effect and the need to provide a longitudinal bias to stabilize domain structures in the sensing layer to reduce Baukhausen noise caused by domain-wall motion. Another scheme is the barber pole bias scheme where instead of changing the magnetization direction of the sensing layer, the local charge current is directed at a 45° angle with respect to the magnetization direction by patterned conducting strips deposited directly atop the sensing layer. This however also suffers drawbacks including the need for complex processing steps and non-uniformity arising from edges of these patterned conducting strips.

Similar to the AMR sensors, GMR and TMR sensors also require complex processing steps due to their inherent multilayer structures. Particularly, a typical GMR spin-valve in its simplest form includes two ferromagnetic (FM) layers separated by a non-magnetic spacer and an antiferromagnetic (AFM) layer in contact with one of the FM layers. In this spin-valve structure, a magnetization of one of the FM layers is pinned by the AFM layer while a magnetization of the other FM layer is free to rotate in response to an external magnetic field. When being used as a magnetic field sensor, a constant current is applied to the spin-valve and the magnetic field can be detected by an output voltage as a result of different resistance states generated in the spin-valve in response to the magnetization directions of the two FM layers. A TMR sensor has a similar device structure, but with the non-magnetic spacer being replaced by an insulator. Both the GMR and TMR involves complex layered structures which add to the complexity of their fabrication.

Notwithstanding these drawbacks, the aforementioned single element sensors are also not useful in practice as their zero-field outputs are typically tens to hundreds of times larger than that of the signals induced by an external magnetic field. To extract the output signals for detecting the external magnetic field, a common approach is to use the Wheatstone bridge to suppress the zero-field signal. This significantly increases the process complexity as each pair of sensing elements must have a different bias direction, leading to an increase in the process complexity and costs, while reducing the yield of such devices. Further, the Wheatstone bridge cannot eliminate an offset due to mismatch between the sensing elements, and thus additional circuits are required to compensate such offsets.

It is therefore desirable to provide a method and an apparatus for detecting a magnetic field which address the aforementioned problems and/or provides a useful alternative. Further, other desirable features and characteristics will become apparent from the subsequent detailed description and the appended claims, taken in conjunction with the accompanying drawings and this background of the disclosure.

SUMMARY

Aspects of the present application relate to a method and an apparatus for detecting a magnetic field.

In accordance with a first aspect, there is provided a method for detecting a magnetic field using a spin-orbit torque magnetic field sensor, the spin-orbit torque magnetic field sensor comprising a magnetic layer having a switchable magnetic state, and the method comprising: (i) providing an alternating current to the spin-orbit torque magnetic field sensor for creating an oscillatory spin-orbit torque in the magnetic layer to switch the switchable magnetic state between two magnetic states of the magnetic layer in the magnetic field; and (ii) measuring an output voltage of the spin-orbit torque magnetic field sensor, the output voltage being dependent on the magnetic field, wherein the output voltage is a time average of a time-varying anomalous Hall voltage generated in the magnetic layer in response to the oscillatory spin-orbit torque and the magnetic field, the time-varying anomalous Hall voltage being a function of the alternating current and a Hall resistance of the magnetic layer, and the Hall resistance being associated with a duration in which the switchable magnetization is in each of the two magnetic states, wherein the duration in which the switchable magnetic state is in each of the two magnetic states is associated with a magnitude and a polarity of the magnetic field.

By providing an alternating current to the spin-orbit torque magnetic field sensor and measuring the output voltage of the spin-orbit torque magnetic field sensor in the presence of a to-be-detected magnetic field, a polarity and a magnitude of the magnetic field can be detected with zero offset and negligible hysteresis. This eliminates the need for an offset compensation circuit which can add to the complexity and costs in designing and manufacturing of magnetic field sensors. Further, the measured output voltage is also dependent on the magnetic field, and in some embodiments, can be made linearly dependent on the magnetic field. This eliminates the need for a transverse magnetic bias which is required for conventional magnetoresistance magnetic field sensors as aforementioned described, thereby significantly reducing manufacturing time and costs. In addition, by using an alternating current for generating a time-varying anomalous Hall voltage in the magnetic field sensor and subsequently measuring a time average of this time-varying anomalous Hall (i.e. the output voltage), a plurality of data measured are averaged during this operation. This thereby suppresses any noise in the data. Further, the spin-torque magnetic field sensor used in the method can be customised by varying an effective magnetic anisotropy of the magnetic layer of this spin-torque magnetic field sensor to control a dynamic range of the magnetic field sensor.

The output voltage may be linearly dependent on the magnetic field. Linearity of the output voltage of the spin-orbit torque magnetic field sensor to the magnetic field provides a direct read-off of the magnetic field as detected by the magnetic field sensor. This eases the operation for detecting the magnetic field.

The method may comprise: providing another spin-orbit torque magnetic field sensor, wherein a longitudinal axis of the another spin-orbit torque magnetic field sensor is perpendicular to a longitudinal axis of the spin-orbit torque magnetic field sensor; providing another alternating current to the another spin-orbit torque magnetic field sensor in the magnetic field; measuring another output voltage of the another spin-orbit torque magnetic field sensor, the another output voltage being dependent on the magnetic field and is a time average of a time-varying anomalous Hall voltage generated in the another spin-orbit torque magnetic field sensor; and calculating an angle of the magnetic field using the output voltage of the spin-orbit torque magnetic field sensor and the another output voltage of the another spin-orbit torque magnetic field sensor. By providing the another spin-orbit torque magnetic field sensor and operating it using the method described, the angle of the magnetic field with respect to either the spin-orbit torque magnetic field sensor or the anther spin-orbit torque magnetic field sensor can also be detected or measured. In an embodiment, the alternating current and the another alternating current provided flow in a direction along the longitudinal axis of the spin-orbit torque magnetic field sensor and the longitudinal axis of the another spin-orbit torque magnetic field sensor, respectively.

The method may comprise setting an amplitude of the alternating current to be greater than a critical current of the magnetic layer, the critical current having a magnitude at which the Hall resistance of the magnetic layer starts to saturate.

The method may comprise setting an amplitude of the alternating current to a predetermined value to provide a zero output voltage at a zero magnetic field. This provides a handle to calibrate the spin-orbit torque magnetic field sensor to provide a zero magnetic field offset when reading out the output voltage of the magnetic field sensor.

Providing the alternating current to the spin-orbit torque magnetic field sensor may comprise providing the alternating current in a form of a sinusoidal wave, a square wave, a triangular wave or a sawtooth wave.

The magnetic layer may comprise a ferromagnetic layer and a heavy metal layer, and the switchable magnetic state may include a switchable magnetization, the ferromagnetic layer may have a perpendicular magnetic anisotropy and the heavy metal layer may be adapted to create the oscillatory spin-orbit torque in response to the alternating current to switch the switchable magnetization of the ferromagnetic layer between an up-state and a down-state, wherein the up-state being a state in which the switchable magnetization is in a direction perpendicular to a longitudinal plane of the magnetic layer and the down-state being a state in which the switchable magnetization is in an opposite direction to that of the up-state. In an embodiment, the longitudinal plane of the magnetic layer is the same plane in which the alternating current flow.

The method may comprise operating the spin-orbit torque magnetic field sensor wherein the ferromagnetic layer is in a superparamagnetic state or regime. By operating the spin-orbit torque magnetic field sensor in the superparamagnetic state or regime, the spin-orbit torque magnetic field sensor provides an output voltage which is linear to the magnetic field. It also provides zero magnetic field offset without having to set the amplitude of the alternating current to a predetermined value. Further, it allows operating the spin-orbit torque magnetic field sensor using an alternating current with higher frequency, and with a higher sensitivity or detectivity as compared to other operating regimes (see e.g. the different Cases 1), 2) and 3) as described below).

In accordance with a second aspect, there is provided an apparatus for detecting a magnetic field, the apparatus comprising: a spin-orbit torque magnetic field sensor, the sensor comprising a magnetic layer having a switchable magnetic state; a current source adapted to provide an alternating current to the sensor for creating an oscillatory spin-orbit torque in the magnetic layer to switch the switchable magnetic state of the magnetic layer between two magnetic states in the magnetic field; and a voltmeter adapted to measure an output voltage of the sensor, the output voltage being a time average of a time-varying anomalous Hall voltage generated in the magnetic layer in response to the magnetic field and the periodical switching of the switchable magnetic state, wherein the time-varying anomalous Hall voltage is a function of the alternating current and a Hall resistance of the sensor, the Hall resistance of the sensor being associated with a duration in which the switchable magnetic state is in each of the two magnetic states, and wherein the duration in which the switchable magnetic state is in each of the two magnetic states is associated with a magnitude and a polarity of the magnetic field.

The magnetic layer may comprise a ferromagnetic layer and a metal layer, and wherein the switchable magnetic state may include a switchable magnetization, the ferromagnetic layer having a perpendicular magnetic anisotropy and the metal layer is adapted to create the oscillatory spin-orbit torque in response to the alternating current to switch the switchable magnetization of the ferromagnetic layer between an up-state and a down-state, the up-state being a state in which the switchable magnetization is in a direction perpendicular to a longitudinal plane of the magnetic layer and the down-state being a state in which the switchable magnetization is in an opposite direction to that of the up-state.

The ferromagnetic layer may comprise cobalt (Co), iron (Fe), nickel (Ni), cobalt iron boron (CoFeB), gadolinium (Gd), yttrium iron garnet (YIG), ferrites, or alloys of Co, Fe, Ni, Mn, Cr, V, CoFeB, Gd, Te, Pt or Ir.

The metal layer may comprise a heavy metal, an antiferromagnetic material, a topological insulator or a transition metal dichalcogenides (TMD).

The heavy metal may include platinum (Pt), palladium (Pd), tantalum (Ta), tungsten (W), lead (Pb), niobium (Nb), CuPt, AuPt or NiPt.

The antiferromagnetic material may include IrMn, PtMn or PtNiMn.

The topological insulator may include $Bi_2Se_3$, $Bi_2Te_3$, or $Sb_2Te_3$, or the TMD may include $WTe_2$, $MoTe_2$ or $PtSe_2$.

The magnetic layer may comprise a non-colinear antiferromagnet.

The magnetic layer may comprise a ferromagnetic layer or a ferrimagnetic layer, the ferromagnetic layer or the ferrimagnetic layer being adapted to generate a spin current in response to the alternating current for creating the oscillatory spin-orbit torque and to generate the time-varying anomalous Hall voltage in response to the oscillatory spin-orbit torque and the magnetic field.

The ferromagnetic layer may comprise cobalt iron boron (CoFeB) and the metal layer may comprise $WTe_2$.

The apparatus may comprise: (i) another spin-orbit torque magnetic field sensor, wherein a longitudinal axis of the another spin-orbit torque magnetic field sensor is perpendicular to a longitudinal axis of the spin-orbit torque magnetic field sensor, (ii) another current source adapted to provide another alternating current to the another spin-orbit torque magnetic field sensor in the magnetic field; and (iii) another voltmeter adapted to measure another output voltage of the another spin-orbit torque magnetic field sensor, the another output voltage being a time average of a time-varying anomalous Hall voltage generated in the another spin-orbit torque magnetic field sensor, wherein an angle of the magnetic field is calculated using the output voltage of the spin-orbit torque magnetic field sensor and the another output voltage of the another spin-orbit torque magnetic field sensor.

The spin-orbit torque magnetic field sensor may include a Hall bar or a Hall cross structure.

It should be appreciated that features relating to one aspect may be applicable to the other aspects. Embodiments therefore provide a method and an apparatus for detecting a magnetic field. Particularly, in the method for detecting the magnetic field, an alternating current is provided to the spin-orbit torque magnetic field sensor for creating an oscillatory spin-orbit torque in the magnetic layer of the spin-orbit torque magnetic field sensor. An output voltage of the spin-orbit torque magnetic field sensor is then measured where the measured output voltage is dependent on the magnetic field and is a time average of a time-varying anomalous Hall voltage generated in the magnetic layer in response to the oscillatory spin-orbit torque and the magnetic field. In this way, a polarity and a magnitude of the magnetic field can be detected with zero offset and negligible hysteresis. This eliminates the need for offset compensation circuits which can add to the complexity and costs in designing and manufacturing of magnetic field sensors. Further, in some embodiments, the measured output voltage is linearly dependent on the magnetic field. This eliminates the need for a transverse magnetic bias such as those aforementioned described, thereby significantly reduces manufacturing time and costs for producing the magnetic sensor. In addition, using alternating current for generating a time-varying anomalous Hall voltage in the magnetic field sensor and subsequently measuring a time average of this time-varying anomalous Hall (i.e. the output voltage) provides a means to suppress noise in the measurements as a plurality of measurements are taken and averaged during this operation. Further, the spin-torque magnetic field sensor used in the method can also be customised by varying an effective magnetic anisotropy of the magnetic layer of this spin-torque magnetic field sensor to control a dynamic range of the magnetic field sensor.

BRIEF DESCRIPTION OF THE DRAWINGS

Embodiments will now be described, by way of example only, with reference to the following drawings, in which:

FIG. 5A shows a graph of I as a function of time for a sine current wave, FIG. 5B shows a graph of I as a function of time for a sawtooth current wave and FIG. 5C shows a graph of I as a function of a triangle current wave;

FIG. 6A shows a graph of $R_H$ as a function of time for a sine current wave, FIG. 6B shows a graph of $R_H$ as a function of time for a sawtooth current wave and FIG. 6C shows a graph of $R_H$ as a function of time for a triangle current wave;

FIG. 7A shows a graph of $V_H$ as a function of time for a sine current wave, FIG. 7B shows a graph of $V_H$ as a function of time for a sawtooth current wave and FIG. 7C shows a graph of $V_H$ as a function of time for a triangle current wave;

FIG. 8A shows graphs of I and $R_H$ as a function of time for a sine current wave, FIG. 8B shows graphs of I and $R_H$ as a function of time for a sawtooth current wave, and FIG. 8C shows graphs of I and $R_H$ as a function of time for a triangle current wave;

FIG. 9A shows a graph of $V_{out}$ as a function of $H_x$ for a sine current wave, FIG. 9B shows a graph of $V_{out}$ as a function of $H_x$ for a sawtooth current wave and FIG. 9C shows a graph of $V_{out}$ as a function of $H_x$ for a triangle current wave;

FIG. 10A shows graphs of an applied alternating current (I) and a Hall resistance ($R_H$) as a function of time in the presence of an in-plane magnetic field (i.e. $H_x$>0), FIG. 10B shows a graph of a Hall voltage ($V_H$) as a function of time in the presence of an in-plane magnetic field (i.e. $H_x$>0), and FIG. 10C shows graphs of an output voltage ($V_{out}$) as a function of an in-plane magnetic field $H_x$;

FIG. 20A shows a plot of $V_H$ as a function of time for a triangle current wave and FIG. 20B shows a plot of $V_H$ as a function of time for a sawtooth current wave;

FIG. 21A shows a plot of the output voltage $V_{out}$ as driven by a triangle wave at 160 K and FIG. 21B shows a plot of the output voltage $V_{out}$ as driven by a sawtooth wave at 160 K;

FIG. 28A shows a plot of $V_{out}$ as a function of $H_x$ for an applied alternating current frequency of 15 Hz, FIG. 28B shows a plot of $V_{out}$ as a function of $H_x$ for an applied alternating current frequency of 515 Hz and FIG. 28C shows a plot of $V_{out}$ as a function of $H_x$ for an applied alternating current frequency of 2015 Hz;

FIG. 29A shows a plot of $V_{out}$ as a function of $H_x$ for an applied alternating current frequency of 15 Hz, FIG. 29B shows a plot of $V_{out}$ as a function of $H_x$ for an applied alternating current frequency of 5015 Hz and FIG. 29C shows a plot of $V_{out}$ as a function of $H_x$ for an applied alternating current frequency of 20015 Hz;

FIG. 32A shows a plot of $V_{out}$ and $H_x$ as a function of time t for an alternating magnetic field frequency $f_H$ of 1 Hz, FIG. 32B shows a plot of $V_{out}$ and $H_x$ as a function of time t for an alternating magnetic field frequency $f_H$ of 0.5 Hz and FIG. 32C shows a plot of $V_{out}$ and $H_x$ as a function of time t for an alternating magnetic field frequency $f_H$ of 0.1 Hz;

FIG. 34A shows a plot of $V_{out}$ as a function of $H_\theta$ measured at a magnetic field polar angle $\theta_H$ of 70° and FIG. 34B shows a plot of $V_{out}$ as a function of $H_\theta$ measured at a magnetic field polar angle $\theta_H$ of 110°;

FIG. 36A shows a plot of $V_{out}$ as a function of $H_\theta$ measured at a magnetic field polar angle $\theta_H$ of 73° and FIG. 36B shows a plot of $V_{out}$ as a function of $H_\theta$ measured at a magnetic field polar angle $\theta_H$ of 103°;

DETAILED DESCRIPTION

Figure 1:
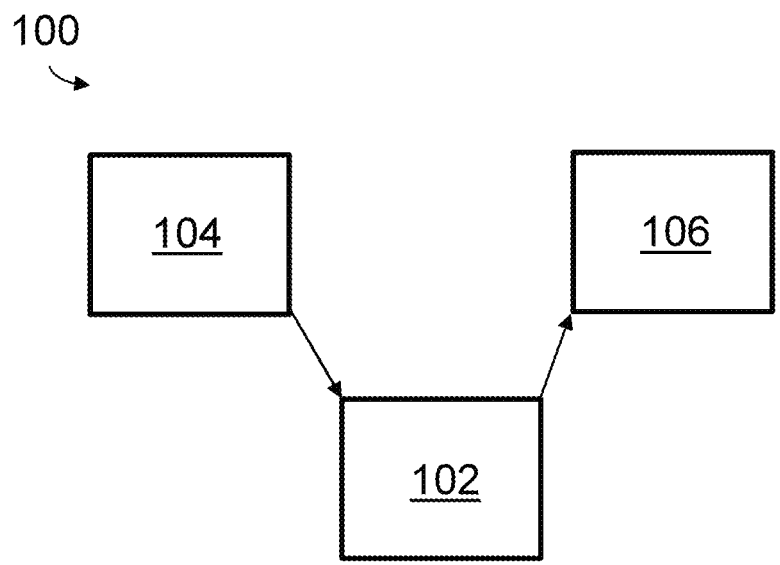
FIG. 1 shows a schematic diagram of an apparatus for detecting a magnetic field in accordance with an embodiment.

Exemplary embodiments relate to a method and an apparatus for detecting a magnetic field.

The present embodiments exploit the mechanism of spin-orbit torque (SOT) magnetization switching in a spin-orbit torque device for magnetic field sensing. Spin-orbit torque provides an efficient pathway to manipulate a magnetic state and magnetization dynamics of magnetic materials, which can be used in a variety of applications such as magnetic memory, logic, oscillator, and neuromorphic computing. In an embodiment, when a charge current passes through a ferromagnet (FM)/heavy metal (HM) bilayer, a spin-orbit torque (SOT) is induced which interacts with a magnetization of the FM layer. In general, there are two main mechanisms that contribute to the generation of SOT in FM/HM bilayers: one is the interfacial Rashba-Edelstein effect (REE) and the other is the bulk spin Hall effect (SHE). The relative contribution of the two mechanisms in generating the SOT depends on both the constituent materials and the nature of the FM/HM interface. Irrespective of the mechanisms, it is accepted that there are two types of SOTs, one is field-like (FL) and the other is damping-like (DL), which may be expressed as $\vec{T}_{FL} = \tau_{FL} \vec{m} \times (\vec{j} \times \vec{z})$ and $\vec{T}_{DL} = \tau_{DL} \vec{m} \times [\vec{m} \times (\vec{j} \times \vec{z})]$, respectively. In the aforementioned expressions, $\vec{m}$ is the magnetization direction, $\vec{j}$ is the in-plane current density, $\vec{z}$ is the interface normal, and $\tau_{FL}$ and $\tau_{DL}$ are the magnitude of the FL and DL torques, respectively. The DL torque provides an efficient mechanism for switching the magnetization of the FM with a perpendicular magnetic anisotropy (PMA). In general, an assistive magnetic field parallel to the current direction is required to achieve deterministic switching. As this requirement is undesirable for memory and logic applications, several approaches have been used to achieving field-free switching. In the present embodiments, however, this requirement of having the assistive magnetic field for deterministic switching is exploited for magnetic field sensing/detection.

The present disclosure describes and demonstrate a strategy for the realization of a spin-orbit torque magnetic field sensor with a simple structure by exploiting the longitudinal field dependence of the spin torque driven magnetization switching. Unlike the aforementioned magnetoresistance sensors which require a delicate magnetic bias to achieve a linear response to an external magnetic field, the spin-orbit torque magnetic field sensor of the present embodiments can achieve similar results without any magnetic bias, which simplifies the sensor structure. This in turn reduces time and costs for the fabrication of such spin-orbit torque magnetic field sensing device. Further, by driving the sensor using an alternating (ac) current, the direct current (dc) offset is automatically suppressed, which eliminates the need for a bridge or compensation circuit.

As will be clear in the description below, the proposed spin-orbit torque magnetic field sensor can be implemented using a simple Hall bar or a Hall cross structure made of a FM/HM bilayer with PMA. In particular, when the FM/HM bilayer is driven by an ac current, the strength and polarity of $H_x$ will determine the duration within which the magnetization will stay in the up or the down states, respectively, in each half-cycle of the ac current. In an embodiment, the average anomalous Hall effect (AHE) voltage gives an output signal that is proportional to $H_x$ with zero offset. A spin-orbit torque magnetic field sensor of the present embodiments exhibits a good linearity in the field range of ±3-10 Oe, which is almost 10 times larger than a previously reported spin Hall magnetoresistance (SMR) sensor. The linearity of the output response/signal in relation to $H_x$ is dependent on a number of factors, e.g. field angle, a waveform of the alternating current, temperature etc. Also, since the output signal can be obtained from the average Hall voltage over many cycles, it statistically reduces the low frequency noise.

In the present embodiments, it is assumed that the current is in x-direction and thus the required field component is $H_x$. It will be appreciated by a skilled person that this however can change (e.g. in the y-direction) and be generalised. Further, a skilled person will understand that magnetic field is a vector quantity which can be resolved to e.g. its Cartesian components (i.e. $H_x$, $H_y$, $H_z$). Therefore, it will be appreciated that the spin-orbit torque magnetic field sensors of the present embodiments can be used to detect not just a magnetic field in a longitudinal direction, but a generic magnetic field in any direction. Further example of this is discussed in relation to FIGS. 37 and 38 below. In any case, the magnetic field sensor of the present embodiments can also be repositioned or aligned so as to measure a magnetic field of any direction (e.g. by repositioning the magnetic field sensor such that a maximum output voltage is achieved—this is when the magnetic field is aligned with the longitudinal axis of the magnetic field sensor and therefore parallel to the current direction).

Figure 2:
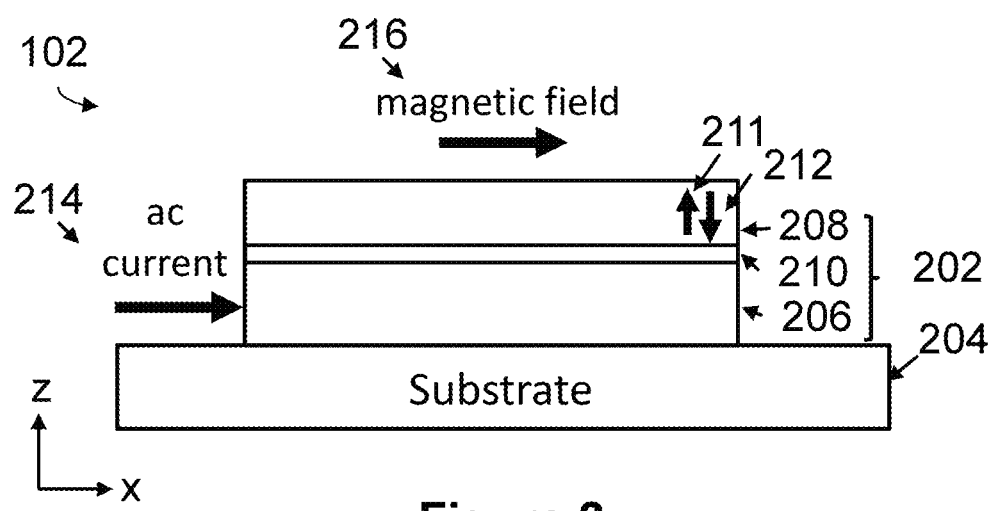
FIG. 2 shows a schematic diagram of a spin-orbit torque magnetic field sensor, comprised in the apparatus of FIG. 1, in accordance with an embodiment.
Figure 3:
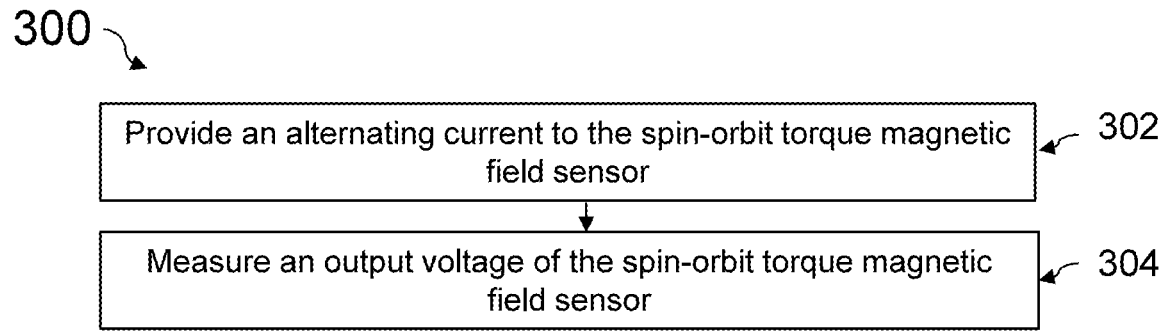
FIG. 3 is a flowchart showing steps of a method for detecting a magnetic field using the spin-orbit torque magnetic field sensor of FIG. 2 in accordance with an embodiment.
Figure 4:
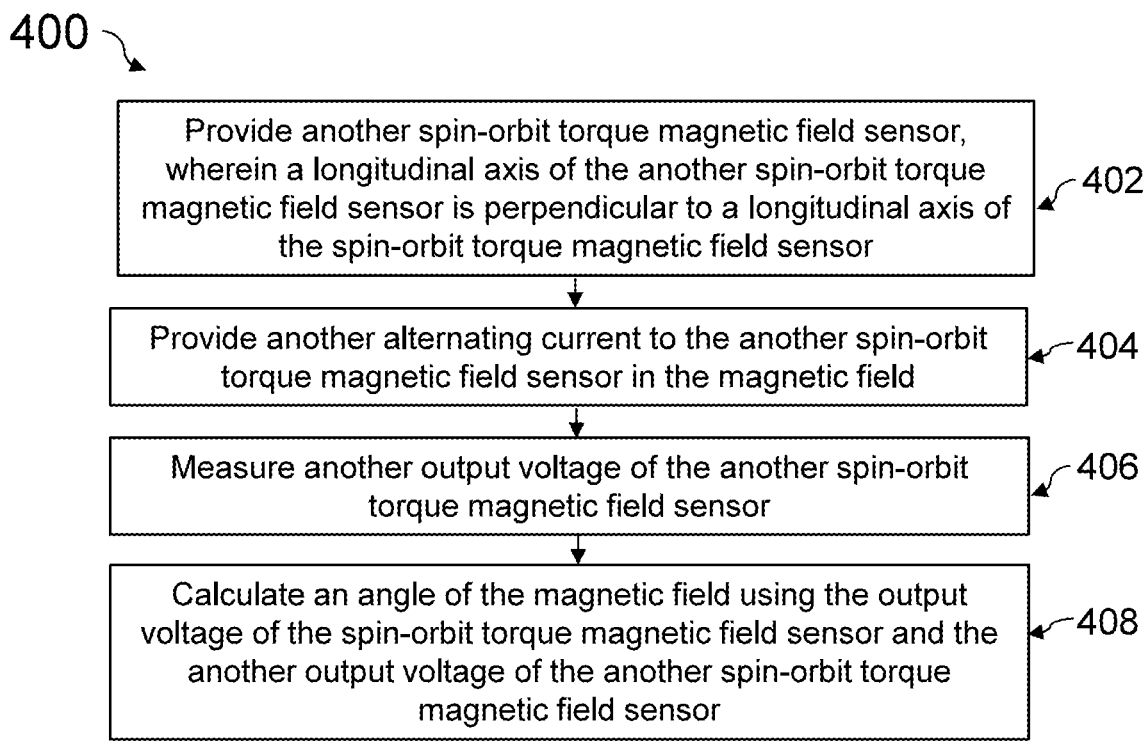
FIG. 4 is a flowchart showing steps of a method for detecting an angle of a magnetic field by using a further spin-orbit torque magnetic field sensor in addition to the spin-orbit torque magnetic field sensor of FIG. 2 in accordance with an embodiment.

In the present disclosure, FIGS. 1 and 2 provide an overview of an apparatus for detecting a magnetic field in accordance with an embodiment. FIGS. 3 and 4 then describes exemplary methods for detecting the magnetic field using the magnetic field sensor of FIG. 2. FIGS. 5A to 10C are in relation to the operation principle of the spin-torque magnetic field sensor, while FIGS. 11A to 38 describe sample preparation and related experiments perform in relation to a spin-orbit torque magnetic field sensor comprising a $WTe_2$/Ti/CoFeB heterostructure in accordance with an embodiment.

FIG. 1 shows a schematic diagram of an apparatus 100 for detecting a magnetic field in accordance with an embodiment. The apparatus 100 comprises a spin-orbit torque magnetic field sensor 102, a current source 104, and a voltmeter 106. The spin-orbit torque magnetic field sensor 102 comprises a magnetic layer having a switchable magnetic state. In an embodiment, the magnetic layer comprises a ferromagnetic layer and a heavy metal layer, and the switchable magnetic state includes a switchable magnetization. The ferromagnetic layer has a perpendicular magnetic anisotropy, and the heavy metal layer is adapted to create an oscillatory spin-orbit torque in response to an alternating current to switch the switchable magnetization of the ferromagnetic layer between an up-state and a down-state, the up-state being a state in which the switchable magnetization is in a direction perpendicular to a longitudinal plane of the magnetic layer and the down-state being a state in which the switchable magnetization is in an opposite direction to that of the up-state.

In the present embodiment, the current source 104 is adapted to be electrically connected to the spin-orbit torque sensor 102, and to provide an alternating current to the sensor 102 for creating an oscillatory spin-orbit torque in the magnetic layer to switch the switchable magnetic state of the magnetic layer between two magnetic states in the magnetic field. The voltmeter 106 is adapted to be electrically connected to the spin-orbit torque sensor 102, and to measure an output voltage of the sensor 102. The output voltage is a time average of a time-varying anomalous Hall voltage generated in the magnetic layer in response to the magnetic field and the periodical switching of the switchable magnetic state. In the present embodiment, the time-varying anomalous Hall voltage is a function of the alternating current and a Hall resistance of the sensor 102. The Hall resistance of the sensor 102 is associated with a duration in which the switchable magnetic state is in each of the two magnetic states, and the duration in which the switchable magnetic state is in each of the two magnetic states is associated with a magnitude and a polarity of the magnetic field. The magnetic field can therefore be detected using the output voltage of the spin-orbit torque sensor 102.

FIG. 2 shows a schematic diagram of a cross-section of the spin-orbit torque magnetic field sensor 102 in accordance with an embodiment. As shown in FIG. 2, a magnetic layer 202 comprising a heterostructure is formed on a substrate 204. The substrate 204 provides structural support for the spin-orbit torque magnetic field sensor 102. It should however be appreciated that in some embodiments, the substrate 204 may be omitted or removed. Further, although not shown in FIG. 2 for succinctness, a skilled person would understand that other material layers can be formed in the heterostructure or on the heterostructure. For example, metal contact layers can be deposited on the heterostructure to form electrodes which can be connected to the current source 104 and/or the voltmeter 106. Further, additional material layer(s) may also be deposited on the substrate prior to the formation of the heterostructure. The magnetic layer 202 in the present embodiment includes a metal layer 206 and a ferromagnetic (FM) layer 208. In the embodiments described below, the metal layer 206 includes a heavy metal (HM) layer. The HM layer includes $WTe_2$ and the FM layer 208 includes CoFeB. In some embodiments, an interlayer 210 can be introduced. This interlayer 210 is sandwiched between the metal layer 206 and the FM layer 208 as shown in FIG. 2. An example of the interlayer 210 is Ti. The FM layer 208 exhibits perpendicular magnetic anisotropy with a switchable magnetization direction pointing in the z direction as shown in FIG. 2. In other words, the switchable magnetization direction of the FM layer 208 is in a direction out-of-plane or perpendicular to the longitudinal plane (i.e. the x-y plane of the sensor 102) of the magnetic layer 202. The switchable magnetization of the FM layer 208 can be in either an up-state 211 or the down-state 212 as shown in FIG. 2.

As shown in FIG. 2, an alternating current 214 is provided to the magnetic layer 202, and more specifically to the metal layer 206 of the magnetic layer 202 in the present embodiment. The alternating current 214 is adapted to create an oscillatory spin-orbit torque in the magnetic layer 202 to switch the switchable magnetic state of the FM layer 212 between two magnetic states in a magnetic field 216. An output voltage of the sensor 102, which is generated in response to the oscillatory spin-orbit torque and the magnetic field, can then be measured. Particularly, the output voltage of the sensor 102 measured is a time-varying anomalous Hall voltage generated in the magnetic layer 202. The time-varying anomalous Hall voltage is a function of the alternating current and a Hall resistance of the magnetic layer. The Hall resistance is in turn associated with a duration in which the switchable magnetization is in each of the two magnetic states, where the duration is associated with a magnitude and a polarity of the magnetic field 216. Details of the operation principle of the spin-orbit torque magnetic field sensor 102 is described below.

FIG. 3 is a flowchart showing steps of a method 300 for detecting a magnetic field using the spin-orbit torque magnetic field sensor 102 of FIG. 2 in accordance with an embodiment. In a step 302, the alternating current 214 is provided to the spin-orbit torque magnetic field sensor 102 for creating an oscillatory spin-orbit torque in the magnetic layer 202 to switch the switchable magnetic state between two magnetic states of the magnetic layer in the magnetic field 216. In a step 304, the output voltage of the spin-orbit torque magnetic field sensor 102 is measured. In the present embodiment, the output voltage has a linear relationship with the magnetic field 216. The output voltage of the spin-orbit torque magnetic field sensor 102 can be used to detect/sense/measure the magnetic field 216.

FIG. 4 is a flowchart showing steps of a method 400 for detecting an angle of a magnetic field in accordance with an embodiment. For the method 400, a further spin-orbit torque magnetic field sensor is used in addition to the spin-orbit torque magnetic field sensor 102 of FIG. 2.

In a step 402, another spin-orbit torque magnetic field sensor is provided, where a longitudinal axis of the another spin-orbit torque magnetic field sensor is perpendicular to a longitudinal axis of the spin-orbit torque magnetic field sensor 102. In an embodiment, with reference to FIG. 2, the another spin-orbit torque magnetic field sensor can be provided with its longitudinal axis aligned in the y-direction and in the x-y plane of the spin-orbit torque magnetic field sensor 102. In an embodiment, the another spin-orbit torque magnetic field sensor provided is similar to the spin-orbit torque magnetic field sensor 102 (e.g. having same specifications such as material layers and device dimensions etc.).

In a step 404, another alternating current is provided to the another spin-orbit torque magnetic field sensor in the magnetic field. In an embodiment, the another alternating current provided has a same waveform, amplitude and frequency as the alternating current 214 provided to the spin-orbit torque magnetic field sensor 102. The another alternating current may be provided in a direction along the longitudinal axis of the another spin-orbit torque magnetic field sensor.

In a step 406, another output voltage of the another spin-orbit torque magnetic field sensor is measured. Similar to the output voltage measured using the spin-orbit torque magnetic field sensor 102, the another output voltage is also a time average of a time-varying anomalous Hall voltage generated in the another spin-orbit torque magnetic field sensor.

In a step 408, an angle of the magnetic field 216 is calculated using the output voltage of the spin-orbit torque magnetic field sensor 102 and the another output voltage of the another spin-orbit torque magnetic field sensor obtained in the step 406. An example of estimating the angle of the magnetic field 216 using these two output voltages obtained is discussed below in relation to FIGS. 37 and 38.

Although the above method 400 uses two spin-orbit torque magnetic field sensors, in another embodiment, a single spin-orbit torque magnetic field sensor 102 can be used to deduce the magnetic field angle. In this case, a first output voltage can be measured when the spin-orbit torque magnetic field sensor 102 has its longitudinal axis aligned in the x-direction in a first position, and a second output voltage can be measured subsequently when the same spin-orbit torque magnetic field sensor 102 in a second position is aligned such that its longitudinal axis is perpendicular to the longitudinal axis of the sensor 102 in the first position (e.g. in the y-direction).

Operation Principle of the Spin-Torque Magnetic Field Sensor

As described above, the spin-orbit torque magnetic field sensor 102 as illustrated in FIG. 2 exploits the longitudinal field dependence of the magnetization reversal process of a FM/HM bilayer with PMA. Since the switching mechanism depends strongly on a size and an effective PMA ($K_\perp^{eff}$) of the device, three scenarios in relation to the magnetic sensor are considered: Case 1) a device having a single magnetic domain with a sizable $K_\perp^{eff}$, Case 2) a large device which allows domain-wall (DW) nucleation and propagation, and Case 3) a device with a superparamagnetic FM layer.

Case 1)

The SOT-induced magnetization switching in Case 1) can be described by a macro-spin model, which predicts a critical current density of $$J_c = \frac{\sqrt{2}e}{\hbar} \frac{M_s t_{FM}}{\theta_{SH}} \left( \frac{H_k^{eff}}{\sqrt{2}} - |H_x| \right). \tag{1}$$

Here, $M_s$ ($t_{FM}$) is the saturation magnetization (thickness) of the FM layer, $H_k^{eff}$ is the effective anisotropy field, $\theta_{SH}$ is the effective spin Hall angle, $H_x$ is the longitudinal field applied in the current direction, e is the electron charge, and $\hbar$ is the reduced Planck constant.

Figure 5A:
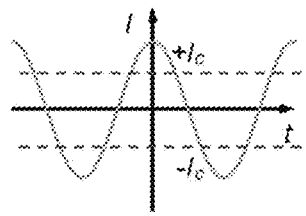
FIGS. 5A, 5B and 5C show graphs of an applied alternating current (I) as a function of time in accordance with an embodiment, where
Figure 5B:
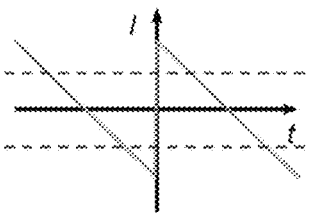
Figure 5C:
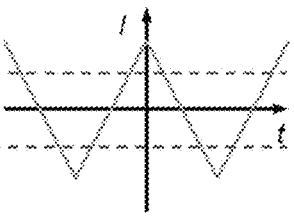

FIGS. 5A, 5B and 5C show graphs of an applied alternating (ac) current (I) as a function of time passing through the FM/HM bilayer in accordance with an embodiment, where FIG. 5A shows a graph 502 of I as a function of time for a sine current wave, FIG. 5B shows a graph 504 of I as a function of time for a sawtooth current wave and FIG. 5C shows a graph 506 of I as a function of a triangle current wave. The amplitude and period of the current are $I_0$ and T, respectively. The critical current $I_c$ which is the product of $J_c$ and the cross-section area of the device (S), is shown as dashed lines.

Figure 6A:
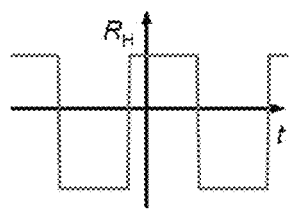
FIGS. 6A, 6B and 6C show graphs of a Hall resistance ($R_H$) as a function of time in accordance with an embodiment, where
Figure 6B:
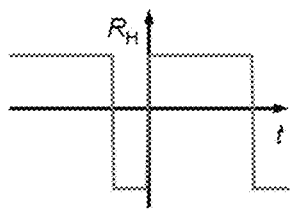
Figure 6C:
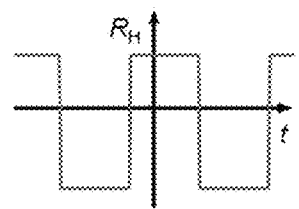

The corresponding anomalous Hall effect (AHE) waveforms $R_H(t)$ are shown in FIGS. 6A, 6B and 6C. FIGS. 6A, 6B and 6C show graphs of a Hall resistance ($R_H$) as a function of time in accordance with an embodiment, where FIG. 6A shows a graph 602 of $R_H$ as a function of time for a sine current wave, FIG. 6B shows a graph 604 of $R_H$ as a function of time for a sawtooth current wave and FIG. 6C shows a graph 606 of $R_H$ as a function of time for a triangle current wave. Each of these figures includes possible offset $R_0$ due to misalignment of the Hall voltage electrodes. For these AHE waveforms, it is assumed that $R_H$ is positive when $I \geq I_c$, $H_x > 0$ and negative when $I \leq -I_c$, $H_x > 0$ (note: $I_c > 0$). The polarity will be reversed when $H_x$ changes sign. The duty ratio of $R_H$ for the sine and triangular current waves is always 50%. As for the sawtooth current wave, the duty ratio is dependent on $I_c$.

Figure 7A:
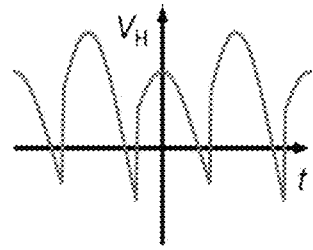
FIGS. 7A, 7B and 7C show graphs of a Hall voltage ($V_H$) as a function of time in accordance with an embodiment, where
Figure 7B:
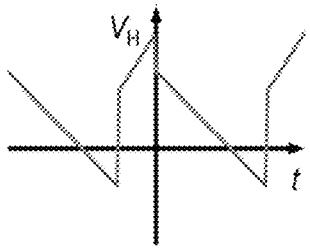
Figure 7C:
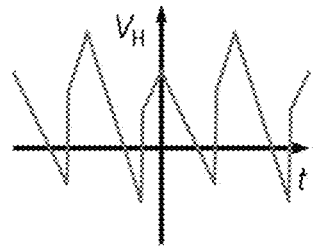

FIGS. 7A, 7B and 7C show graphs of a Hall voltage ($V_H$) as a function of time for the different ac waveforms in accordance with an embodiment, where FIG. 7A shows a graph 702 of $V_H$ as a function of time for the sine current wave, FIG. 7B shows a graph 704 of $V_H$ as a function of time for the sawtooth current wave and FIG. 7C shows a graph 706 of $V_H$ as a function of time for the triangle current wave. The Hall voltage ($V_H$) is given by $V_H(t)=I(t)R_H(t)$. It is clear that $V_H(t)$ is a periodic signal with the same period T of the ac current. When $H_x \ll H_k^{eff}$, the time average of the Hall voltage, $V_{out}=1/T\int_0^T V_H(t)dt$, is given by:

$$V_{out} = \begin{cases} \frac{\sqrt{2}R_{AHE}S}{\pi} \frac{2e}{\hbar} \frac{M_s t_{FM}}{\theta_{SH}} \text{sgn}(H_x)\sqrt{\sqrt{2}H_k^{eff}|H_x|}, & \text{sine wave} \\ \frac{R_{AHE}S}{\sqrt{2}} \frac{2e}{\hbar} \frac{M_s t_{FM}}{\theta_{SH}} H_x, & \text{sawtooth wave} \\ \frac{R_{AHE}S}{\sqrt{2}} \frac{2e}{\hbar} \frac{M_s t_{FM}}{\theta_{SH}} H_x, & \text{triangular wave} \end{cases} \tag{2}$$

where $R_{AHE}$ is the amplitude of $R_H(t)$. In the Equation (2) above, $I_0$ is set such that $$I_0 = \frac{e}{\hbar} \frac{M_s t_{FM} S H_k^{eff}}{\theta_{SH}}$$

to remove the zero-field offset. It is noted that setting $I_0$ to this specific value for removing the zero magnetic field offset is only necessary for Case 1) and Case 2). The detailed derivation of Equation (2) is discussed below.

Derivation of Equation (2)

Figure 8A:
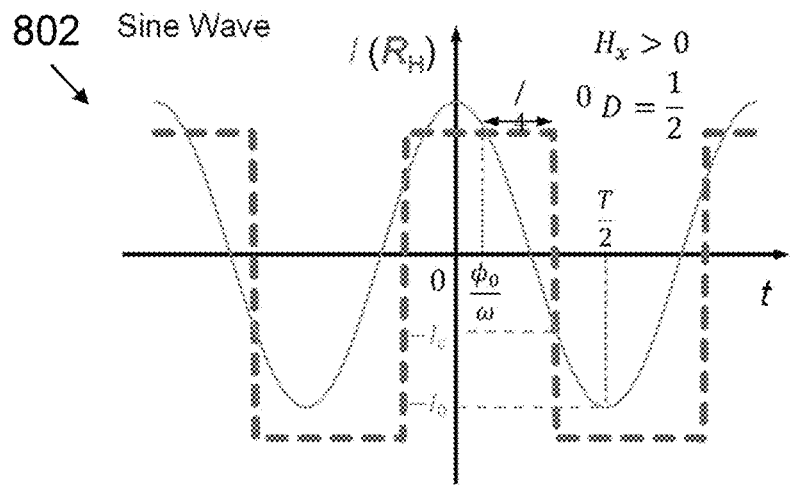
FIGS. 8A, 8B and 8C show graphs of an applied alternating current (I) and Hall resistance ($R_H$) as a function of time in the presence of an in-plane magnetic field (i.e. $H_x>0$) in accordance with an embodiment, where
Figure 8B:
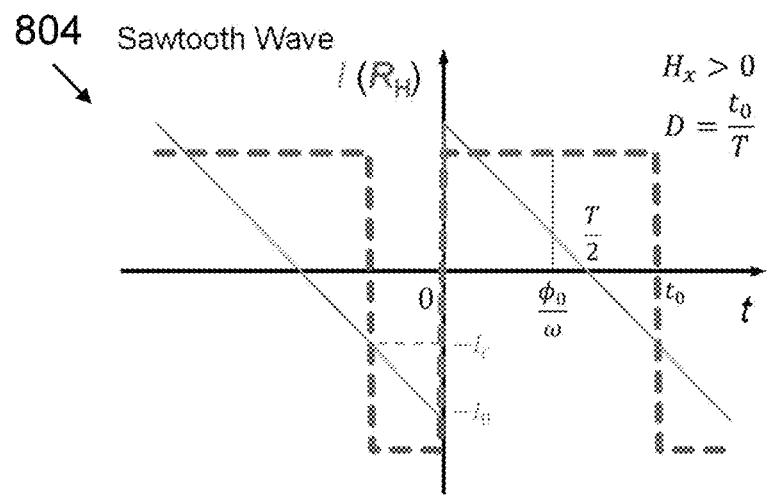
Figure 8C:
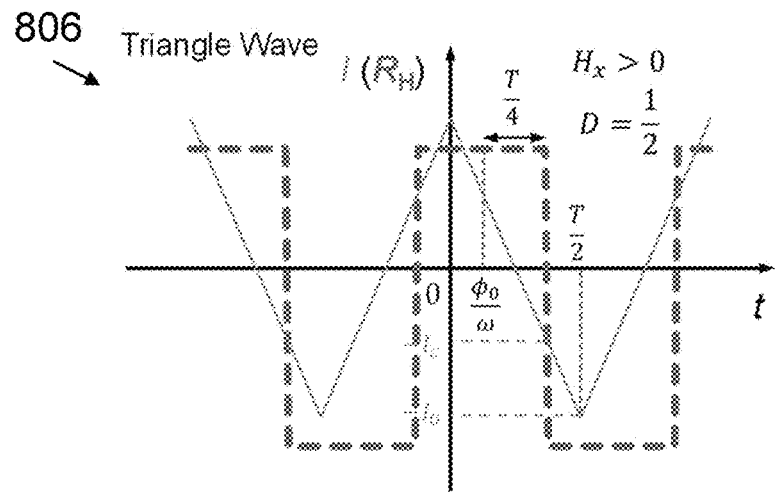

FIGS. 8A, 8B and 8C show graphs of an applied alternating current (I) and Hall resistance ($R_H$) as a function of time in the presence of an in-plane magnetic field (for $H_x > 0$) for different waveforms in accordance with an embodiment. FIG. 8A shows a graph 802 of I and $R_H$ as a function of time for a sine current wave, FIG. 8B shows a graph 804 of I and $R_H$ as a function of time for a sawtooth current wave, and FIG. 8C shows a graph 806 of I and $R_H$ as a function of time for a triangle current wave.

1. Sine Wave

FIG. 8A shows the graph 802 of I and $R_H$ as a function of time for a sinusoidal (or sine) ac current wave when $H_x>0$. The sinusoidal current wave can be expressed mathematically as:

$$I(t)=I_0 \cos \omega t, \quad (3)$$

$$R_H(t) = R_0 + \text{sgn}(H_x)\left[R_{AHE}(2D-1) + \sum_{n=1}^{+\infty} \frac{4R_{AHE}}{n\pi} \sin n\pi D \cos n(\omega t - \phi_0)\right], \quad (4)$$

where it is assumed that the current amplitude $I_0$ is larger than the critical current $I_c$, $\omega$ is the angular frequency, $\phi_0$ is the phase shift of the $R_H(t)$ with respect to t=0, D is the duty ratio of $R_H(t)$, $R_0$ is the offset resistance induced by a misalignment of the Hall voltage electrodes, and $\text{sgn}(H_x)$ represents the switching polarity which depends on the direction of $H_x$. For the sine wave case, D is 50%. Therefore, $R_H(t)$ is reduced to $$R_H(t) = R_0 + \text{sgn}(H_x)\sum_{n=1}^{+\infty} \frac{4R_{AHE}}{n\pi} \sin\frac{n\pi}{2}\cos n(\omega t - \phi_0).$$

The Hall voltage $V_H(t)$ can then be written as:

$$V_H(t) = I(t)R_H(t) = I_0\cos\omega t\left[R_0 + \text{sgn}(H_x)\sum_{n=1}^{+\infty} \frac{4R_{AHE}}{n\pi}\sin\frac{n\pi}{2}\cos n(\omega t - \phi_0)\right]. \quad (5)$$

The output voltage $V_{out}$, obtained by averaging the $V_H(t)$ over multiple cycles, is given by:

$$V_{out} = \frac{1}{T}\int_0^T V_H(t)dt = \frac{4I_0 R_{AHE}}{\pi T}\text{sgn}(H_x)\int_0^T \sum_{n=1}^{+\infty}\cos\omega t \frac{\cos n(\omega t - \phi_0)\sin\frac{n\pi}{2}}{n}dt. \quad (6)$$

It is worth noting that, mathematically, averaging over many cycles is equivalent to averaging over one cycle. However, in an actual physical sensing operation, averaging over many cycles contributes to noise reduction. By using the orthogonality property of sine and cosine functions, Equation (6) can be reduced to $$V_{out} = \frac{2I_0 R_{AHE}}{\pi}\text{sgn}(H_x)\cos\phi_0. \quad (7)$$

Since $$I\left(\frac{T}{4} + \frac{\phi_0}{\omega}\right) = -I_c$$

(as can be seen from FIG. 8A), and $$I_0\cos\left(\omega\frac{T}{4} + \phi_0\right) = -I_c,$$

it can be obtained that $\cos\phi_0 = 1-\sqrt{(I_c/I_0)^2}$ ($I_0 \geq I_c$). Substituting the critical current $$I_c = \frac{2e}{\hbar}\frac{M_s t_{FM} S}{\theta_{SH}}\left(\frac{H_k^{eff}}{2} - \frac{|H_x|}{\sqrt{2}}\right)(H_k^{eff} \gg H_x)$$

into $\cos\phi_0$ in Equation (7), it can be obtained $$V_{out} = \text{sgn}(H_x)\frac{2R_{AHE}}{\pi}\sqrt{I_0^2 - k^2\left(\frac{H_k^{eff}}{2} - \frac{|H_x|}{\sqrt{2}}\right)^2}, \quad (8)$$

where $$k = \frac{2e}{\hbar}\frac{M_s t_{FM} S}{\theta_{SH}}. \text{ When } I_0 = k\frac{H_k^{eff}}{2},$$

and $H_x$ is small, $V_{out}$ can be written as $$V_{out} = \text{sgn}(H_x)\frac{\sqrt{2} R_{AHE} k}{\pi}\sqrt{\sqrt{2} H_k^{eff}|H_x|}. \quad (9)$$

Therefore, the output voltage $V_{out}$ has a non-linear relationship with the longitudinal magnetic field in the sine wave case. A sinusoidal wave can therefore not be used for a linear magnetic sensor.

2. Sawtooth Wave

FIG. 8B shows a graph 804 of I and $R_H$ as a function of time for a sawtooth ac current wave when $H_x>0$. In this case, the current and Hall resistance are given by:

$$I(t) = \sum_{n=1}^{\infty} \frac{2I_0}{n\pi}\sin n\omega t, \quad (10)$$

$$R_H(t) = R_0 + \text{sgn}(H_x)\left[R_{AHE}(2D-1) + \sum_{m=1}^{+\infty} \frac{4R_{AHE}}{m\pi}\sin m\pi D \cos m(\omega t - \phi_0)\right]. \quad (11)$$

The Hall voltage $V_H(t)$ can be then written as $$V_H(t) = \left\{R_0 + \text{sgn}(H_x)\left[R_{AHE}(2D-1) + \sum_{m=1}^{+\infty} \frac{4R_{AHE}}{m\pi}\sin m\pi D \cos m(\omega t - \phi_0)\right]\right\} \sum_{n=1}^{\infty} \frac{2I_0}{n\pi}\sin n\omega t \quad (12)$$

which leads to the averaged output of:

$$V_{out} = \frac{1}{T}\int_0^T V_H(t)dt = \tag{13}$$

$$\frac{2R_{AHE}I_0\text{sgn}(H_x)}{T}\int_0^T \sum_{m=1}^{+\infty}\frac{4}{m\pi}\sin m\pi D\cos m(\omega t - \phi_0)\sum_{n=1}^{\infty}\frac{1}{n\pi}\sin n\omega t\, dt$$

where the $$R_0\sum_{n=1}^{\infty}\frac{2I_0}{n\pi}\sin n\omega t \text{ and } \text{sgn}(H_x)R_{AHE}(2D-1)\sum_{n=1}^{\infty}\frac{2I_0}{n\pi}$$

sin nωt terms in $V_H(t)$ have been averaged to zero. Equation (13) can be further reduced as $$V_{out} = \frac{8a}{\pi^2 T}\left[\int_0^T \sum_{m=1}^{+\infty}\sum_{n=1}^{\infty}\frac{1}{mn}\sin m\pi D\cos m(\omega t - \phi_0)\sin n\omega t\, dt\right] \tag{14}$$

$$= \frac{8a}{\pi^2 T}\left[\int_0^T \sum_{m=1}^{+\infty}\sum_{n=1}^{\infty}\frac{1}{2mn}\sin m\pi[\sin((m+n)\omega t - m\phi_0) - \right.$$

$$\left.\sin((m-n)\omega t - m\phi_0)]dt\right]$$

$$= \frac{4a}{\pi^2}\sum_{n=m=1}^{+\infty}\frac{1}{nm}\sin m\pi D\sin m\phi_0,$$

where $$a = R_{AHE}I_0\text{sgn}(H_x), D = \frac{t_0}{T} = \frac{I_c + I_0}{2I_0}, \text{ and } \frac{\phi_0}{\omega} = \frac{t_0}{2}.$$

Therefore, $$V_{out} = \frac{4a}{\pi^2}\sum_{n=1}^{+\infty}\frac{1}{n^2}\sin^2 n\pi\left(\frac{I_c+I_0}{2I_0}\right) = \frac{2a}{\pi^2}\sum_{n=1}^{+\infty}\frac{1}{n^2}\left(1-\cos n\pi\left(\frac{I_c+I_0}{I_0}\right)\right) \tag{15}$$

$$= \frac{2a}{\pi^2}\sum_{n=1}^{+\infty}\frac{1}{n^2}\left(1-\cos n\pi \cos n\pi\frac{I_c}{I_0}\right)$$

$$= \frac{2a}{\pi^2}\left[\sum_{n=1}^{+\infty}\frac{1}{n^2} - \sum_{n=1}^{+\infty}\frac{1}{n^2}\left(\cos n\left(\pi-\frac{I_c}{I_0}\pi\right)+\cos n\left(\pi+\frac{I_c}{I_0}\pi\right)\right)\right]$$

Since $$\sum_{n=1}^{+\infty}\frac{1}{n^2} = \frac{\pi^2}{6}, \sum_{n=1}^{+\infty}\frac{1}{n^2}\cos nx = \frac{x^2}{4} - \frac{\pi x}{2} + \frac{\pi^2}{6},$$

it can be obtained $$V_{out} = \frac{a}{\pi^2}\left[\frac{\pi^2}{3} - \frac{\left(\pi-\frac{I_c}{I_0}\pi\right)^2}{4} + \frac{\pi\left(\pi-\frac{I_c}{I_0}\pi\right)}{2} - \frac{\pi^2}{6} - \right. \tag{16}$$

$$\left.\frac{\left(\pi+\frac{I_c}{I_0}\pi\right)^2}{4} + \frac{\pi\left(\pi+\frac{I_c}{I_0}\pi\right)}{2} - \frac{\pi^2}{6}\right]$$

$$= \frac{a}{2\pi^2}\left[\pi^2 - \left(\frac{I_c}{I_0}\pi\right)^2\right]$$

$$= R_{AHE}\text{sgn}(H_x)\frac{I_0^2 - I_c^2}{2I_0},$$

which can be further expressed as a function of $H_x$:

$$V_{out} = R_{AHE}\text{sgn}(H_x)\frac{I_0^2 - k^2\left(\frac{H_k^{eff}}{2} - \frac{|H_x|}{\sqrt{2}}\right)^2}{2I_0} \tag{17}$$

When $$I_0 = k\frac{H_k^{eff}}{2},$$

the output will be $$V_{out} = \frac{R_{AHE}k}{\sqrt{2}}H_x \tag{18}$$

Therefore, for the sawtooth ac waveform, a linear response to the longitudinal magnetic field can be obtained. Further, it can be seen that an offset due to misalignment of electrodes, if any, is automatically suppressed.

3. Triangle Wave

FIG. 8C shows a graph 806 of I and $R_H$ as a function of time for a triangle current wave (also known as a ramp wave) when $H_x > 0$. The current and Hall resistance for this triangle wave case, which can be expressed as $$I(t) = \sum_{n=1}^{\infty}\frac{8I_0}{n^2\pi^2}\cos n\omega t \tag{19}$$

$$R_H(t) = R_0 + \text{sgn}(H_x)\sum_{m=1}^{+\infty}\frac{4R_{AHE}}{m\pi}\sin\frac{m\pi}{2}\cos m(\omega t - \phi_0) \tag{20}$$

The Hall voltage $V_H(t)$ is then given by $$V_H(t) = \tag{21}$$

$$\left(R_0 + \text{sgn}(H_x)\sum_{m=1}^{+\infty}\frac{4R_{AHE}}{m\pi}\sin\frac{m\pi}{2}\cos m(\omega t - \phi_0)\right)\sum_{n=1}^{\infty}\frac{8I_0}{n^2\pi^2}\cos n\omega t$$

from which the output voltage is derived as $$V_{out} = \frac{1}{T}\int_0^T V_H(t)dt = \frac{32a}{T}\left[\int_0^T \sum_{m=1}^{+\infty}\frac{1}{m\pi}\sin\frac{m\pi}{2}\cos m(\omega t - \right. \tag{22}$$

$$\left.\phi_0)\sum_{n=1}^{\infty}\frac{1}{n^2\pi^2}\cos n\omega t\, dt\right]$$

-continued $$= \frac{32a}{\pi^3 T}\left[\int_0^T \sum_{m=1}^{+\infty}\sum_{n=1}^{\infty}\frac{1}{2mn^2}\sin\frac{m\pi}{2}[\cos((m+n)\omega t - m\phi_0) + \cos((m-n)\omega t - m\phi_0)]dt\right]$$

$$= \frac{16a}{\pi^3}\sum_{n=m=1}^{+\infty}\frac{1}{mn^2}\sin\frac{m\pi}{2}\cos m\phi_0,$$

where $a = R_{AHE}I_0\,\mathrm{sgn}(H_x)$, and $\phi_0$ can be obtained from the relation $$\frac{\frac{\phi_0}{\omega}+\frac{T}{4}}{T/2} = \frac{I_c+I_0}{4I_0} \text{ as } \phi_0 = \frac{I_c}{2I_0}\pi.$$

Therefore, $V_{out}$ can be further written as $$V_{out} = \frac{16a}{\pi^3}\sum_{n=1}^{+\infty}\frac{1}{n^3}\sin\frac{n\pi}{2}\cos n\pi\left(\frac{I_c}{2I_0}\right) = \quad (23)$$

$$\frac{8a}{\pi^3}\sum_{n=1}^{+\infty}\frac{1}{n^3}\left(\sin\frac{n\left(\pi+\frac{I_c}{I_0}\pi\right)}{2}+\sin\frac{n\left(\pi-\frac{I_c}{I_0}\pi\right)}{2}\right)$$

$$= \frac{8a}{\pi^3}\sum_{n=1}^{+\infty}\frac{1}{n^3}\left(\sin\frac{n\left(\pi+\frac{I_c}{I_0}\pi\right)}{2}-\sin\left(\frac{n\left(\pi+\frac{I_c}{I_0}\pi\right)}{2}-n\pi\right)\right)$$

$$= \frac{8a}{\pi^3}\sum_{n=1}^{+\infty}\frac{1}{n^3}(1-(-1)^n)\sin\frac{n\left(\pi+\frac{I_c}{I_0}\pi\right)}{2}$$

According to the sine series of $x^2$ and $$x: x^2 = \frac{2}{\pi}\sum_{n=1}^{+\infty}\left[\frac{2}{n^3}((-1)^n-1)\sin nx - (-1)^n\pi^2\frac{\sin nx}{n}\right], \text{ and}$$

$$x = 2\sum_{n=1}^{+\infty}(-1)^{n+1}\frac{\sin nx}{n}, V_{out}$$

can be reduced to:

$$V_{out} = \frac{8a}{\pi^3}\left[-\frac{\pi}{4}\left(\pi+\frac{I_c}{I_0}\pi\right)^2+\frac{\pi^2}{4}\left(\pi+\frac{I_c}{I_0}\pi\right)\right] = \frac{a}{2\pi^3}\left(\pi^3-\pi\left(\frac{I_c}{I_0}\pi\right)^2\right) \quad (24)$$

$$= R_{AHE}\mathrm{sgn}(H_x)\frac{I_0^2-I_c^2}{2I_0}$$

As can be seen, $V_{out}$ has the same expression with the case for a sawtooth wave. When $$I_0 = k\frac{H_k^{eff}}{2},$$

the output voltage will be $$V_{out} = \frac{R_{AHE}k}{\sqrt{2}}H_x,$$

which is linear to the longitudinal field. The offset due to electrode misalignment is also suppressed for this case.

Figure 9A:
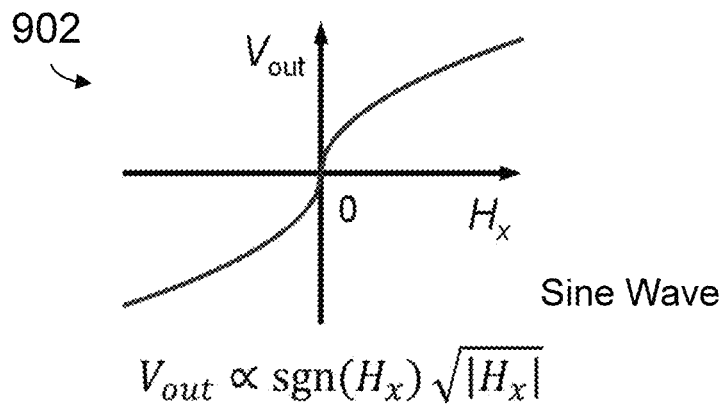
FIGS. 9A, 9B and 9C show graphs of an output voltage ($V_{out}$) as a function of an in-plane magnetic field $H_x$ in accordance with an embodiment, where
Figure 9B:
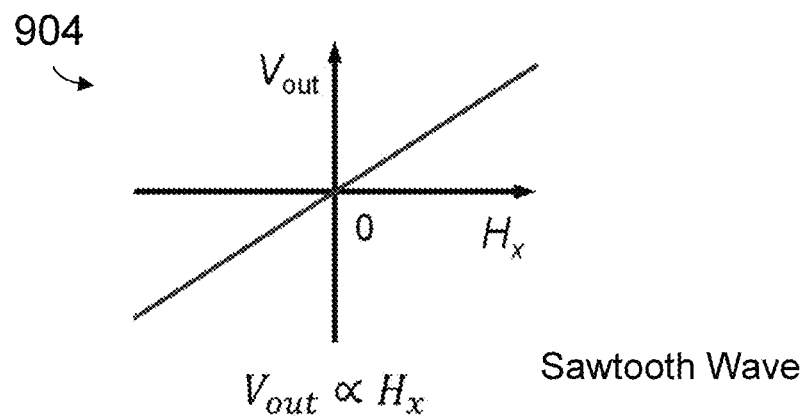
Figure 9C:
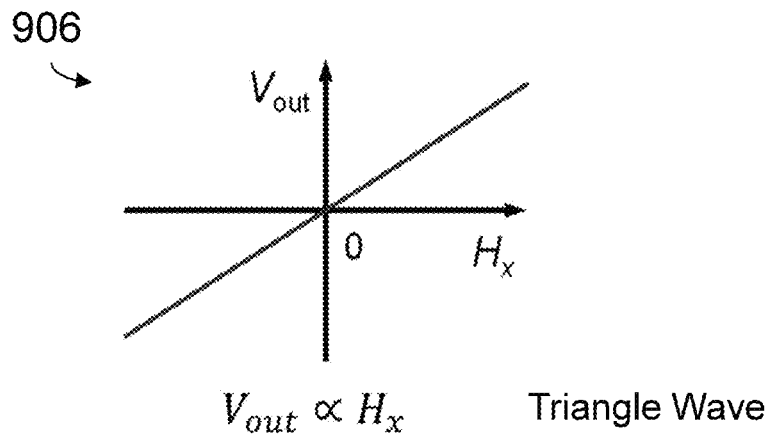

Using the above equations, the average output signal ($V_{out}$) as a function of an in-plane magnetic field $H_x$ is shown in FIGS. 9A, 9B and 9C for the different current waveforms. FIG. 9A shows a graph 902 of $V_{out}$ as a function of $H_x$ for a sine current wave, FIG. 9B shows a graph 904 of $V_{out}$ as a function of $H_x$ for a sawtooth current wave and FIG. 9C shows a graph 906 of $V_{out}$ as a function of $H_x$ for a triangle current wave. As shown in FIGS. 9A, 9B and 9C, $V_{out}$ is non-linear for sine current wave, but is linear for each of the sawtooth and triangle current waves. Equation (2) demonstrates that it is possible to realize a magnetic field sensor with a linear response and without any magnetic bias when the magnetic field sensor is driven by either a sawtooth or a triangle ac current. In addition, it is not necessary to use a bridge to remove the zero-field offset. When the current amplitude is large enough, a very small change in $H_x$ will lead to an increased or decreased probability of the magnetization being switched to one of the two directions, depending on the polarity of the magnetic field. Therefore, in principle, the spin-orbit torque magnetic field sensor can be used for sensing a small magnetic field. As the way the signal is derived resembles a flux-gate sensor, it can also be termed as a spin-torque gate (STG) magnetic field sensor.

Besides the three types of waveforms as discussed above, a square waveform for the ac current is also examined below.

4. Square Wave

Figure 10A:
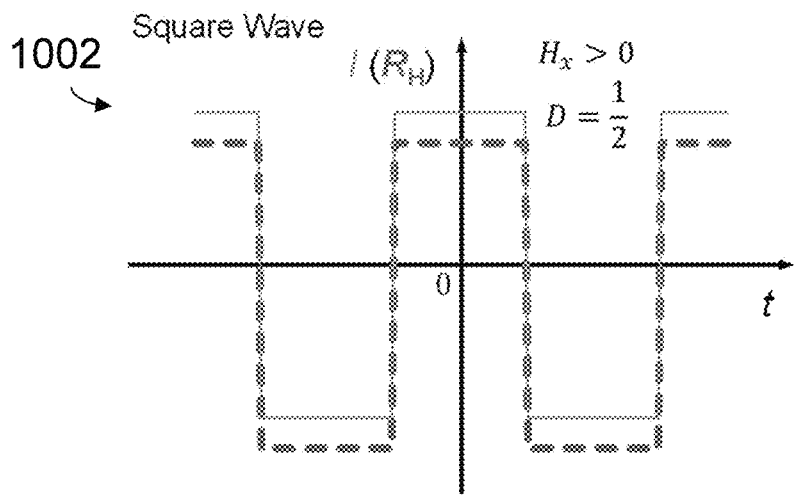
FIGS. 10A, 10B and 10C show similar graphs as shown in FIGS. 6A, 7A and 9A, respectively, for a square current waveform in accordance with an embodiment, where
Figure 10B:
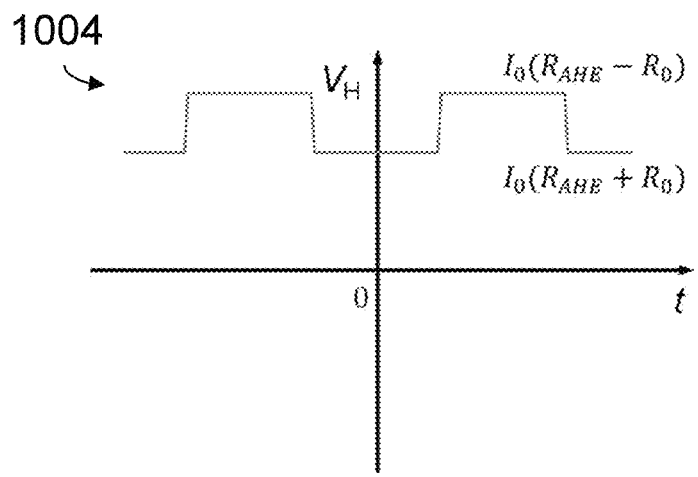
Figure 10C:
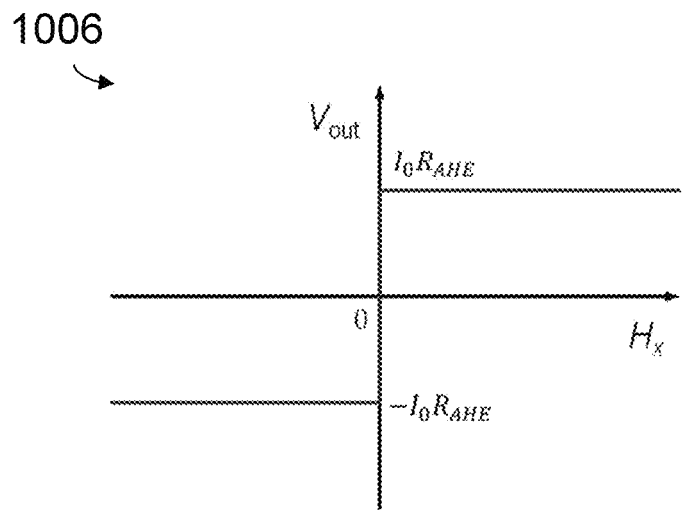

FIGS. 10A, 10B and 10C show similar graphs as shown in FIGS. 6A, 7A and 9A, respectively, for a square current waveform in the presence of an in-plane magnetic field (where $H_x$>0) in accordance with an embodiment, where FIG. 10A shows a graph 1002 of an applied alternating current (I) and a Hall resistance ($R_H$) as a function of time, FIG. 10B shows a graph 1004 of a Hall voltage ($V_H$) as a function of time, and FIG. 10C shows a graph 1006 of an output voltage ($V_{out}$) as a function of an in-plane magnetic field $H_x$. As shown in FIGS. 10A and 10B, $R_H(t)$ and $V_H(t)$ also have a square waveform with a same duty ratio of the sine wave (i.e. D is 50%) and a zero phase difference with I(t). This results in a constant amplitude of output voltage at different $H_x$ as shown in FIG. 10C, which can be expressed as $V_{out}=\mathrm{sgn}(H_x)I_0R_{AHE}$. In other words, a square wave would lead to a constant amplitude of $V_{out}$ independent of $H_x$. Therefore, in this case, the device cannot function as a magnetic field sensor as it can only detect a direction or polarity of the external longitudinal magnetic field.

Case 2)

The macro-spin model as described in detail above is valid for single domain devices (i.e. Case 1). For devices with lateral dimensions larger than a domain wall (DW) width (Case 2), magnetization switching occurs primarily through domain wall nucleation followed by propagation, which results in a much smaller critical current density. The DW nucleation may occur either inside the magnetic layer due to defects, or at the edge of the sample due to a combination of Dzyaloshinskii-Moriya interaction (DMI), the applied field and current, demagnetizing field and thermal effect, etc. DW nucleation at the edges plays a dominant role in reproducible and deterministic switching of the magnetization. The nucleation at the edge may be written as $$H_{n,edge} = \frac{\pi(\sigma_0 \mp 2\Delta\mu_0 M_s H_x)^2 t_{FM}}{4\mu_0 M_s p k_B T}.$$

Here, $\sigma_0 = 4\sqrt{AK_0} - D\pi$ is the domain wall energy density in the presence of the DMI, D is the DMI constant, $K_0$ is the effective anisotropy constant, A is the exchange constant, $\Delta = \sqrt{A/K_0}$, $\mu_0$ is the vacuum susceptibility, $k_B$ is the Boltzmann constant, T is temperature, and $p = \ln(\tau/\tau_0)$ with $\tau$ the waiting time and $\tau_0$ the attempt time. When $$H_x \ll \frac{\sigma_0}{2\Delta\mu_0 M_s} \approx \frac{2K_0}{\mu_0 M_s}$$

(when D is small), one has $$H_{n,edge} \approx \frac{4\pi A t_{FM}}{p k_B T}\left(\frac{H_k^{eff}}{2} \mp |H_x|\right), \quad (25)$$

Here, the $\mp$ sign indicates the nucleation site at opposite edges. In actual case, only the minus sign is relevant as DW propagation immediately follows its nucleation. Since $pk_B T$ can be made much larger than $4\pi A t_{FM}$, this explains why the switching current density in DW-driven switching is much smaller than the value predicted by the macro-spin model. When the nucleation field is originated from the DL effective field, the corresponding critical current density may be written as $$J_{c,DW} = \frac{4\pi e}{\hbar} \frac{M_s A t_{FM}^2}{p\theta_{SH} k_B T}\left(\frac{H_k^{eff}}{2} - |H_x|\right), \quad (26)$$

Equation (26) is essentially the same as that of Equation (1) except for the pre-factor. The pre-factor can be further modified with domain wall pinning effect taken into consideration. Therefore, Equation (2) is still applicable in the incoherent switching case.

Case 3)

For Case 3), the effective anisotropy becomes very small. In this case, for a single domain element, the magnetization fluctuates between $+M_z$ and $-M_z$ due to a weak perpendicular magnetic anisotropy (PMA) and small thermal stability. When it is used as a free layer of a magnetic tunnel junction, it results in a superparamagnetic or stochastic tunnel junction, which is an important building block for stochastic and neuromorphic computing. The superparamagnetic or stochastic properties are explored here in relation to a magnetic field sensor. Similar to the case of a spin with two directions pointing either parallel or anti-parallel to an external magnetic field, when a magnetic field is applied in an easy axis of a superparamagnetic element with a weak PMA, the average magnetization in the field direction may be written as $$M_Z = M_s \tanh\frac{M_s H_Z V}{k_B T},$$

and the Hall resistance is thus given by $$R_H = R_0 + R_{AHE}\tanh\frac{M_s H_Z V}{k_B T}.$$

Here, $H_z$ is the applied magnetic field along the easy axis, and V is the magnetic volume. When $H_z$ is derived from the DL SOT effective field, $H_z^{DL} = H^{DL} m_x$ ($H^{DL}$: magnitude of DL effective field at $m_x=1$). When $H_x$ is small, $$H_Z^{DL} = \left(\frac{H^{DL}}{H_k^{eff}}\right)H_x, \text{ with } H^{DL} = \frac{\hbar}{2e}\frac{\theta_{SH}}{M_s t_{FM} S}I.$$

From the above relationships, the Hall voltage at small $H_x$ can be obtained as $$V_H(t) = IR_0 + I^2 R_{AHE}\frac{\hbar\theta_{SH}}{2ek_B T}\frac{H_x}{H_k^{eff}}. \quad (27)$$

When the sensor is driven by a sine wave $I = I_0 \cos\omega t$, the time average of $V_H(t)$ is given by $$V_{out} = I_0^2 R_{AHE}\frac{\hbar\theta_{SH}}{4ek_B T}\frac{H_x}{H_k^{eff}}, \quad (28)$$

which presents a linear relationship with $H_x$ with zero offset. In addition, a linear response can also be obtained for this Case 3) when it is driven by other ac waveforms like a square, sawtooth, and triangle waves. This is shown in more detail below. The spin-orbit torque magnetic field sensor may also be known as a spin torque gated stochastic (STG) magnetic field sensor in this case. The gating operation is important because it eliminates the dc offset and at the same time also suppresses magnetic noise.

Derivation of an Output Voltage for STG Sensor with a Hyperbolic Tangent Switching Behaviour (i.e. Case 3)

1. Sine Wave

When a STG sensor is driven by a sine wave, the Hall voltage is $V_H(t) = I_0 \sin\omega t (R_0 + R_H)$, where $R_H$ can be expressed as a hyperbolic tangent function $$R_H = R_0 + R_{AHE}\tanh\frac{M_s H_Z V}{k_B T}.$$

When $H_z$ is derived from the DL SOT effective field, $H_z^{DL} = H^{DL} m_x$. Therefore, to create an effective field in a z-direction (i.e. perpendicular to the plane of the magnetic layer of the STG sensor), a longitudinal magnetic field is required to orientate the magnetization of the element in the x-direction. When $H_x$ is small, it may be assumed that $$H_z^{DL} = \left(\frac{H^{DL}}{H_k^{eff}}\right)H_x,$$

with $$H^{DL} = \frac{\hbar}{2e} \frac{\theta_{SH}}{M_S t_{FM} S} I_0 \sin \omega t.$$

From the above relationship, the Hall voltage can be obtained for a small field range ($H_x \ll H_k^{eff}$) as $$V_H(0) = I_0 \sin\omega t R_0 + I_0 \sin\omega t R_{AHE} \tanh\left( I_0 \sin\omega t \frac{M_s V}{k_B T} \frac{\hbar}{2e} \frac{\theta_{SH}}{M_s t_{FM} S} \frac{H_x}{H_k^{eff}} \right) \quad (29)$$

At small $H_x$, Equation 29 can be reduced to $$V_H(t) = I_0 \sin\omega t R_0 + (I_0 \sin\omega t)^2 R_{AHE} \frac{1}{k_B T} \frac{\hbar}{2e} \frac{\theta_{SH}}{H_k^{eff}} H_x \quad (30)$$

By average the Hall voltage over one cycle, the output voltage can be obtained as $$V_{out} = \frac{1}{T'} \int_0^{T'} V_H dt = I_0^2 R_{AHE} \frac{1}{k_B T T'} \frac{\hbar}{2e} \frac{\theta_{SH}}{H_k^{eff}} \int_0^{T'} \sin^2 \omega t \, dt = \quad (31)$$

$$\frac{I_0^2 R_{AHE}}{2} \frac{1}{k_B T} \frac{\hbar}{2e} \frac{\theta_{SH}}{H_k^{eff}} H_x = \frac{1}{2} I_0^2 R_{AHE} b H_x$$

where $$b = \frac{1}{k_B T} \frac{\hbar}{2e} \frac{\theta_{SH}}{H_k^{eff}},$$

the cycle period here is written as T' to differentiate from temperature T. As can be seen, $V_{out}$ is linear with $H_x$ for a small magnetic field.

2. Square Wave

Similarly, when the magnetic field sensor is driven by a square wave having a duty cycle of 50%, by changing the current expression from $I_0 \sin \omega t$ to $$\sum_{n=1}^{+\infty} \frac{4I_0}{n\pi} \sin\frac{n\pi}{2} \cos n\omega t,$$

the Hall voltage $V_H(t)$ can be written as:

$$V_H(t) = \quad (32)$$

$$R_0 \sum_{n=1}^{+\infty} \frac{4I_0}{n\pi} \sin\frac{n\pi}{2} \cos n\omega t + b R_{AHE} H_x \left( \sum_{n=1}^{+\infty} \frac{4I_0}{n\pi} \sin\frac{n\pi}{2} \cos n\omega t \right)^2$$

which leads to the output voltage as $$V_{out} = \frac{1}{T'} \int_0^{T'} V_H dt = \frac{16 I_0^2 R_{AHE} b}{\pi^2 T'} H_x \int_0^{T'} \sum_{n=1}^{+\infty} \left( \frac{1}{n} \sin\frac{n\pi}{2} \cos n\omega t \right)^2 dt \quad (33)$$

$$= \frac{16 I_0^2 R_{AHE} b}{\pi^2 T'} H_x \int_0^{T'} \frac{1}{n^2} \frac{(1 - \cos n\pi)(1 + \cos 2n\omega t)}{4} dt$$

$$= \frac{4 I_0^2 R_{AHE} b}{\pi^2 T'} H_x \int_0^{T'} \sum_{n=1}^{+\infty} \frac{1}{n^2} (1 - (-1)^n) dt = I_0^2 R_{AHE} b H_x.$$

Therefore, a linear response to $H_x$ can also be achieved when the sensor is driven by a square wave. The amplitude of $V_{out}$ is twice that of the sine wave case, which is consistent with the experimental results as shown below in relation to FIG. 25.

3. Sawtooth Wave

For a sawtooth wave with $$I = \sum_{n=1}^{+\infty} \frac{2I_0}{n\pi} \sin n\omega t,$$

$V_{out}$ can be obtained as:

$$V_{out} = \frac{4 I_0^2 R_{AHE} b}{\pi^2 T'} H_x \int_0^{T'} \sum_{n=1}^{+\infty} \left( \frac{1}{n} \sin n\omega t \right)^2 dt = \quad (34)$$

$$\frac{2 I_0^2 R_{AHE} b}{\pi^2 T'} H_x \int_0^{T'} \sum_{n=1}^{+\infty} \frac{1}{n^2} dt = \frac{1}{3} I_0^2 R_{AHE} b H_x.$$

4. Triangle Wave

For a triangle wave with $$I = \sum_{n=1}^{+\infty} \frac{8 I_0}{n^2 \pi^2} \cos n\omega t,$$

the output voltage is $$V_{out} = \frac{64 I_0^2 R_{AHE} b}{\pi^4 T'} H_x \int_0^{T'} \sum_{n=1}^{+\infty} \left( \frac{1}{n^2} \cos n\omega t \right)^2 dt = \quad (35)$$

$$\frac{32 I_0^2 R_{AHE} b}{\pi^4 T'} H_x \int_0^{T'} \sum_{n=1}^{+\infty} \frac{1}{n^4} dt = \frac{16}{45} I_0^2 R_{AHE} b H_x.$$

Therefore, it is demonstrated above that a linear magnetic field sensor (i.e. a magnetic field sensor with a linear response to an external magnetic field) can be obtained by using all of these different types of current waveforms (i.e. sine/sinusoidal, square, sawtooth and triangle waveforms) for Case 3).

Following the above analysis, samples of the spin-orbit torque magnetic field sensors are prepared and measured to illustrate magnetic field detection using the magnetic field sensors as presented above. Sample preparation, experimental methods and experimental results are presented below.

Sample Preparation and Experimental Methods

In the present embodiment, all the materials except for titanium (Ti) were deposited on $SiO_2$ (300 nm)/Si substrates using magnetron sputtering with a base pressure $<1\times10^{-8}$ Torr and a working pressure of $1.5\text{-}3\times10^{-3}$ Torr. The Ti layer was deposited by e-beam evaporation in the same vacuum system as the sputter machine without breaking the vacuum. This minimizes contamination during the growth of the different material layers of the magnetic field sensor. Standard photolithography and lift-off techniques were used to fabricate the Hall bars/magnetic field sensor. Prior to the deposition of the material layers, a photoresist (Mircoposit S1805) was coated on the $SiO_2$ (300 nm)/Si substrate. This is followed by patterning of the photoresist. The Mircotech laserwriter system with a 405 nm laser was used to directly expose the photoresist, after which it was developed in MF319 to form the Hall bar pattern. After film deposition, the photoresist was removed by a mixture of Remover PG and acetone to complete the Hall bar fabrication.

The surface roughness and sputtering rate of thin films were characterized using a Veeco Dimension 3100 AFM system. The magnetic properties were characterized using Quantum Design MPMS3, with the resolution of $<1\times10^{-8}$ emu. The electrical measurements were performed in the Quantum Design VersaLab PPMS with a sample rotator. The ac/dc current is applied by the Keithley 6221 current source. The longitudinal or Hall voltage is measured by the Keithley 2182 nano-voltmeter (for dc voltage), or the 500 kHz MFLI lock-in amplifier from Zurich Instruments (for harmonic voltage), or the National Instruments Data Acquisition (NI-DAQ) device (for acquiring the voltage with a large sampling rate of 1 MHz).

Results and Discussion

Choosing $WTe_2$/CoFeB Layers for Use in the Spin-Orbit Torque Magnetic Field Sensor The spin-torque magnetic field sensor as discussed above can be realized experimentally using a variety of ferromagnetic material/heavy metal (FM/HM) bilayer combinations or even a single layer of FM as long as it has a perpendicular magnetic anisotropy (PMA), a damping-like spin-orbit torque (SOT), and requires the presence of a longitudinal magnetic field for deterministic switching.

In the present embodiment, a $WTe_2$ (5)/Ti (2)/CoFeB (1.5)/MgO (2)/Ta (1.5) (the number in the parentheses indicates the layer thickness in nm) multilayer structure is selected for the experimental implementation of the spin-torque magnetic field sensor. This is due to several reasons. First, $WTe_2$ (i.e. tungsten ditelluride) has a large charge-spin conversion efficiency. Second, $WTe_2$ thin films formed by sputtering exhibit SOT, and sputtering is a common deposition method that can be easily applied and incorporated in device fabrication for the current industry. Third, the CoFeB (i.e. cobalt-iron-boron) layer exhibits a well-defined PMA in the multilayer structure. This well-defined PMA originates mainly from an interface anisotropy of the CoFeB/MgO bilayer. Fourth, the 2 nm-thick Ti (i.e. titanium) insertion layer functions as a seed layer to enhance the PMA. Fifth, this multilayer structure has a coercivity (or PMA) which varies strongly with temperature. This allows the realization of a spin torque gated stochastic magnetic sensor (c.f. Case 3 above) when the coercivity of this multilayer structure becomes weak e.g. at high temperatures (e.g. above 300K). Although this heterostructure has been used in this embodiment, a skilled person would appreciate that variations to the materials and/or the thickness of the material layers can be made. For example, in an embodiment, silver (Ag), bismuth (Bi) or platinum (Pt) may be used as the material for the insertion layer in place of Ti. In an embodiment, a thickness of the insertion layer, the ferromagnetic layer or the heavy metal layer may also be varied.

Characterization of $WTe_2$ Thin Films

Roughness of $WTe_2$ Thin Films for Different Sputtering Conditions

Figure 11A:
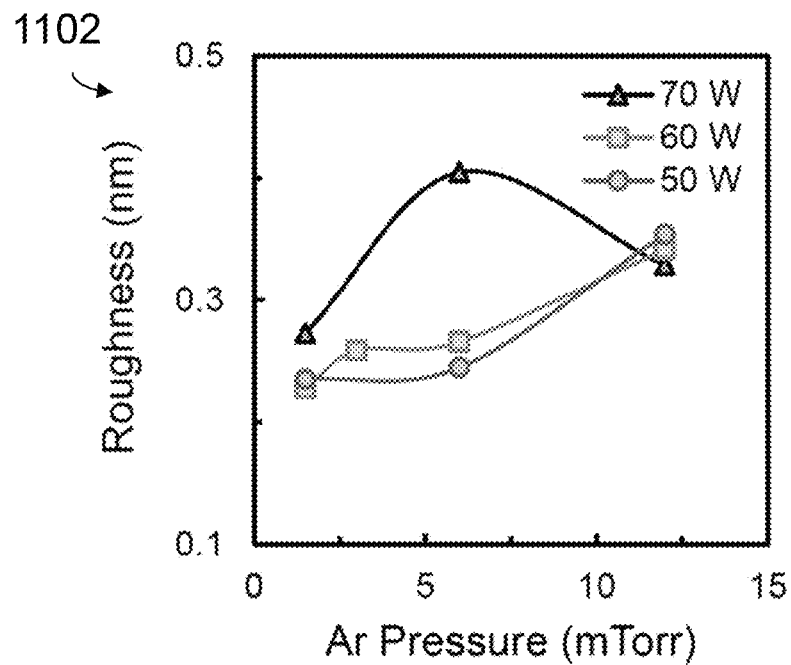
FIGS. 11A and 11B show graphs of roughness and a growth rate of $WTe_2$ thin films, respectively, for different argon (Ar) pressures and different sputtering powers in accordance with an embodiment.

The sputtering conditions including the argon (Ar) pressure and sputtering power for $WTe_2$ deposition were optimized for increasing a smoothness of the $WTe_2$ film. The roughness of $WTe_2$ thin films deposited at an argon pressure from 1.5 mTorr to 12 mTorr, and with a sputtering power ranging from 50 W to 70 W, was measured by atomic force microscopy (AFM), and the results are shown in FIG. 11A. FIG. 11A shows a graph 1102 of roughness as a function of the argon (Ar) pressure for three different sputtering powers, namely 50 W, 60 W and 70 W. It can be observed from FIG. 11A that the roughness of a $WTe_2$ film is generally smaller (e.g. ~0.23 nm for a sputtering power of 50 W) at a low argon pressure of about 1.5 mTorr.

Figure 11B:
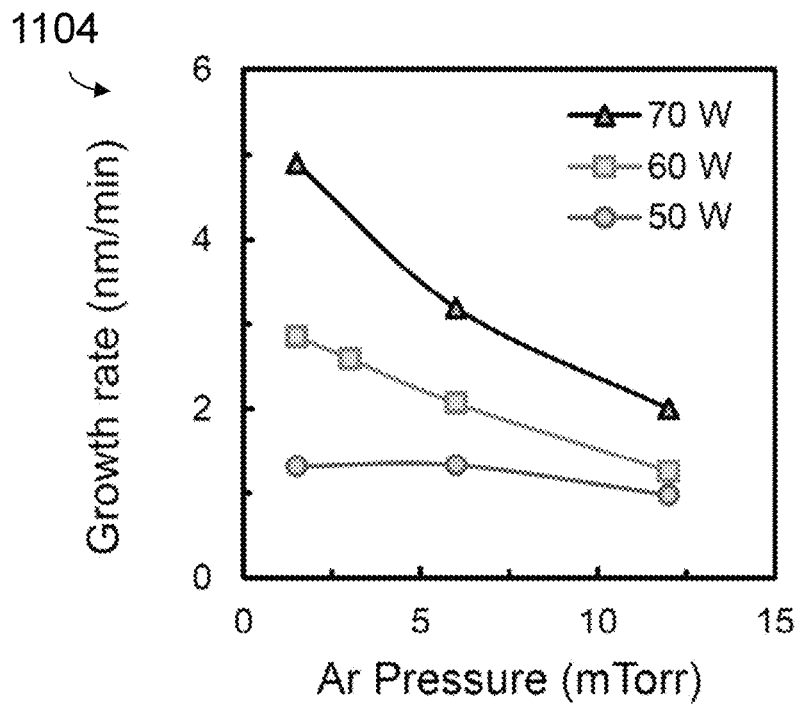

FIG. 11B shows a graph 1104 of a growth/deposition rate of $WTe_2$ thin films as a function of argon (Ar) pressure for the three different sputtering powers (i.e. 50 W, 60 W and 70 W). As shown in FIG. 11B, the deposition rate of $WTe_2$ increases with a decreasing argon pressure and an increasing sputtering power.

Figure 12A:
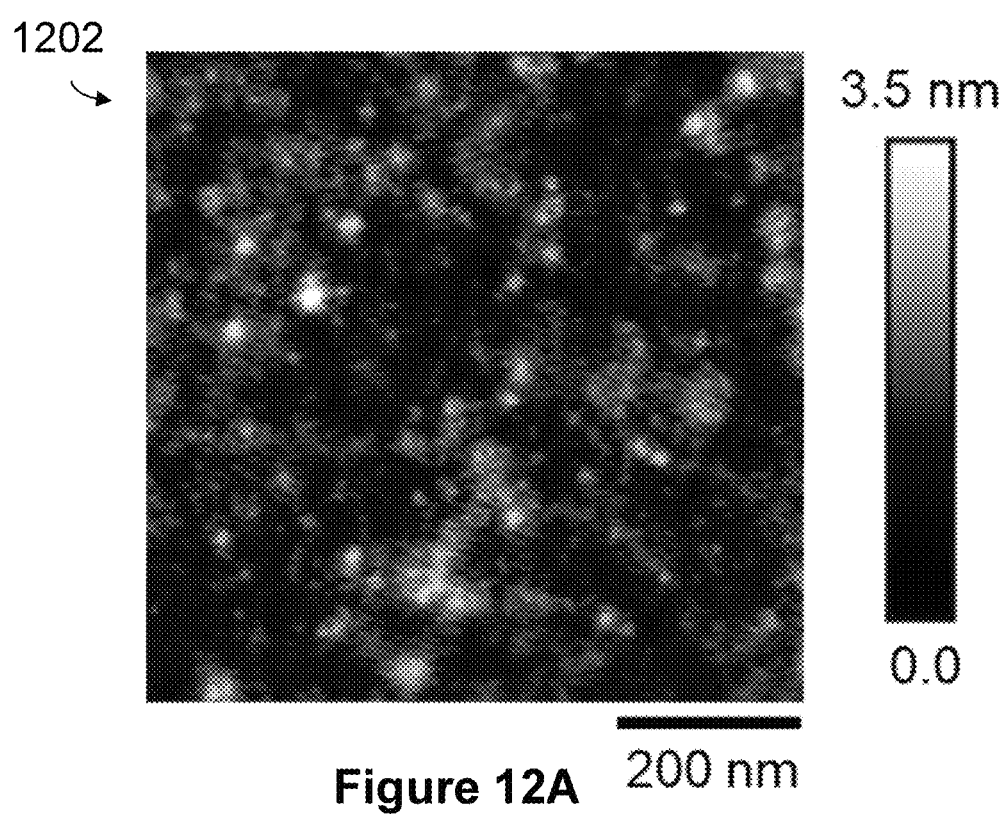
FIG. 12A shows an atomic force microscopy (AFM) image of a 30 nm thick $WTe_2$ film deposited with an argon pressure of 1.5 mTorr and a sputtering power of 60 W in accordance with an embodiment.

Based on these results, the argon pressure was fixed at 1.5 mTorr and the sputtering power was fixed at 60 W for the $WTe_2$ deposition. FIG. 12A shows an atomic force microscopy (AFM) image of a 30 nm thick $WTe_2$ film deposited at an optimized sputtering condition with an argon pressure of 1.5 mTorr and a sputtering power of 60 W in accordance with an embodiment. As shown in FIG. 12A, a smooth 30 nm-thick $WTe_2$ thin film was deposited under these conditions, with the root mean square (rms) surface roughness of ~0.2 nm.

Temperature Dependence of the Resistivity of $WTe_2$ Thin Film

Figure 13A:
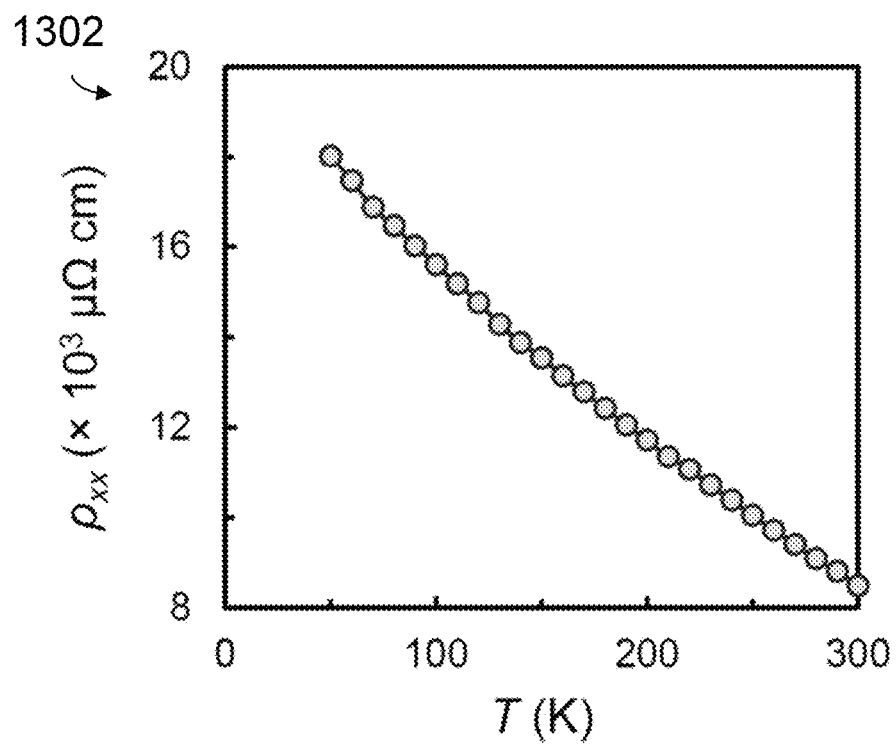
FIGS. 13A and 13B show graphs of resistivity and conductivity of a 30 nm $WTe_2$ thin film as a function of temperature, respectively, in accordance with an embodiment.
Figure 13B:
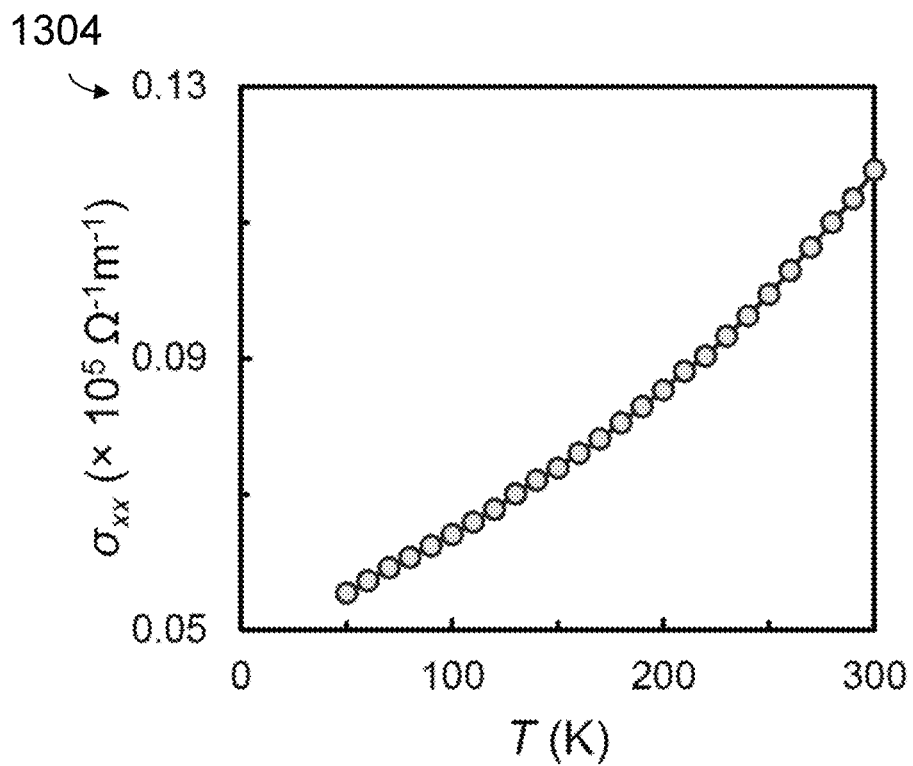

Next, a resistivity of this 30 nm-thick $WTe_2$ thin film as a function of temperature was characterized. FIG. 13A shows a graph 1302 of resistivity of the 30 nm-thick $WTe_2$ thin film as a function of temperature T, while FIG. 13B shows a graph 1304 of the corresponding conductivity as a function of temperature T, in accordance with an embodiment. As shown in FIG. 13A, the resistivity of the $WTe_2$ thin film at room temperature (i.e. about 300K) is around $8.7\times10^3$ $\mu\Omega$ cm, which is two orders of magnitude larger than the resistivity of normal metal materials. The increase of resistivity with decreasing temperature indicates a non-metallic behavior of sputtered $WTe_2$, which resembles that of a semiconductor. The highly resistive $WTe_2$ thin film is advantageous for sensor application since a larger anomalous Hall resistance can be obtained due to less current shunting in $WTe_2$, provided that the overall power consumption will not increase due to the large charge-spin conversion efficiency in $WTe_2$.

SOT Characterization of $WTe_2$ (5)/Ti (2)/CoFeB (1.5) at 200 K

Figure 17:
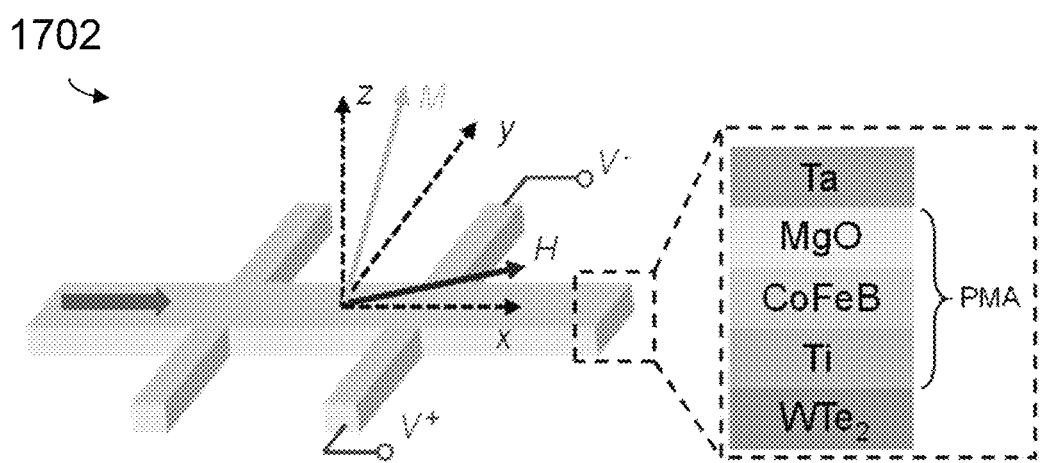
FIG. 17 shows a schematic diagram of a Hall bar device comprising a $WTe_2$ (5)/Ti (2)/CoFeB (1.5) layer stack which can function as a spin-orbit torque magnetic field sensor in accordance with an embodiment.

Damping-like (DL) SOT of a $WTe_2$ (5)/Ti (2)/CoFeB (1.5) sample was characterized by conducting harmonic Hall voltage measurements at 200 K. Since the sample shows well-defined PMA at 200 K (see e.g. FIG. 32 below), a field-scan measurement with fixed field direction along x-axis is used. By performing the magnetic field sweep measurements for different magnetic field amplitudes while fixing the magnetic field direction along the x-axis (i.e. a longitudinal direction of the Hall bar as shown in FIG. 17 and in a same direction as the current flow), the DL SOT of the $WTe_2$ (5)/Ti (2)/CoFeB (1.5) sample can be investigated.

Figure 14:
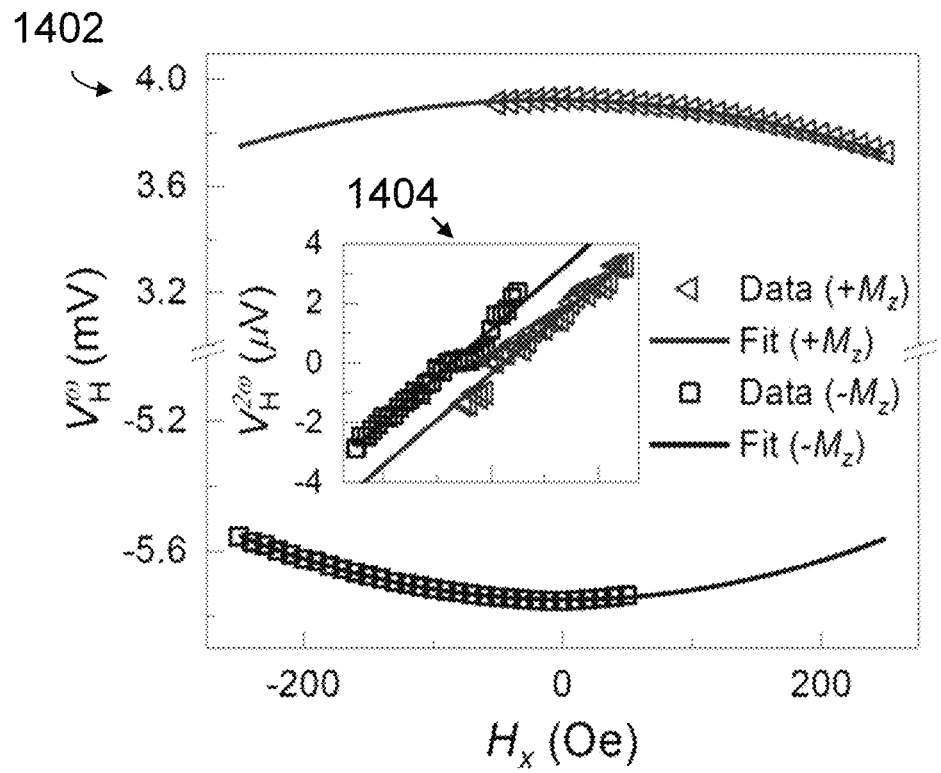
FIG. 14 shows plots of a first harmonic Hall voltage $V_H^\omega$ and a second harmonic Hall voltage $V_H^{2\omega}$ (inset) as a function of an applied longitudinal field $H_x$ in accordance with an embodiment.
Figure 15:
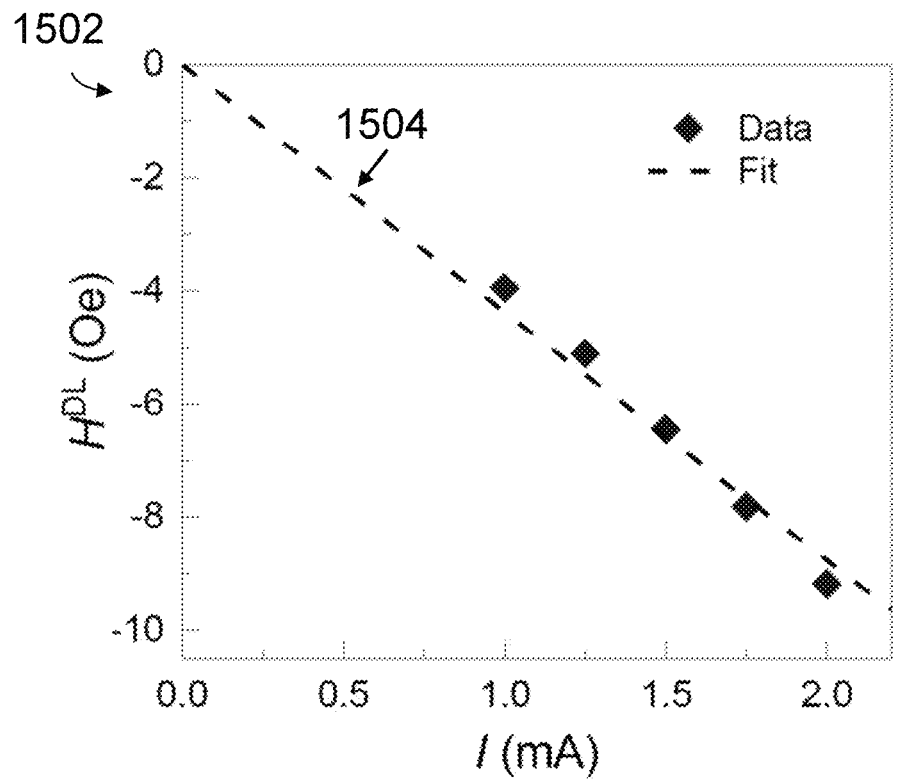
FIG. 15 shows a plot of the extracted damping-like (DL) spin-orbit torque (SOT) effective field $H^{DL}$ as a function of alternating current in accordance with an embodiment.

FIG. 14 shows plots 1402 of a first harmonic Hall voltage $V_H$ and a second harmonic Hall voltage $V_H^{2\omega}$ (inset 1404) as a function of an applied longitudinal field $H_X$ in accordance with an embodiment. These were measured using an applied ac current with an amplitude of 1.25 mA. Due to the small nucleation field, the harmonic Hall voltages were fitted from −50 Oe to 250 Oe for the "up" magnetization state (+$M_z$), and from −250 Oe to 50 Oe for the "down" magnetization state (−$M_z$) where there is no nucleation occurring. As shown in FIG. 14, the $V_H^\omega$ presents a parabolic shape as function of $H_x$, while the $V_H^{2\omega}$ (shown in the inset 1404) shows a linear relationship with $H_x$. By using the equation $$H^{DL} = -2\left(\frac{\partial V_H^{2\omega}}{\partial H_x} \bigg/ \frac{\partial^2 V_H^\omega}{\partial H_x^2}\right), \tag{36}$$

with $$\frac{\partial V_H^{2\omega}}{\partial H_x} \text{ and } \frac{\partial^2 V_H^\omega}{\partial H_x^2}$$

obtained from the fitting, the $H^{DL}$ at each current amplitude was extracted, and its values were plotted in FIG. 15. FIG. 15 shows a plot 1502 of the extracted DL SOT effective field $H^{DL}$ as a function of alternating current. With the $M_s$ value of 650 emu/cm$^3$ obtained from M-H measurement (see e.g. in relation to FIG. 16 below), $R_{xx}$=996Ω, and $H^{DL}/I$=−4.38 Oe/mA obtained from the linear fitting 1504 of $H^{DL}$-I as shown in FIG. 15, the SOT efficiency per unit electric field $\xi_E^{DL}$ can be extracted using:

$$\xi_E^{DL(FL)} = \frac{2e}{\hbar} M_s t_{CoFeB} \frac{H^{DL(FL)}}{E} \tag{37}$$

where $\hbar$ is the Plank constant, e is the electron charge, the saturation magnetization $M_s$ is 650 emu/cm$^3$, the CoFeB thickness $t_{CoFeB}$ is 1.5 nm, and the electric field can be calculated by E=I$R_{xx}$/l with $R_{xx}$ (≈996Ω) and l (=30 µm) the longitudinal resistance and length of the Hall bar, respectively. Using the above equation (37), $\xi_E^{DL}$ is extracted to be −0.39×10$^5$ Ω$^{-1}$ m$^{-1}$. With the current distribution in each layer taken into account (around 50% of the current flows in the 2 nm Ti layer), the $H^{DL}/J$ for the WTe$_2$ (5)/Ti (2)/CoFeB (1.5) is estimated to be 26.3 Oe/10$^7$ A cm$^{-2}$, which is comparable to the value previously reported for a sputtered WTe$_2$/Mo/CoFeB structure.

M-H curves for WTe$_2$ (5)/Ti (2)/CoFeB (1.5)

Figure 16:
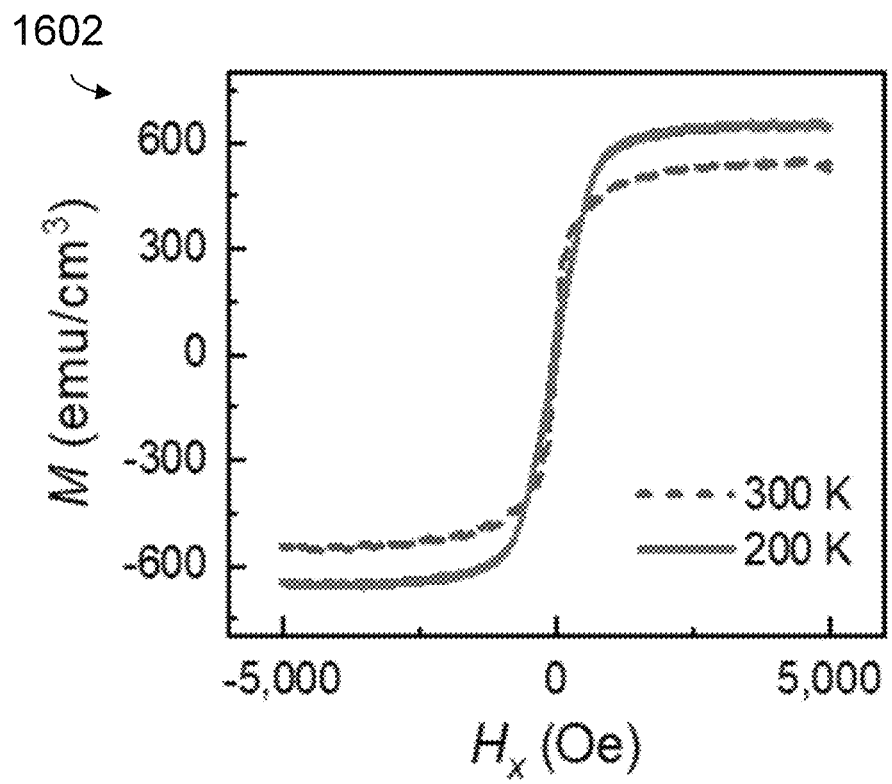
FIG. 16 shows plots of a magnetisation M as a function of an applied in-plane magnetic field $H_x$ for a $WTe_2$ (5)/Ti (2)/CoFeB (1.5) sample at temperatures of 200 K and 300 K in accordance with an embodiment.

In order to estimate the effective anisotropy, the M-H curve of a WTe$_2$ (5)/Ti (2)/CoFeB (1.5) film was measured by sweeping the magnetic field in the x-direction in a superconducting quantum interference device (SQUID). FIG. 16 shows plots 1602 of a magnetisation M as a function of an applied in-plane magnetic field $H_x$ for the WTe$_2$ (5)/Ti (2)/CoFeB (1.5) sample at temperatures of 200 K and 300 K in accordance with an embodiment. Using the plots 1602 of FIG. 16, the saturation magnetization and effective anisotropy field can be obtained as 550 emu/cm$^3$ and $H_k^{eff}$=500 Oe at room temperature (i.e. 300 K), and 650 emu/cm$^3$ and $H_k^{eff}$=1000 Oe at 200 K. This gives an effective anisotropy energy of 0.28×10$^6$ erg/cm$^3$ and 0.65×10$^6$ erg/cm$^3$ at room temperature and 200 K, corresponding to a thermal stability factor of around 6 and 22, respectively (assuming the domain size is 40 nm). With this material property, a proof-of-concept spin-orbit torque magnetic field sensor in both the DW-driven (low temperature) (i.e. Case 2 above) and the stochastic (high temperature) region (i.e. Case 3 above) can be demonstrated using the same device.

With the characterization performed above, a heterostructure of WTe$_2$ (5)/Ti (2)/CoFeB (1.5) was used for the fabrication of a Hall bar and subsequent magnetic field sensing experiments. FIG. 17 shows a schematic diagram of a Hall bar device 1702 comprising a WTe$_2$ (5)/Ti (2)/CoFeB (1.5) layer stack, where the Hall bar device 1702 can function as a spin-orbit torque magnetic field sensor in accordance with an embodiment. The Hall bar device 1702 was used for both electrical characterization and sensor demonstration as will be described below. In the present embodiment, the Hall bar length, width, spacing between voltage electrodes and width of voltage electrode were 120 µm, 15 µm, 30 µm, and 5 µm, respectively.

Figure 18:
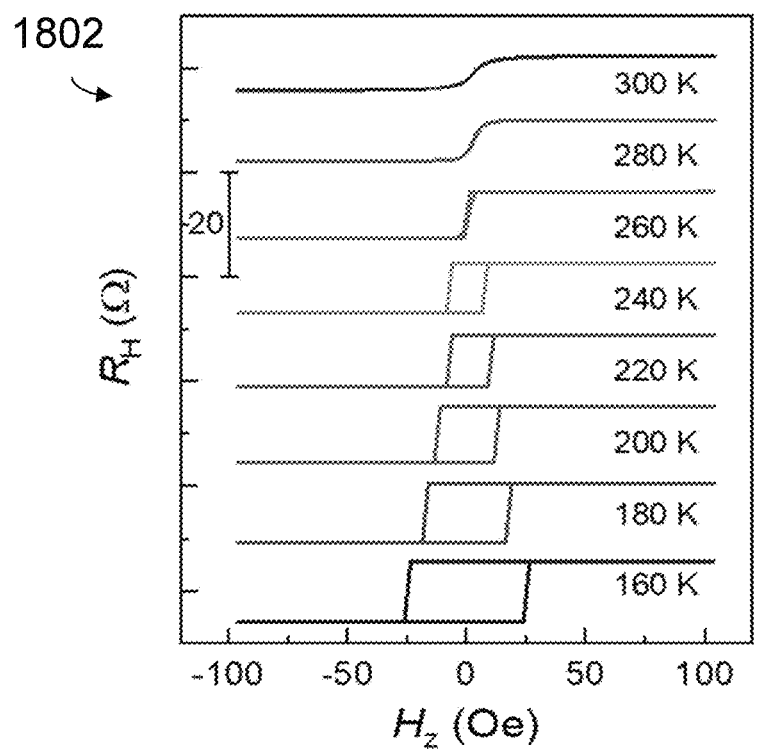
FIG. 18 shows anomalous Hall effect (AHE) curves for the Hall bar device of FIG. 17 as a function of a perpendicular magnetic field $H_z$, with an applied alternating current of 200 µA and at different temperatures from 160 K to 300 K, in accordance with an embodiment.
Figure 19:
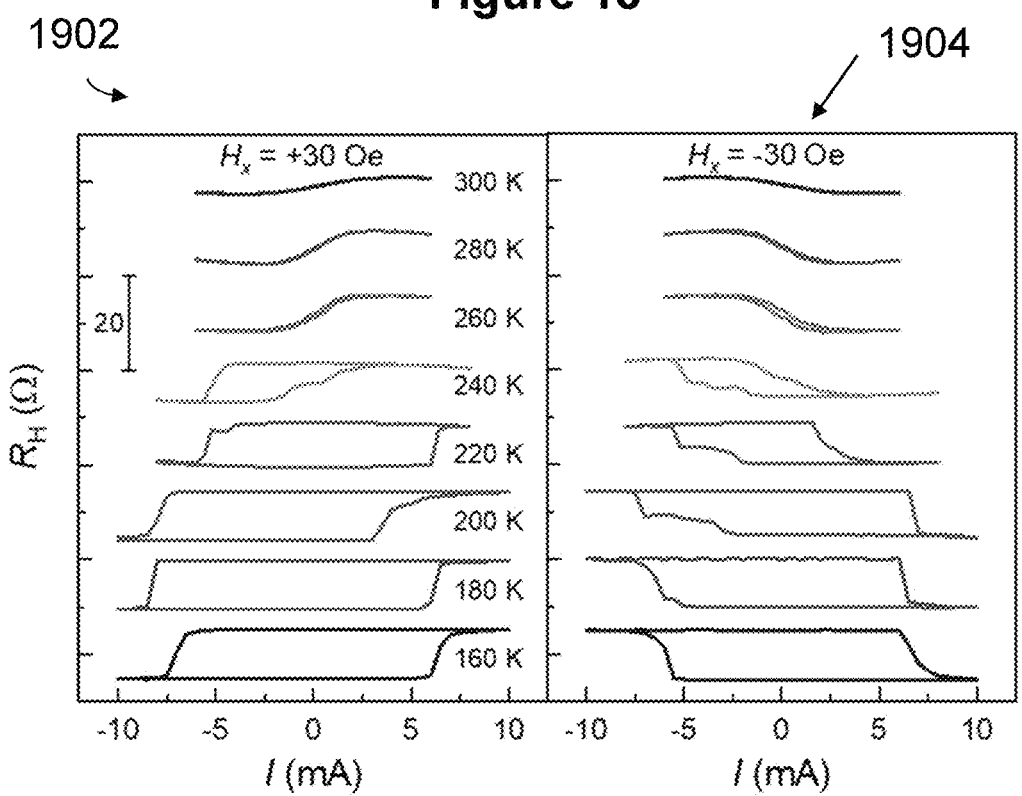
FIG. 19 shows plots of current-induced switching loops of the Hall bar device of FIG. 17 at different temperatures, with an in-plane assistive field $H_x$ of +30 Oe and −30 Oe, in accordance with an embodiment.

FIG. 18 shows anomalous Hall effect (AHE) curves 1802 for the Hall bar device 1702 of FIG. 17 as a function of a perpendicular magnetic field $H_z$, with an applied alternating current of 200 µA and at different temperatures from 160 K to 300 K, in accordance with an embodiment. As shown in FIG. 18, the Hall bar device 1702 exhibits a well-defined PMA at a low temperature and a superparamagnetic behavior near room temperature with the coercivity ranging from 0 Oe to 25 Oe and the $R_{AHE}$ in the range of 6.8-11.7Ω. Further, FIG. 19 shows plots 1902, 1904 of a current-induced switching loop of the WTe$_2$ (5)/Ti (2)/CoFeB (1.5) Hall bar 1702 of FIG. 17 at different temperatures, with an in-plane assistive field $H_x$ of +30 Oe and −30 Oe, in accordance with an embodiment. In these measurements, an applied pulse current with a pulse width of 2 ms was used. As shown in FIG. 19, the switching loops corroborates well with the DL SOT-induced switching mechanism, with the switching polarity determined by both the current and $H_x$ directions. Additionally, the opposite switching polarity in WTe$_2$/Ti/CoFeB as compared to Pt/Co indicates a negative sign of the spin Hall angle in WTe$_2$, which is consistent with the results of SOT measurements (a skilled person in the art would appreciate that Pt has a positive spin Hall angle, and therefore an opposite switching polarity in WTe$_2$/Ti/CoFeB as compared to Pt/Co indicates a negative sign of the spin Hall angle in WTe$_2$). The switching current $I_{sw}$ of WTe$_2$ (5)/Ti (2)/CoFeB (1.5) at $H_x$=±30 Oe, defined as the current that switches 95% of the magnetization, is around 8 mA (3 mA) at 160 K (300 K), corresponding to a current density of 1.33×10$^7$ A/cm$^2$ (5×10$^6$ A/cm$^2$). At low temperatures (e.g. for 160K to 180K as shown), the switching is quite abrupt at the initial phase, but it becomes gradual at the final phase, indicating that the switching is dominated by DW nucleation and propagation/expansion from the nucleation sites. The DW-dominated switching mechanism becomes more apparent at an intermediate temperature (e.g. for 200 K to 220 K as shown), as manifested in the multiple-step switching. The irregular hysteresis loop suggests that the switching evolves from the DW-driven to the stochastic mode at around 240 K. This unique characteristic of the WTe$_2$ (5)/Ti (2)/CoFeB (1.5) heterostructure facilitates the demonstration of the spin-orbit torque magnetic field sensor at low temperature and the spin torque gated stochastic sensor at room temperature.

Experimental Demonstration of the Spin-Orbit Torque Magnetic Field Sensor

Figure 20A:
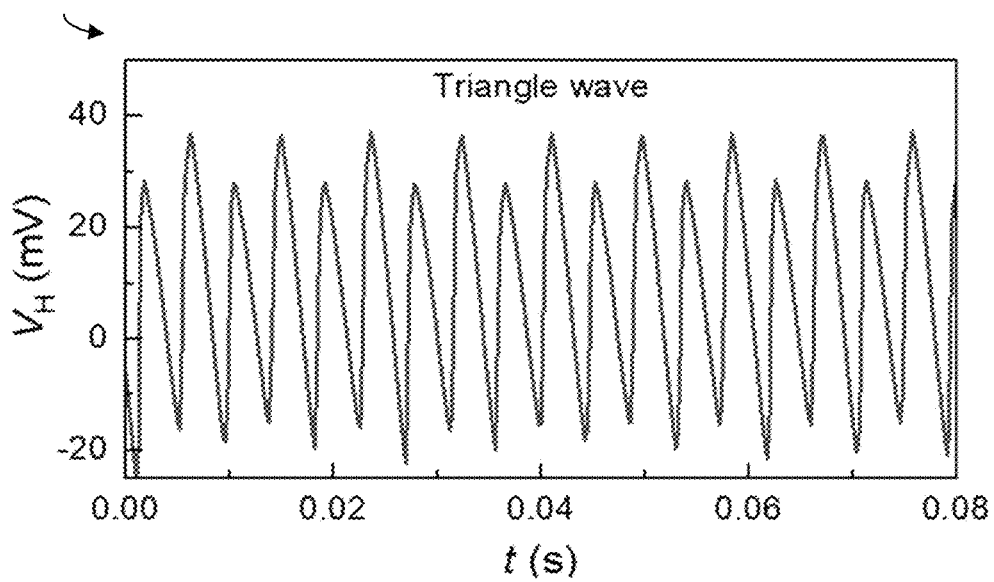
FIGS. 20A and 20B show plots of a Hall voltage $V_H$ of the Hall bar sensor of FIG. 17 as a function of time as captured by a data acquisition device (DAQ) in accordance with an embodiment, where
Figure 20B:
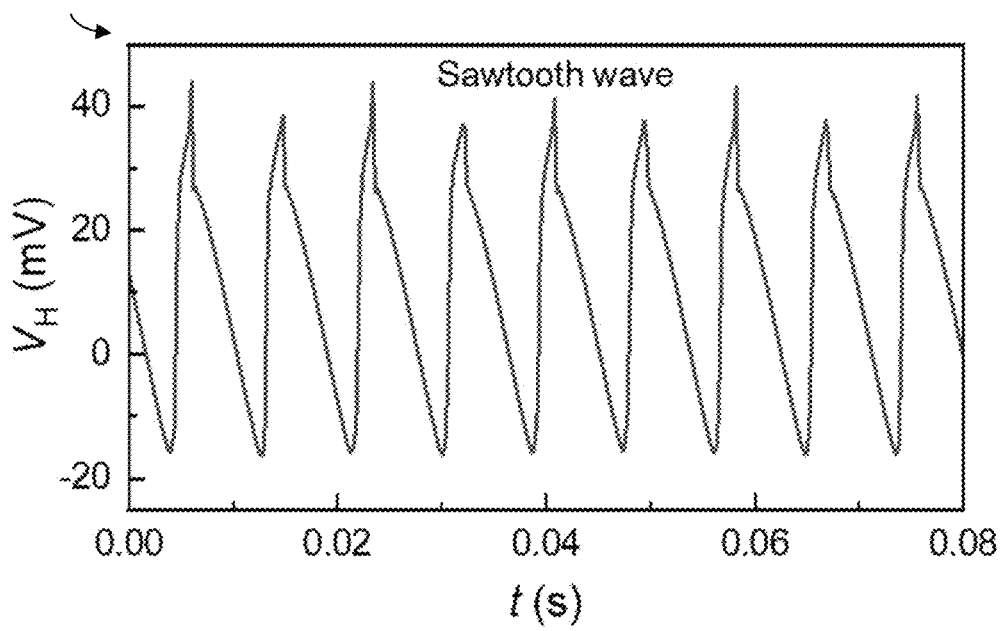

To demonstrate the proof-of-concept operation of the spin-orbit torque magnetic field sensor, an ac current with a triangle or a sawtooth waveform was applied with a frequency of 115 Hz to the Hall bar device 1702 at 160 K. The time average Hall voltage was then measured as a function of the in-plane magnetic field $H_x$. FIGS. 20A and 20B show plots 2002, 2004 of a Hall voltage $V_H$ of the Hall bar sensor 1702 of FIG. 17 as a function of time as captured by the data acquisition device (DAQ) in accordance with an embodiment, where FIG. 20A shows a plot 2002 of $V_H$ as a function of time for a triangle current wave and FIG. 20B shows a plot 2004 of $V_H$ as a function of time for a sawtooth current wave. The current amplitude used was 8 mA and the in-plane magnetic field applied $H_x$ was 100 Oe. As can be seen, the two figures resemble the simulated $V_H$–t curves previously shown at FIGS. 7B and 7C.

To achieve a good sensor performance, the amplitude of the applied ac current was set to 11.5 mA. The output voltage $V_{out}$ at each magnetic field is averaged over $1 \times 10^6$ sampling points for a duration of 1 s (corresponding to 115 cycles of an ac current wave).

Figure 21A:
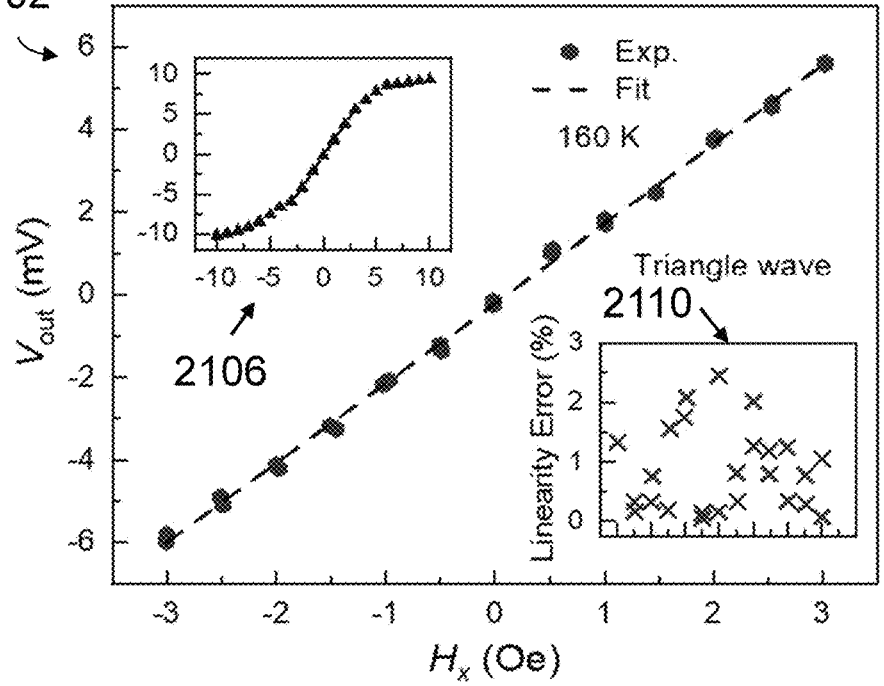
FIGS. 21A and 21B show plots of an output voltage $V_{out}$ of the Hall bar sensor of FIG. 17 as a function of an external in-plane magnetic field $H_x$ in accordance with an embodiment, where
Figure 21B:
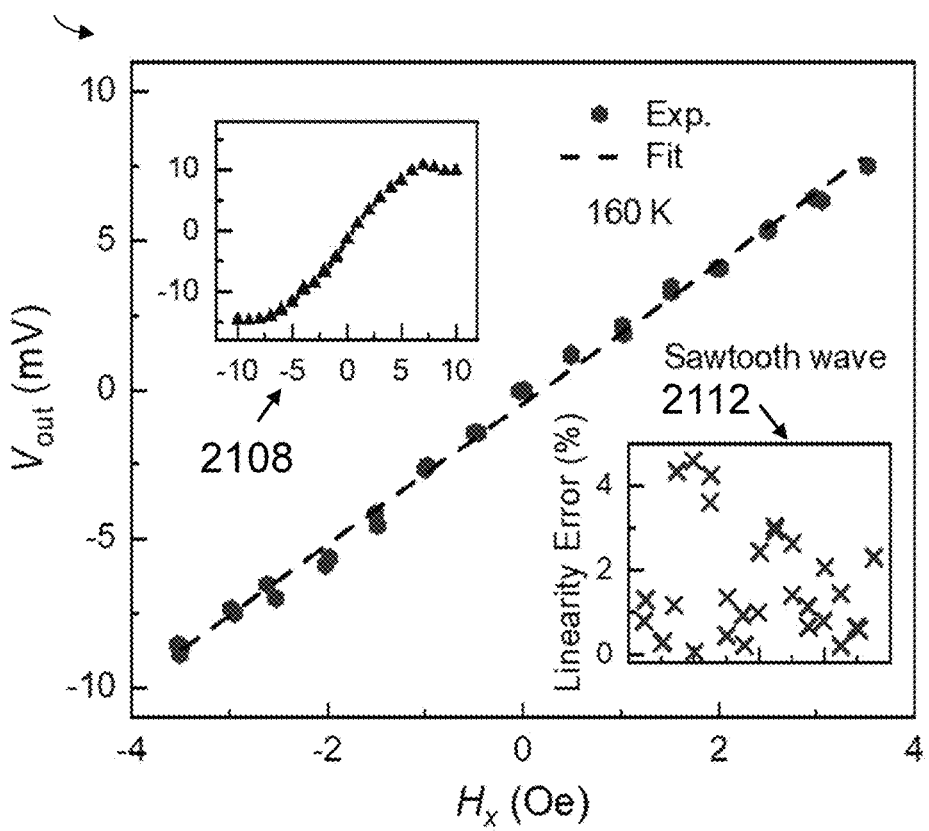

FIGS. 21A and 21B show plots 2102, 2104 of a time-averaged output voltage $V_{out}$ of the Hall bar magnetic field sensor 1702 of FIG. 17 as a function of an external in-plane magnetic field $H_x$, where FIG. 21A shows a plot 2102 of the time-averaged output voltage $V_{out}$ as driven by a triangle wave at 160 K with $H_x$ being swept forth and back between −3 Oe and 3 Oe and FIG. 21B shows a plot 2104 of the time-averaged output voltage $V_{out}$ as driven by a sawtooth wave at 160 K with $H_x$ being swept forth and back between −3.5 Oe and 3.5 Oe, in accordance with an embodiment. The dashed lines as shown in each of FIGS. 21A and 21B functions as a guide for the eye. For each of FIGS. 21A and 21B, the upper left inset 2106, 2108 shows the time-averaged output voltage $V_{out}$ response curve for a larger sweeping range of the in-plane magnetic field $H_x$, while the lower right inset 2110, 2112 shows a plot of linearity error within the sweeping magnetic field range of FIGS. 21A and 21B.

As shown in FIG. 21A, a linear response with <2.5% linearity error (as shown in the lower right inset 2110) is obtained. The plot 2102 in FIG. 21A also shows a sensitivity of 167.7 mΩ/Oe, with near zero dc offset and a negligible hysteresis. Referring to the upper left inset 2106 in FIG. 21A, a plot of $V_{out}$–$H_x$ is shown for a sweeping magnetic field range from −10 Oe to 10 Oe. It is worth pointing out that the data shown in FIG. 21A is raw data without any dc offset compensation. Both the zero dc offset and small hysteresis are unique features of the spin-torque magnetic field sensor despite the fact that the sensor element has a finite coercivity and that there is always a dc offset in the AHE signal due to a misalignment of the Hall voltage probes. Similar results were also obtained when a sawtooth wave is used as the driving current with an amplitude of 11.5 mA. This is shown in FIG. 21B. The plot 2104 in FIG. 21B shows a linear range for $V_{out}$ for an in-plane magnetic field range of ±3.5 Oe and a sensitivity of 205.5 mΩ/Oe, both of which are at similar corresponding levels as the triangle wave case.

Current-Induced Switching at Temperatures Higher than 280 K

Figure 22:
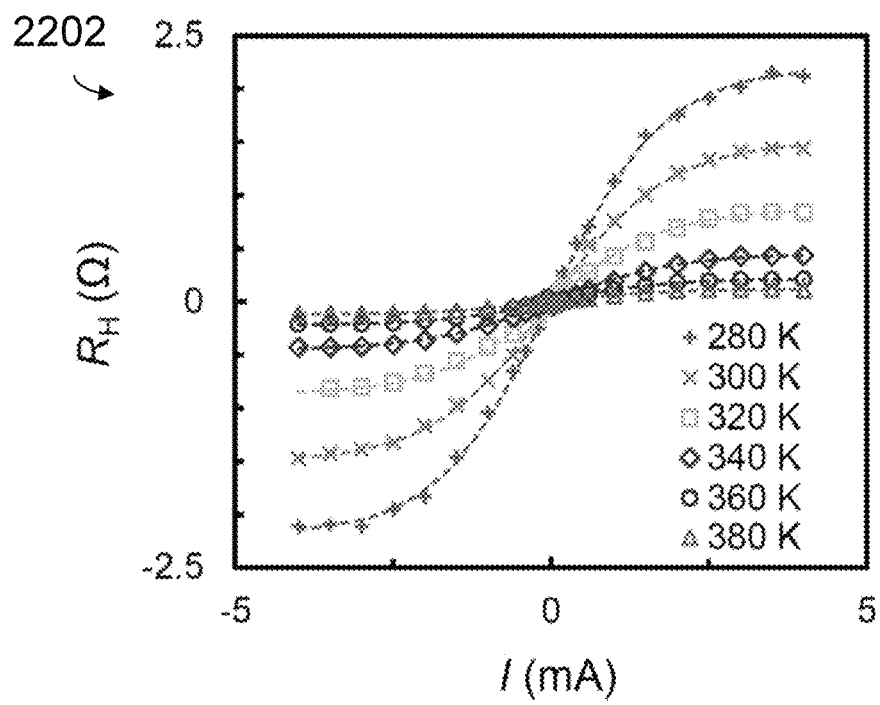
FIG. 22 shows plots of a Hall resistance $R_H$ as a function of an applied alternating current for different temperatures, with an applied external in-plane magnetic field $H_x$ fixed at 20 Oe, in accordance with an embodiment.

FIG. 22 shows plots 2202 of a Hall resistance $R_H$ as a function of an applied alternating current for different temperatures ranging from 280 K to 380 K, with an applied external in-plane magnetic field $H_X$ fixed at +20 Oe, in accordance with an embodiment. As shown in FIG. 22, the $R_H$–I curves show a sigmoidal behavior within this temperature range and can be well fitted by the hyperbolic tangent function (shown as dashed lines in FIG. 22):

$$R_H = R_{AHE} \tanh \frac{I}{I_C}, \qquad (38)$$

where $I_C$ is defined as the critical current after which the $R_H$ starts to saturate. From the fittings, $R_{AHE}$ and $I_C$ are extracted and plotted against the temperature. This is shown in FIG. 23.

Figure 23:
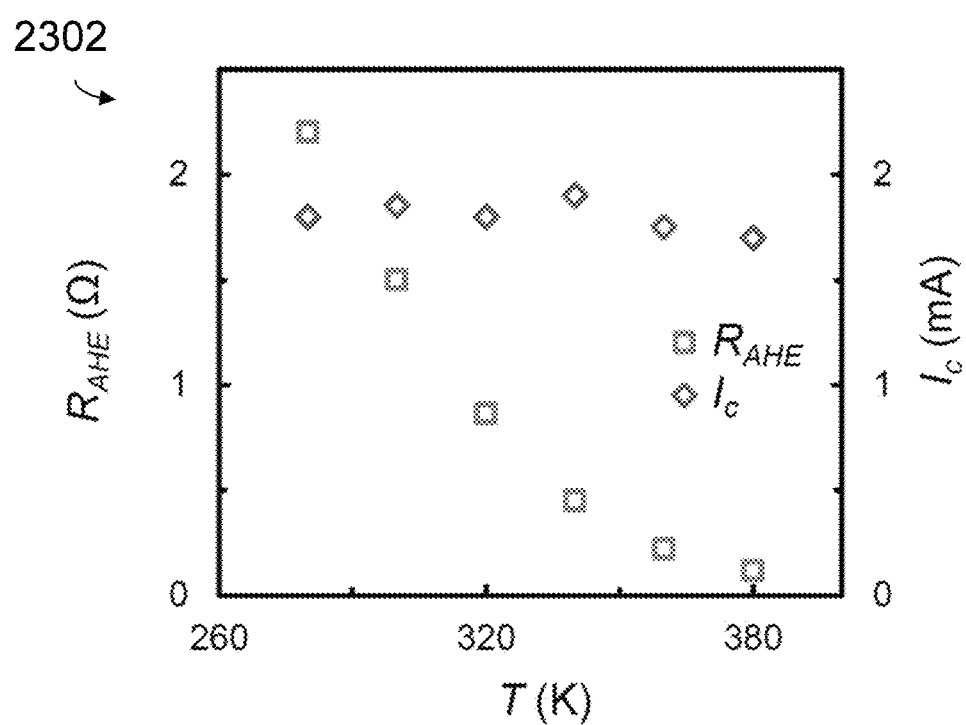
FIG. 23 shows plots of an anomalous Hall resistance $R_{AHE}$ and a critical current $I_C$ extracted from the plots of FIG. 22 as a function of the temperature T, in accordance with an embodiment.

FIG. 23 shows plots 2302 of an anomalous Hall resistance $R_{AHE}$ (square data points) and a critical current $I_C$ (diamond data points) extracted from the plots 2202 of FIG. 22 as a function of the temperature T, in accordance with an embodiment. As shown in FIG. 23, $R_{AHE}$ keeps decreasing as the temperature increases due to the reduction of saturation magnetization and the weakened PMA, while $I_C$ does not change much with temperature and maintains at a level around 1.75 mA. This current-induced switching behavior is similar to that of a probabilistic bit (p-bit) used in conventional computing. However, due to the large device size of the Hall bar device 1702 used in the present experiments, the output is already averaged over multiple domains with random states, and it is difficult to obtain a stochastic output as a function of time using the current device. Further study may be needed to obtain a stochastic output, perhaps in smaller devices.

Next, the performance of the spin-orbit torque magnetic field sensor 1702 is investigated for room temperature (i.e. about 300 K). As shown earlier in FIG. 18, the hysteresis of this sample almost disappears when T>260 K, though the sample still shows PMA. Since the lateral size of the active element of the sensor is 15 μm×5 μm (width of the Hall bar x width of the voltage electrode), it may be reasonable to postulate that there are a finite number of superparamagnetic elements inside the region which contribute to the AHE signal. If the dispersion of effective anisotropy is not that large, the overall $M_z$ dependence on temperature should still follow the $M_z=M_s$ tanh $$M_z = M_s \, \tanh \frac{M_s H_z V}{k_B T}$$

relation. The $R_H$–I curves at 300 K can be well fitted using the hyperbolic tangent function $R_H = R_{AHE} \tanh I/I_C$. Therefore, the same WTe$_2$ (5)/Ti (2)/CoFeB (1.5) device can be used as the proposed spin torque gated stochastic sensor (see above in relation to Case 3) at a temperature of 300 K.

Figure 24:
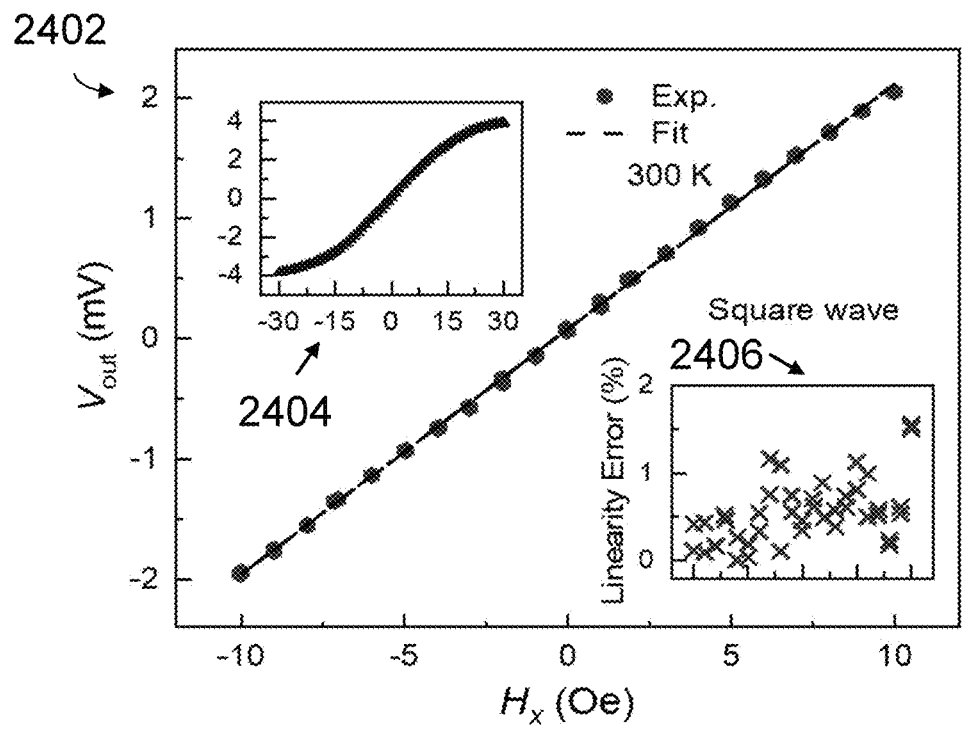
FIG. 24 shows a plot of an output voltage $V_{out}$ of the Hall bar sensor of FIG. 17 as a function of an external in-plane magnetic field $H_x$ at a temperature of 300K, where the sensor was driven by a square current wave, in accordance with an embodiment.
Figure 25:
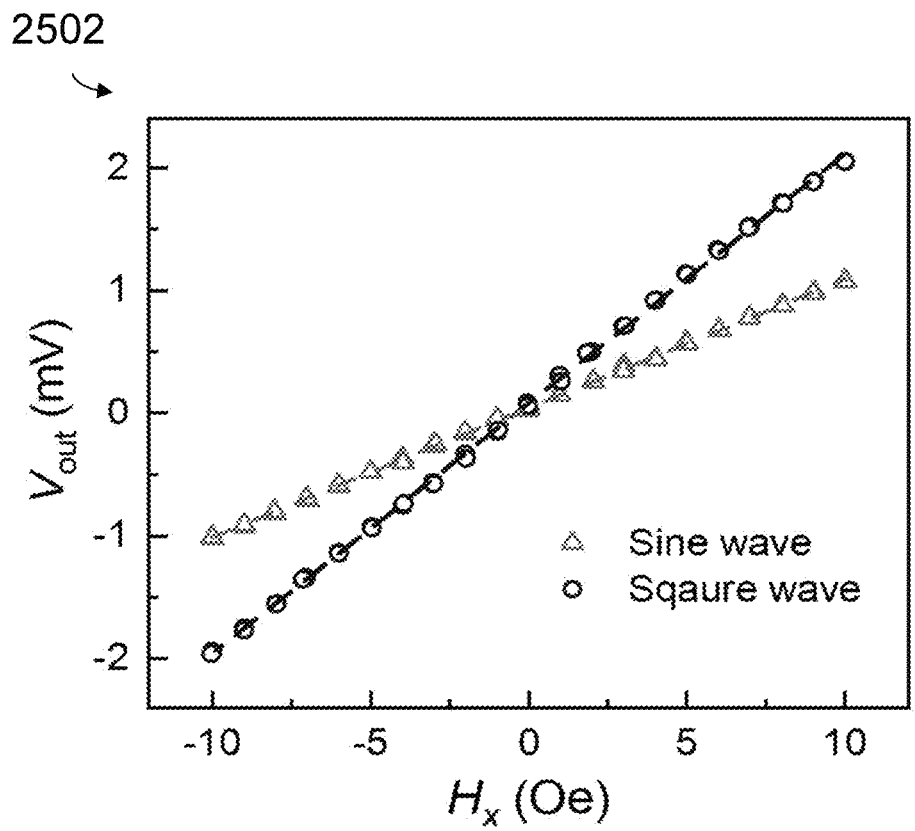
FIG. 25 shows plots of an output voltage $V_{out}$ of the Hall bar sensor of FIG. 17 as a function of an external in-plane magnetic field $H_x$, where the sensor was driven by a square current wave (square) and a sine current wave (triangle), in accordance with an embodiment.

Based on aforementioned discussion, in this case (i.e. Case 3) the amplitude of the ac current is not required to be larger than the critical current due to the absence of hysteresis. FIG. 24 shows a plot 2402 of an output voltage $V_{out}$ of the sensor 1702 of FIG. 17 as a function of an external in-plane magnetic field $H_x$ at a temperature of 300K, where the sensor was driven by a square current wave, in accordance with an embodiment. The dashed line serves as a guide for the eye. In this measurement, $H_x$ was swept back and forth between −10 Oe and 10 Oe, while a square ac current wave with an amplitude of 2 mA and frequency of 115 Hz was used. The upper left inset 2404 of FIG. 24 shows the output response curve in a larger sweeping range (−30 Oe to 30 Oe), which shows the saturation of the output signal at high field range. The linearity error within the field range of ±10 Oe is less than 2% as shown in the lower right inset 2406 of FIG. 24, indicating a good linearity of the sensor. The sensitivity of this device at room temperature is 102 mΩ/Oe. As a comparison, a sinusoidal/sine ac current wave was also used in the sensor 1702 of FIG. 17 with the external in-plane magnetic field $H_x$ being swept back and forth between −10 Oe and 10 Oe. FIG. 25 shows plots 2502 of an output voltage $V_{out}$ of the sensor 1702 of FIG. 17 as a function of an external in-plane magnetic field $H_x$, where the sensor 1702 was driven by a square current wave (square) and a sine current wave (triangle) at a temperature of 300K, in accordance with an embodiment. FIG. 25 shows that a linear response to $H_x$ can be achieved when the sensor 1702 is driven by a sine wave or a square wave. The amplitude of $V_{out}$ is twice of that of the sine wave case, which is consistent with the experimental results as shown above in relation to Equations (31) and (33).

The Response of the Spin-Orbit Torque Magnetic Field Sensor with Smaller Field Steps The results of sensor response shown in FIGS. 21A, 21B, 24 and 25 were measured in the VersaLab PPMS system, in which the field step below 0.5 Oe is difficult to achieve.

The spin-orbit torque magnetic field sensor 1702 can detect lower magnetic field because the switching will still occur with a very small in-plane assisting field when the applied current is sufficiently large. This small field will increase the probability of switching towards one direction, leading to a non-zero sensor output. Therefore, the sensor response with a smaller field step was measured.

Figure 26:
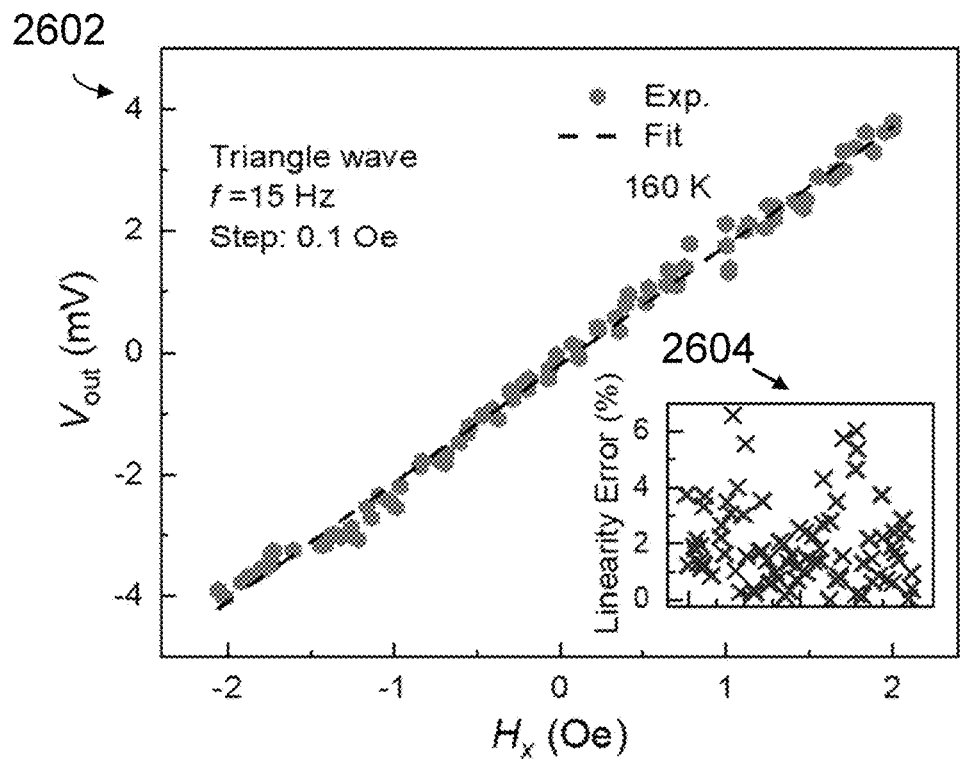
FIG. 26 shows a plot of an output voltage $V_{out}$ of the Hall bar sensor of FIG. 17 as a function of an external in-plane magnetic field $H_x$ at a temperature of 160 K, where the sensor was driven by a triangle wave current at a frequency of 15 Hz, in accordance with an embodiment.

FIG. 26 shows a plot 2602 of an output voltage $V_{out}$ of the sensor 1702 of FIG. 17 as a function of an external in-plane magnetic field $H_x$ at a temperature of 160 K, where the sensor 1702 was driven by a triangular wave current at a frequency of 15 Hz, in accordance with an embodiment. For this plot 2602 of FIG. 26, the in-plane magnetic field $H_x$ was swept back and forth between −2 Oe and 2 Oe with a step of 0.1 Oe. As shown in FIG. 26, though the actual field step is not constantly 0.1 Oe (due to equipment accuracy), the linearity error (shown in the inset 2604 of FIG. 26) is mostly within 5% except for a few points. For Case 3, due to the superparamagnetic property, the minimum magnetic field that can be detected by the sensor would be much smaller than that of Case 2. Therefore, the sensor response was measured using a Helmholtz coil which allows a magnetic field step to be as small as nT.

Figure 27:
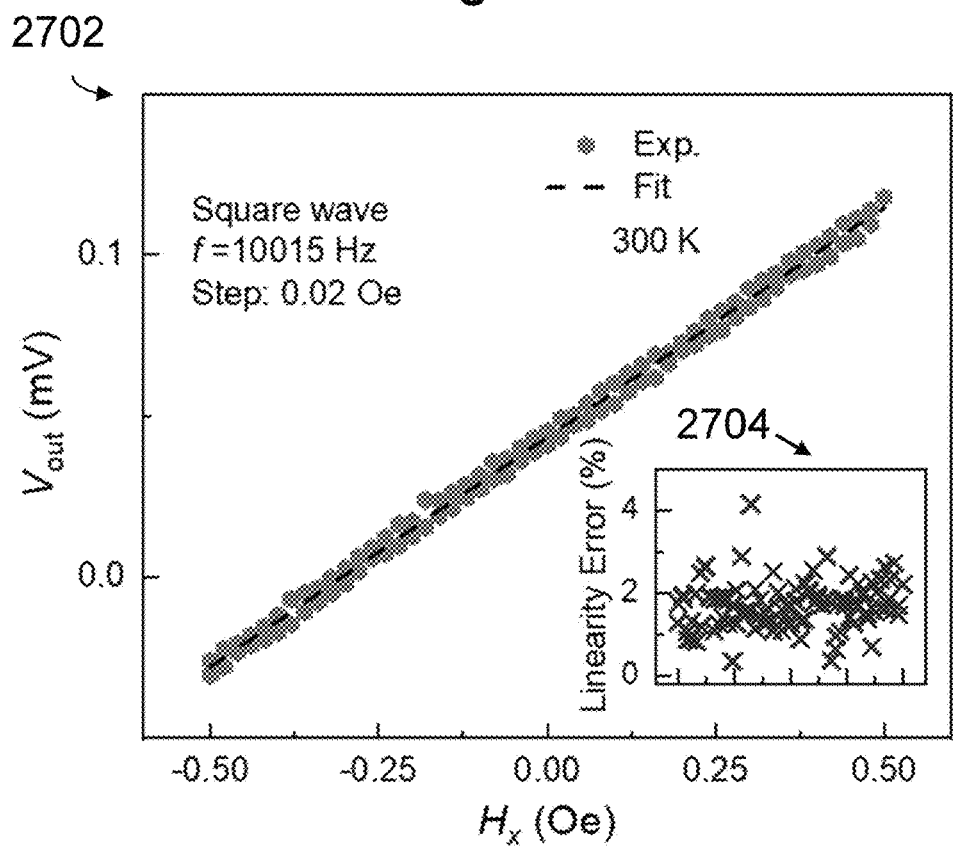
FIG. 27 shows a plot of an output voltage $V_{out}$ of the Hall bar sensor of FIG. 17 as a function of an external in-plane magnetic field $H_x$ at a temperature of 300 K, where the sensor was driven by a square current wave at a frequency of 10015 Hz, in accordance with an embodiment.

FIG. 27 shows a plot 2702 of an output voltage $V_{out}$ of the sensor 1702 of FIG. 17 as a function of an external in-plane magnetic field $H_x$ at a temperature of 300 K, where the sensor 1702 was driven by a square current wave at a frequency of 10015 Hz, in accordance with an embodiment. For this plot 2702 of FIG. 27, the in-plane magnetic field $H_x$ was swept back and forth between −0.5 Oe and 0.5 Oe with a step of 0.02 Oe. The inset 2704 of FIG. 27 shows the linearity error for the same magnetic field range, with a maximum linearity error of 4.1%. Further decreasing the magnetic field step resulted in a linearity error larger than 5%. Therefore, if one is mainly concerned about linearity of the sensor, the minimum field that can be detected by this particular sensor 1702 is around 0.02 Oe.

Based on a linearity error of less than 5%, the minimum detectable field for this sensor is therefore 0.1 Oe at 160 K and 0.02 Oe at 300 K. This, however, is not the minimum detectable field of a spin-orbit torque magnetic field sensor in principle. It is noted that the field resolution of the sensor can be further improved by averaging more cycles via increasing the sampling duration or employing a DAQ device with higher sampling rate. The detectivity of the spin-orbit torque magnetic field sensor at 300 K can be estimated based on the 1/f magnetic noise. The power density of the 1/f noise is given by $$S_V = \frac{\delta_H V_b^2}{N_c \cdot Vol \cdot f},$$

where $\delta_H$ is the Hooge constant, $V_b$ is the voltage across the Hall cross area, $N_c$ is the free electron density, Vol is the effective volume of the FM layer, and f is the frequency. By using the Hooge constant of $\delta_H$=0.002 obtained experimentally, and substituting $V_b$=0.332 V, $N_c$=1.7×10$^{29}$ m$^{-3}$, Vol=1.125×10$^{-19}$ m$^3$, and f=10015 Hz into the above equation, the detectivity of this spin-orbit torque magnetic field sensor at 300 K can be estimated to be around 0.92 nT/$\sqrt{Hz}$.

Another approach to improve a sensitivity or detectivity of a spin-orbit torque magnetic field sensor is to replace the AHE-based signal readout of the sensor by a magnetic tunnel junction. In this case, the FM layer from which the AHE was derived will function as the free layer of a magnetic tunnel junction. The output voltage of the magnetic tunnel junction will be compared with a reference voltage to generate a bipolar pulsed signal which resembles the AHE signal, but with a much larger amplitude. The signal amplitude can be increased by at least 1-2 orders, and therefore a significant improvement of the field detectivity can be achieved. Although the stray field from the fixed layer in out-of-plane direction may slightly reduce sensor sensitivity as will be discussed below, it can be mitigated by suppressing the stray field via structure optimization.

Frequency Dependence of the Spin-Orbit Torque Magnetic Field Sensor Performance

Since the sensor is driven by an ac current, it is instructive to estimate its frequency-dependence. First, there should be an optimum frequency range for the driving current. This is because, on one hand, the increased frequency will result in an increased switching current due to a reduced duration at each current cycle, while on the other hand, a minimum number of cycles is needed to reduce the noise of the output signal, which sets a lower limit for the driving current frequency. Pertaining to the present experiment, the minimum frequency is limited by the sampling duration of the DAQ device, i.e., the frequency which allows the DAQ device to average at least 10 current cycles. This means that if the sampling duration is 1 s, the lowest frequency will be 10 Hz. The sensor response was first measured using a current frequency range of 15 Hz to 10015 Hz at 160 K (i.e. Case 2). The minimum frequency of 15 Hz is selected to guarantee a reasonable number of cycles for averaging within the sampling duration.

Figure 28A:
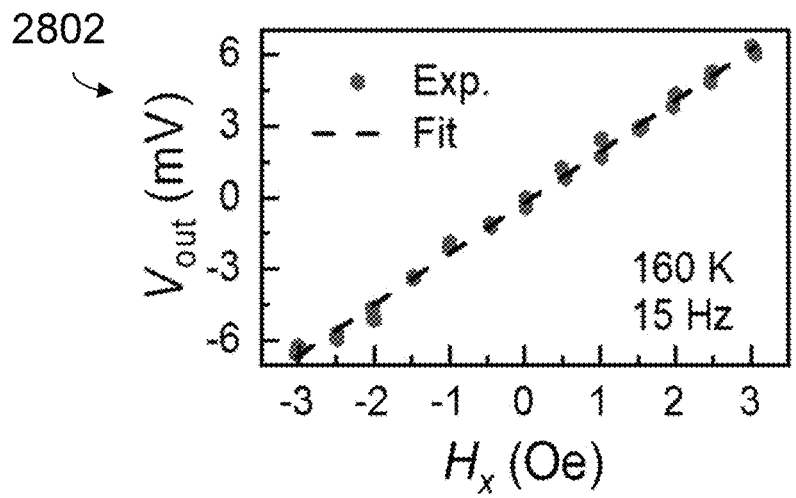
FIGS. 28A, 28B and 28C show plots of an output voltages $V_{out}$ as a function of an applied external in-plane magnetic field $H_x$ measured at a temperature of 160 K for different applied alternating current frequencies in accordance with an embodiment, where
Figure 28B:
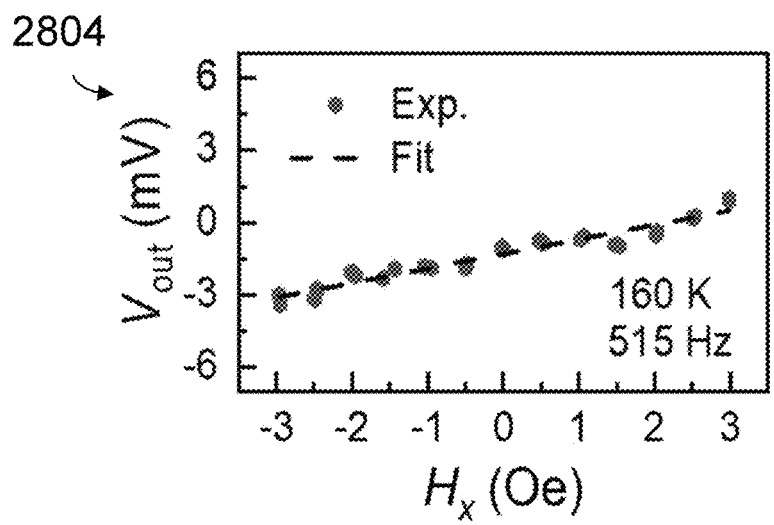
Figure 28C:
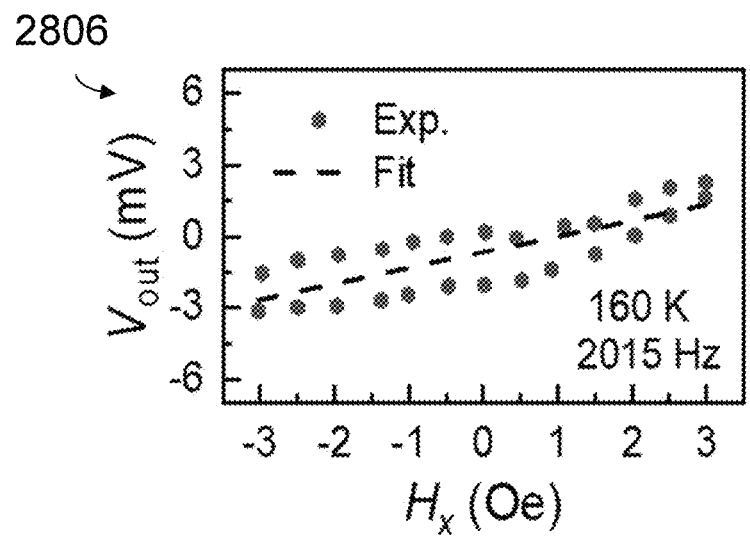

FIGS. 28A, 28B and 28C show plots 2802, 2804, 2806 of an output voltage $V_{out}$ as a function of an applied external in-plane magnetic field $H_x$ measured at a temperature of 160 K for different applied alternating current frequencies in accordance with an embodiment, where FIG. 28A shows a plot 2802 of $V_{out}$ as a function of $H_x$ for an applied alternating current frequency of 15 Hz, FIG. 28B shows a plot 2804 of $V_{out}$ as a function of $H_z$ for an applied alternating current frequency of 515 Hz and FIG. 28C shows a plot 2806 of $V_{out}$ as a function of $H_x$ for an applied alternating current frequency of 2015 Hz. The current amplitude was fixed at 11.5 mA, and the in-plane magnetic field was swept back and forth between −3 Oe and 3 Oe. Dashed lines are included in each of these plots 2802, 2804, 2806 as guides for the eye. As can be observed from FIGS. 28A, 28B and 28C, the linearity of $V_{out}$ degrades as the frequency increases. In addition, there is a large hysteresis observed in FIG. 28C where an ac current frequency of 2015 Hz was used. The current frequency therefore has an evident effect on the sensor performance. The degradation of the linearity at higher frequency can be explained by an incomplete switching due to a decreased duration at each current cycle, which is similar to the pulse width effect on current-induced switching, i.e., a smaller pulse width will lead to a larger switching current. Therefore, for practical applications, one may have to optimize the current amplitude and frequency concurrently.

Turning to Case 3), since the amplitude of the ac current is not required to be larger than the critical current due to the absence of hysteresis, the sensor performance may not be degraded as much as the previous case (i.e. Case 2) as discussed above) at high current frequency. To confirm this, measurements at 300 K were performed using different current frequencies ranging from 15 Hz to 80015 Hz (note that the highest current frequency of Keithley 6221 is 100 kHz) in a Helmholtz coil, with a magnetic field range of −5 Oe to 5 Oe and a magnetic field step of 0.2 Oe.

Figure 29A:
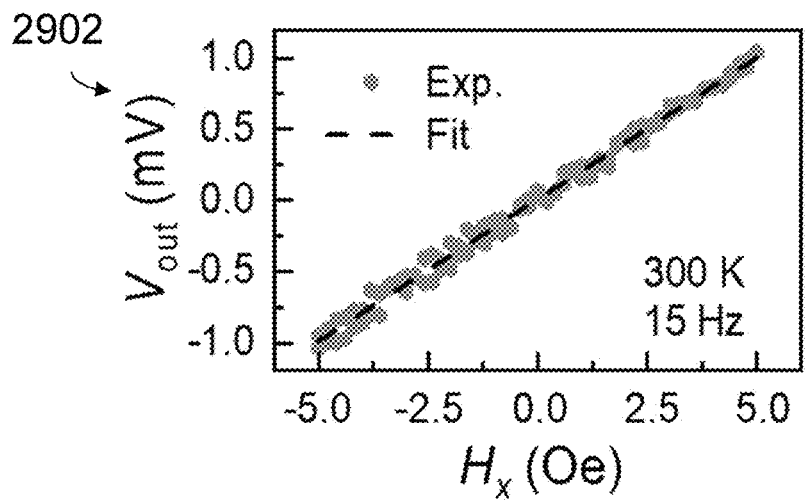
FIGS. 29A, 29B and 29C show plots of output voltages $V_{out}$ as a function of an applied external in-plane magnetic field $H_x$ measured at a temperature of 300 K for different applied alternating current frequencies in accordance with an embodiment, where
Figure 29B:
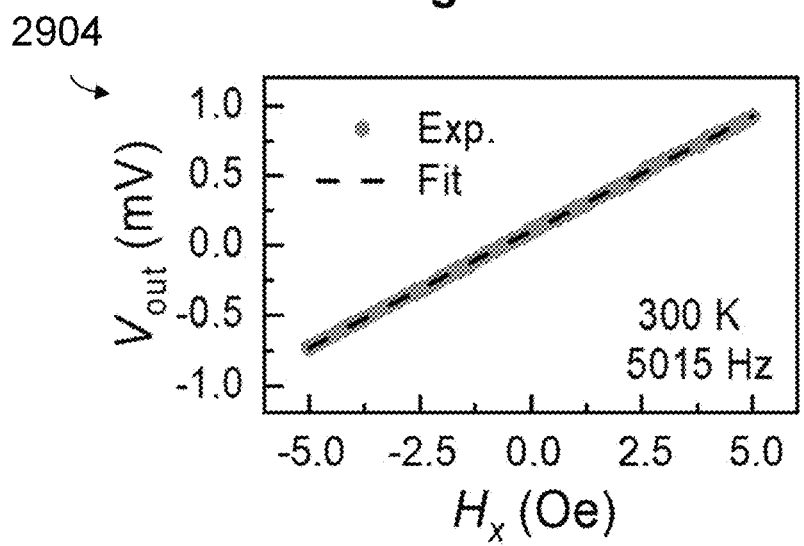
Figure 29C:
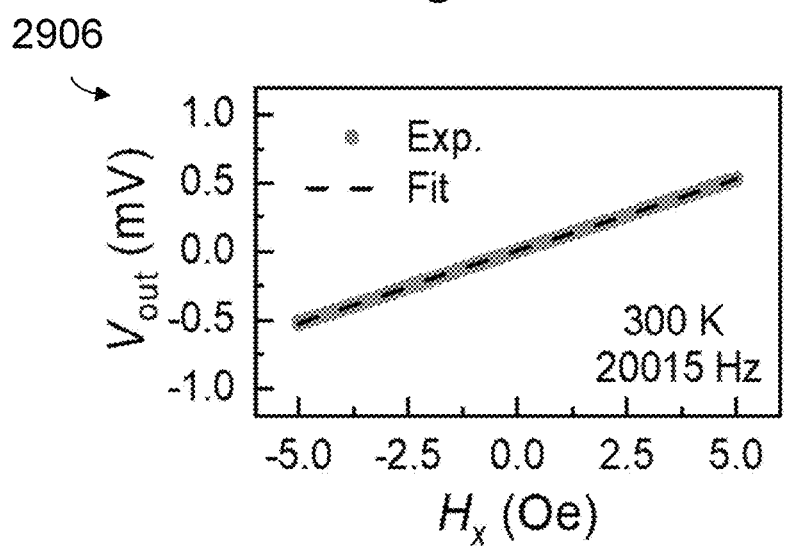

FIGS. 29A, 29B and 29C show plots 2902, 2904, 2906 of output voltages $V_{out}$ as a function of an applied external in-plane magnetic field $H_x$ measured at a temperature of 300 K for different applied alternating current frequencies in accordance with an embodiment, where FIG. 29A shows a plot 2902 of $V_{out}$ as a function of $H_x$ for an applied alternating current frequency of 15 Hz, FIG. 29B shows a plot 2904 of $V_{out}$ as a function of $H_x$ for an applied alternating current frequency of 5015 Hz and FIG. 29C shows a plot 2906 of $V_{out}$ as a function of $H_x$ for an applied alternating current frequency of 20015 Hz. The current amplitude for each of these plots was fixed at 2 mA. Dashed lines are included in each of these plots 2902, 2904, 2906 as guides for the eye. As shown in FIGS. 29A, 29B and 29C, in contrast to Case 2) as observed in relation to FIGS. 29A to 29C, the sensor response in this case shows a good linearity for all of the three current frequencies. In addition, it can be noticed that both the linearity error and the sensitivity decrease with increasing current frequency.

Figure 30:
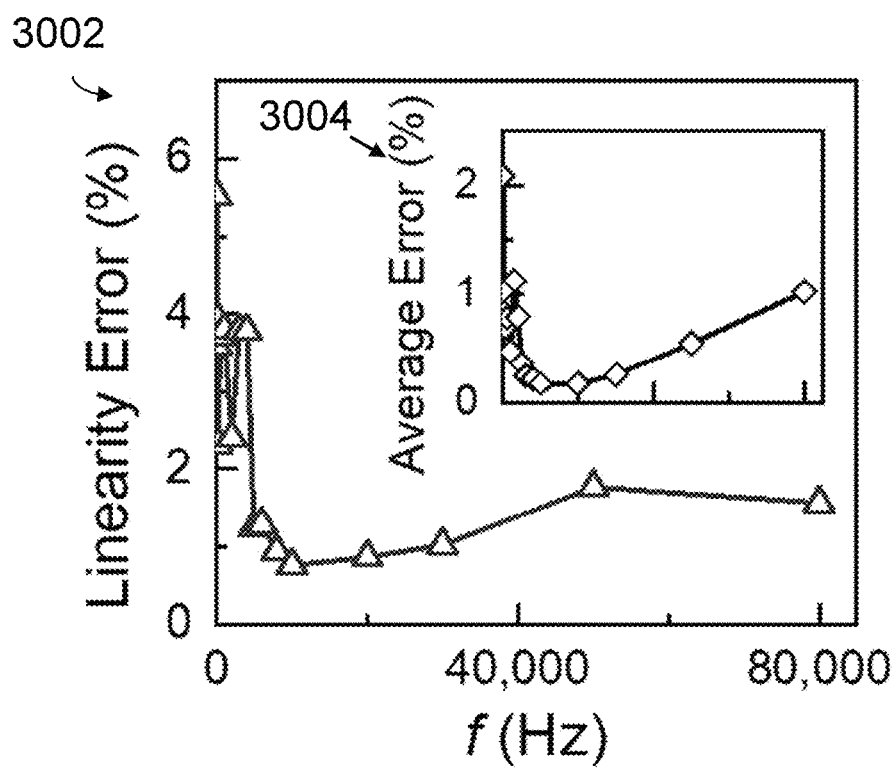
FIG. 30 shows plots of a maximum and an average (inset) linearity error as a function of an applied alternating current frequency in accordance with an embodiment.
Figure 31:
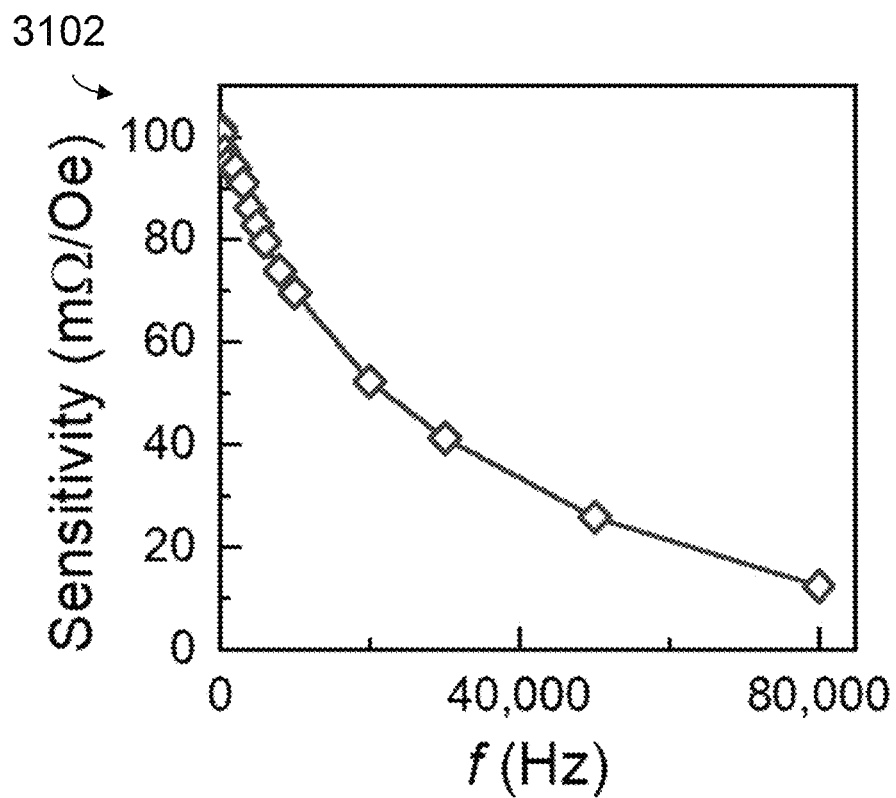
FIG. 31 shows a plot of sensitivity of the Hall bar spin-orbit torque magnetic sensor of FIG. 17 as a function of an applied alternating current frequency at a temperature of 300 K in accordance with an embodiment.

FIG. 30 shows plots 3002 of a maximum and an average (inset 3004) linearity error as a function of an applied alternating current frequency, while FIG. 31 shows a plot 3102 of sensitivity of the spin-orbit torque magnetic sensor 1702 of FIG. 17 as a function of an applied alternating current frequency in accordance with an embodiment. These data were measured at a temperature of 300 K using an alternating current frequency ranging from 15 Hz to 80015 Hz. As shown in FIGS. 30 and 31, it can be observed that the linearity error and average error overall decrease from 15 Hz to 10015 Hz, reaching a very low level at 10015 Hz. After which, both the linearity error and average error experience a slight increase at a current frequency greater than 10015 Hz. On the other hand, the sensitivity keeps decreasing as the current frequency increases, which is due to an increase of switching current as discussed above. The decreased linearity error at high current frequency is because more cycles are averaged within the sampling duration. The slight increase of linearity error after 10015 Hz might be due to the constant decrease of output amplitude. Therefore, for Case 3), the sensor can be operated within a wider frequency range as compared to Case 2).

Next, the frequency limitation of the detected magnetic field is investigated. In principle, it is limited by both the sensor driving frequency and the DAQ sampling duration. Here, a few sets of measurement results are provided to illustrate the frequency effect of the detected magnetic field. The sensor response to an ac magnetic field supplied by the Helmholtz coil was measured at a temperature of 300 K. The magnetic field amplitude is fixed at 0.5 Oe, and the magnetic field frequency $f_H$ is varied from 0.1 Hz to 1 Hz. The current amplitude and frequency of the sensor driving current are 2 mA and 20015 Hz, respectively. The DAQ sampling duration is set as 0.1 s.

Figure 32A:
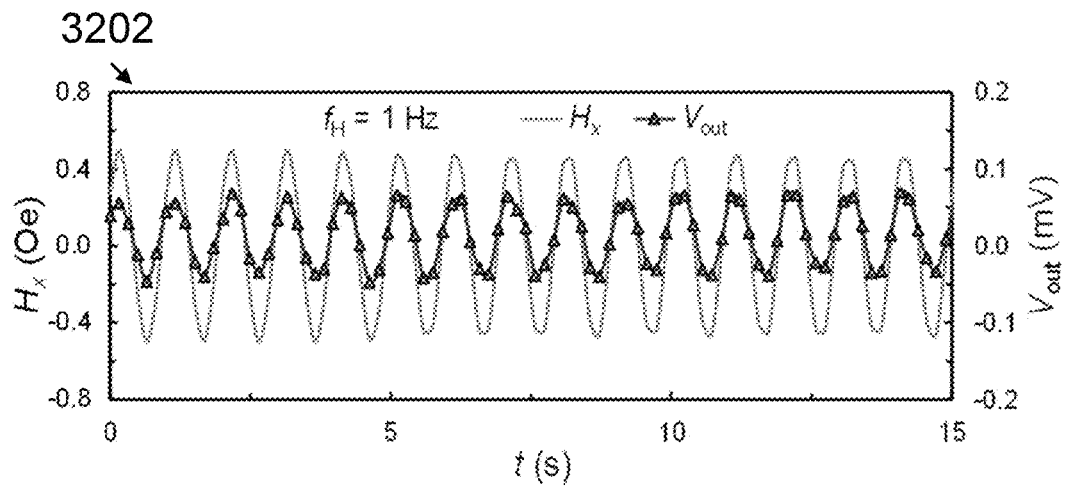
FIGS. 32A, 32B and 32C show plots of an output voltage $V_{out}$ and an applied in-plane magnetic field $H_x$ as a function of time t for different alternating magnetic field frequencies in accordance with an embodiment, where
Figure 32B:
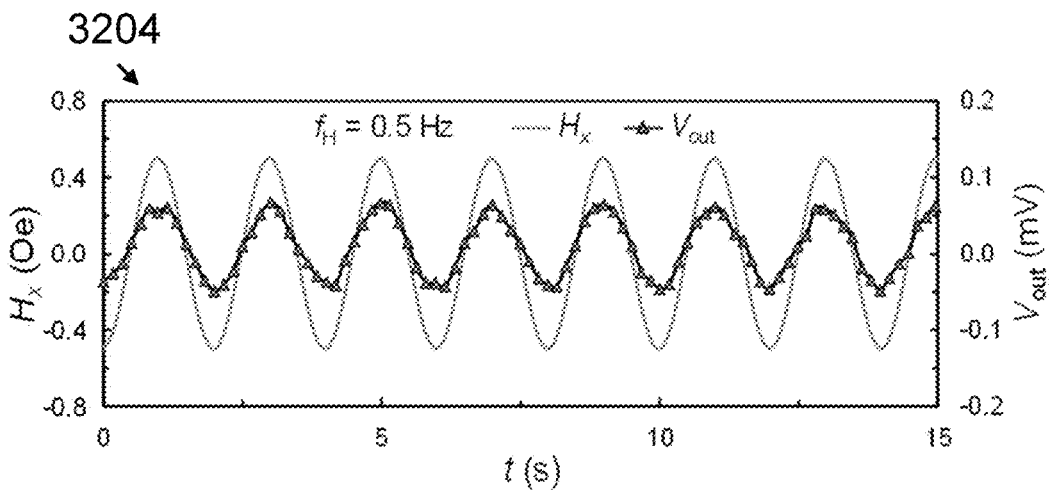
Figure 32C:
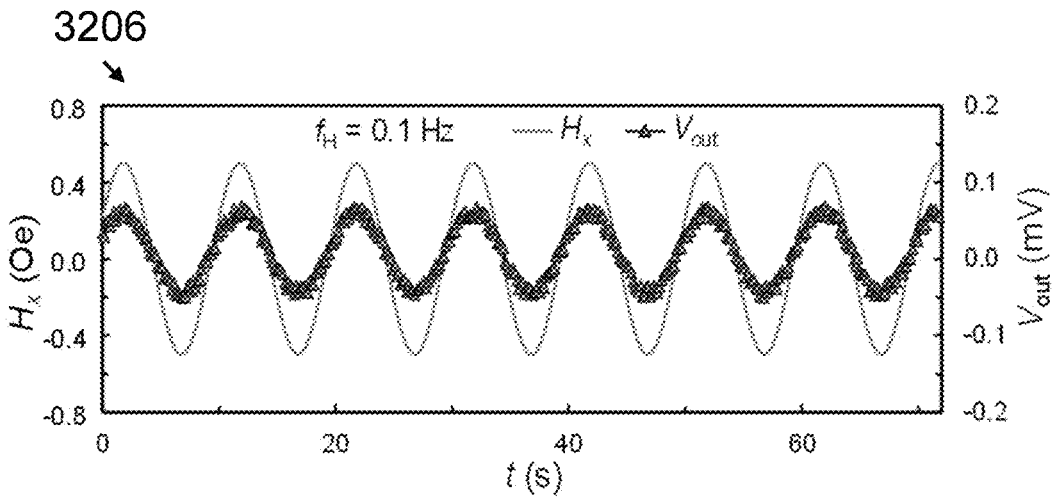

FIGS. 32A, 32B and 32C show plots 3202, 3204, 3206 of an output voltage $V_{out}$ and an applied in-plane magnetic field $H_x$ as a function of time t for different alternating magnetic field frequencies in accordance with an embodiment, where FIG. 32A shows a plot 3202 of $V_{out}$ and $H_x$ as a function of time t for an alternating magnetic field frequency $f_H$ of 1 Hz, FIG. 32B shows a plot 3204 of $V_{out}$ and $H_x$ as a function of time t for an alternating magnetic field frequency $f_H$ of 0.5 Hz and FIG. 32C shows a plot 3206 of $V_{out}$ and $H_x$ as a function of time t for an alternating magnetic field frequency $f_H$ of 0.1 Hz. The solid line in each of these Figures is the simulated magnetic field as a function of time based on the set frequency and amplitude. The black triangles are the measured output voltages. A phase offset has been added to the simulated magnetic field curve. As can be seen, the measured $V_{out}$ varies synchronously with the simulated magnetic field, indicating that the sensor can also be used to detect an ac magnetic field.

The Effect of Out-of-Plane Field Component on Sensor Performance

The effect of a vertical magnetic field component ($H_z$) (i.e. a magnetic field component with a direction perpendicular to the plane of the ferromagnetic layer of the sensor 1702 of FIG. 17) was investigated as it can also induce magnetization switching, in addition to the DL SOT field. The presence of any finite $H_z$ would result in the magnetization staying in the $H_z$ direction longer than that in the opposite direction for a periodic driving current, which seems to indicate that it will cause asymmetry in the signal response. However, this is not the case because the average signal caused by $H_z$ will be zero as current changes its polarity periodically. Therefore, the main effect of $H_z$ will be on the sensor's output voltage rather than a symmetry or cross-interference between $H_x$ and $H_z$. In the following, an applied ac current with a triangle waveform, an amplitude of 11.5 mA and a frequency of 115 Hz was used for measurements in relation to FIGS. 33, 34A and 34B, while an applied ac current with a square waveform, an amplitude of 2 mA and a frequency of 115 Hz was used for measurements in relation to FIGS. 35, 36A and 36B.

Figure 33:
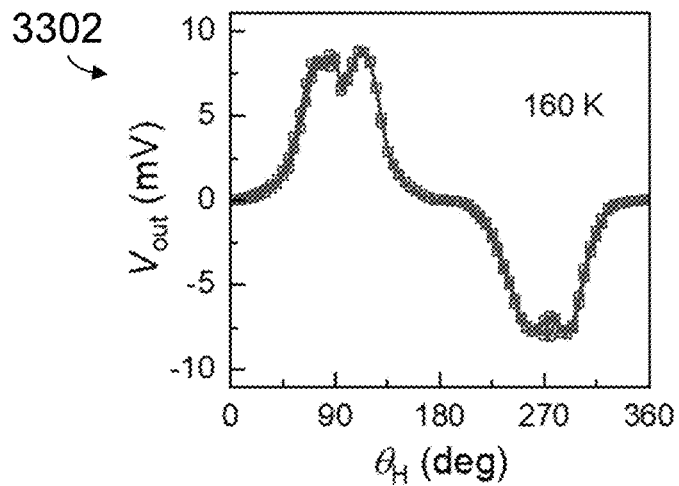
FIG. 33 shows a plot of an output voltage $V_{out}$ of the Hall bar sensor of FIG. 17 as a function of a magnetic field polar angle $\theta_H$ with a fixed applied magnetic field magnitude of 8 Oe and at a temperature of 160 K, in accordance with an embodiment.
Figure 35:
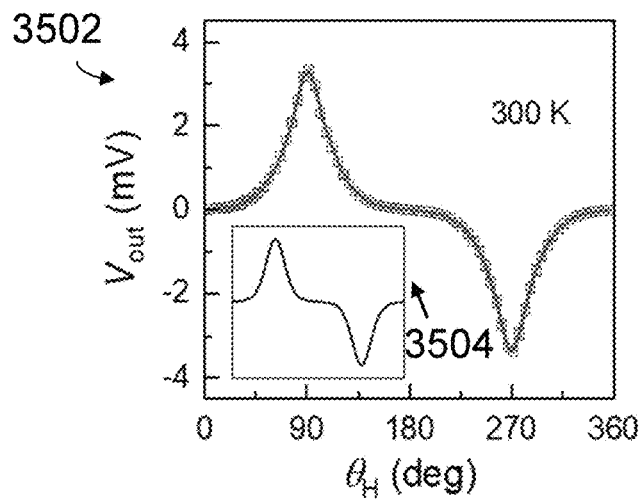
FIG. 35 shows a plot of an output voltage $V_{out}$ of the Hall bar sensor of FIG. 17 as a function of a magnetic field polar angle $\theta_H$ with a fixed applied magnetic field magnitude of 20 Oe and at a temperature of 300 K in accordance with an embodiment.

The angular dependence of the sensor performance is examined for both Case 2) and Case 3). FIGS. 33 and 35 show the output voltage of the sensor 1702 as a function of magnetic field polar angle $\theta_H$ at 160 K (i.e. Case 2) and at 300 K (i.e. Case 3), respectively. The polar angle $\theta_H$ is measured with respect to the perpendicular axis z (see e.g. FIG. 17), and in the present case, $\theta_H$ of 90° and 270° corresponds to the direction along +x and −x, respectively. For FIG. 33, the data were measured with a fixed applied magnetic field magnitude of 8 Oe and at a temperature of 160 K. As for FIG. 35, the data were measured with a fixed applied magnetic field magnitude of 20 Oe and at a temperature of 300 K. The inset 3504 of FIG. 35 shows a simulated $V_{out}$ as a function of $\theta_H$.

As shown in FIGS. 33 and 35, the sensor output amplitude has a strong dependence on $\theta_H$. At 160 K, the sensor output exhibits a broad minimum around $\theta_H=0°$ and 180° and a broad maximum around $\theta_H=90°$ and 270°, which is expected from its working principle. The former is due to the alignment of magnetizations along +z and −z directions, respectively, whereas the latter results from the hysteresis of the switching loop. In addition, there is also a dip at 90° and 270°, which might be caused by the multiple domains induced by the field when it was applied initially along z-direction. At 300 K, the angle dependence of output voltage is simpler without the plateau around 90° and 270° due to the absence of hysteresis, which can be well fitted by adding a z-component field in Equation (28), as shown in the inset 3504 of FIG. 35.

Figure 34A:
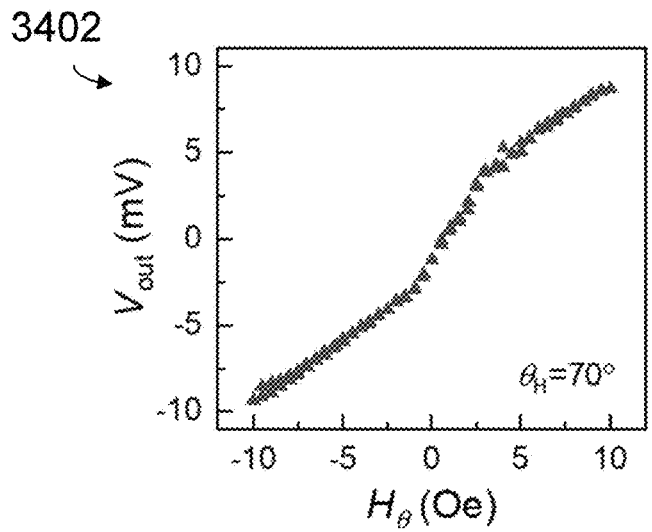
FIGS. 34A and 34B show plots of an output voltage $V_{out}$ of the Hall bar sensor of FIG. 17 as a function of a magnetic field $H_\theta$ measured at a temperature of 160 K at two different magnetic field polar angles $\theta_H$ in accordance with an embodiment, where
Figure 34B:
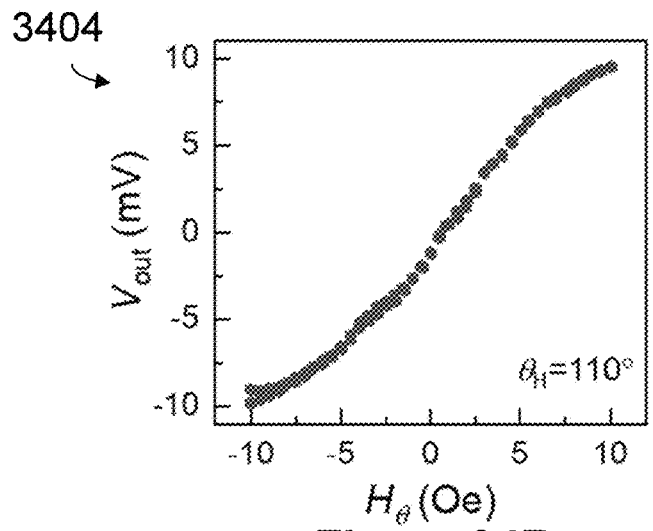

The sensor response to the applied field $H_\theta$ was also measured for different polar angles $\theta_H$. FIGS. 34A and 34B show plots 3402, 3404 of an output voltage $V_{out}$ of the sensor 1702 of FIG. 17 as a function of a magnetic field $H_\theta$ measured at a temperature of 160 K for two different magnetic field polar angles $\theta_H$ in accordance with an embodiment, where FIG. 34A shows a plot 3402 of $V_{out}$ as a function of $H_\theta$ measured at a magnetic field polar angle $\theta_H$ of 70° and FIG. 34B shows a plot 3404 of $V_{out}$ as a function of He measured at a magnetic field polar angle $\theta_H$ of 110°. To obtain the plots 3402, 3404, the magnetic field $H_\theta$ was swept back and forth between −10 Oe and 10 Oe. From FIGS. 34A and 34B, it can be observed that the output amplitude at $\theta_H$ of 70° and 110° is comparable and even slightly larger than that at $\theta_H$=90° as shown in FIG. 21A. However, the linearity range for these two magnetic field polar angles $\theta_H$ decreases as compared to that of $\theta_H$=90°. Further increasing an angle deviation from 90° (<70° or >110°) will result in evident reduction in the output voltage and the linearity of the magnetic field sensor.

Figure 36A:
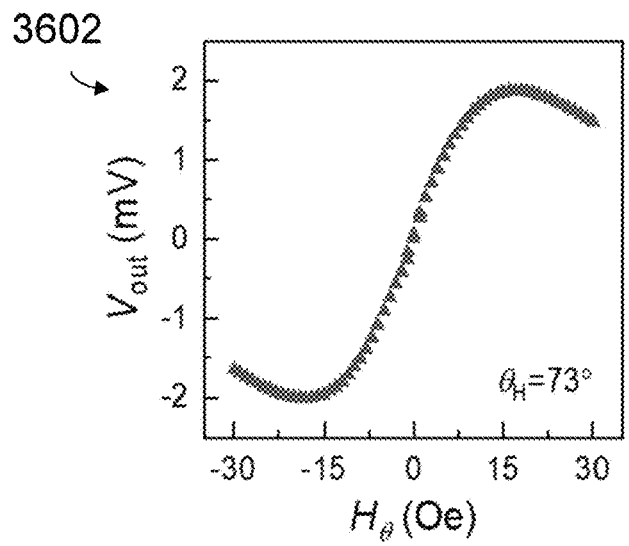
FIGS. 36A and 36B show plots of an output voltage $V_{out}$ of the Hall bar sensor of FIG. 17 as a function of a magnetic field $H_\theta$ measured at a temperature of 300 K at two different magnetic field polar angles $\theta_H$ in accordance with an embodiment, where
Figure 36B:
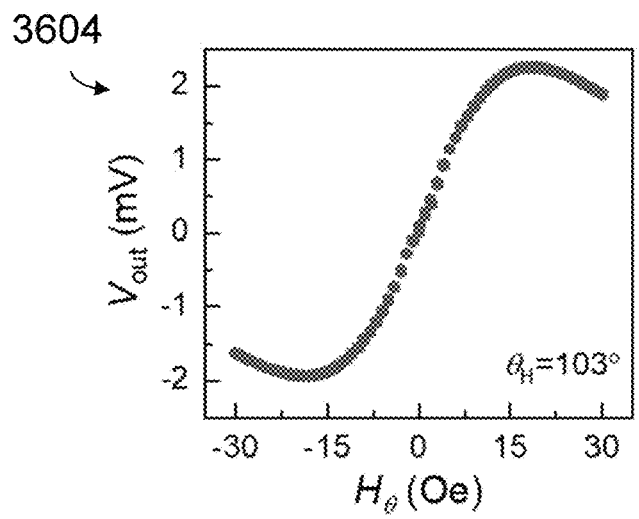

FIGS. 36A and 36B show plots 3602, 3604 of an output voltage $V_{out}$ of the sensor 1702 of FIG. 17 as a function of a magnetic field $H_\theta$ measured at a temperature of 300 K at two different magnetic field polar angles $\theta_H$ in accordance with an embodiment, where FIG. 36A shows a plot 3602 of $V_{out}$ as a function of $H_\theta$ measured at a temperature of 300 K at a magnetic field polar angle $\theta_H$ of 73° and FIG. 36B shows a plot 3604 of $V_{out}$ as a function of $H_\theta$ measured at a temperature of 300 K at a magnetic field polar angle $\theta_H$ of 103°. To obtain the plots 3602, 3604, the magnetic field $H_\theta$ was swept back and forth between −30 Oe and 30 Oe. For Case 3), as shown in FIGS. 36A and 36B, both the output amplitude and linearity range decrease as the polar angle $\theta_H$ deviates away from 90°. This feature of the spin-orbit torque magnetic field sensor can be advantageous in applications which require a good field directionality of the sensor.

Proof-of-Concept Application of STG Sensor in Angle Detection

Due to its simple structure, good linearity, and negligible offset and hysteresis, the spin-orbit torque magnetic field sensor is expected to have many potential applications. As one of the proof-of-concept experiments, its application in position sensing is discussed below. To this end, a rotational magnetic field of 20 Oe is applied in the x-y plane (c.f. FIG. 17) and the output of the sensor 1702 is measured using the same procedure as described above for every 5° of rotation. The magnetic field angle $\varphi_H$ is defined in the x-y plane with respect to the x-axis (i.e. $\varphi_H$=0° when the magnetic field is in the positive x-direction).

Figure 37:
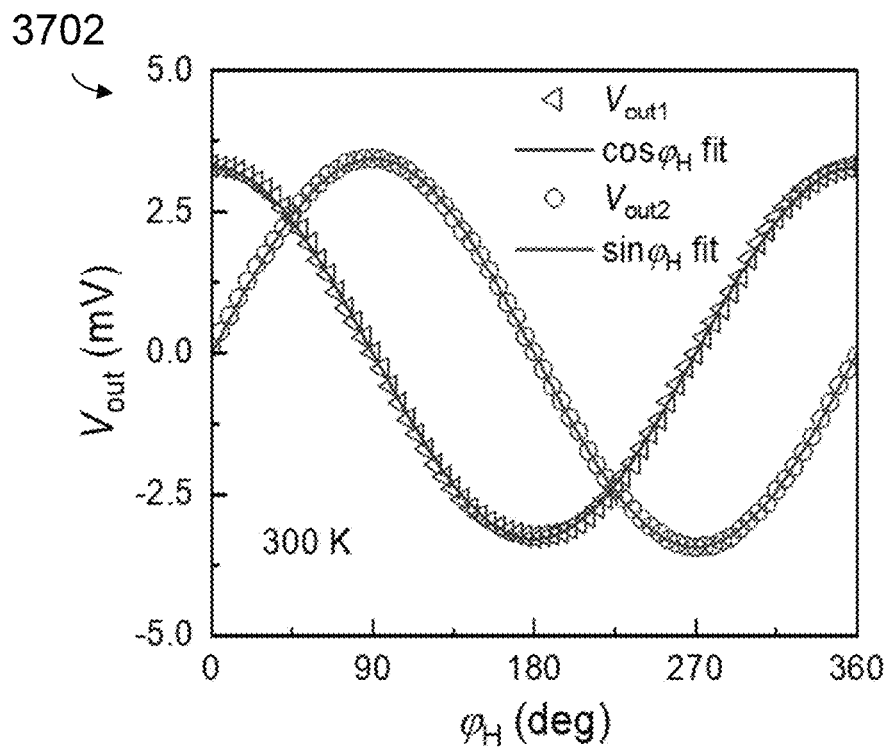
FIG. 37 shows a plot of output voltages $V_{out1}$ and $V_{out2}$ of the Hall bar sensor of FIG. 17 as a function of $\varphi_H$ measured using an applied external magnetic field of 20 Oe in accordance with an embodiment, where the output voltage $V_{out1}$ represents the output voltage of the sensor with its longitudinal direction aligned along the x direction and the output voltage $V_{out2}$ represents the output voltage of the sensor with its longitudinal direction aligned along the y direction.

FIG. 37 shows plots 3702 of output voltages $V_{out1}$ and $V_{out2}$ of the sensor 1702 of FIG. 17 as a function of $\varphi_H$ measured using an applied external magnetic field of 20 Oe in accordance with an embodiment. The output voltage $V_{out1}$ represents the output voltage of the sensor 1702 with its longitudinal direction aligned along the x direction, while the output voltage $V_{out2}$ represents the output voltage of the sensor 1702 with its longitudinal direction aligned along the y direction. The sensor 1702 was driven by a square wave with an amplitude of 2 mA and a frequency of 115 Hz. As can be seen, $V_{out1}$ and $V_{out2}$ have a cosine and a sine dependence on the field angle, respectively, which can be well fitted by $V_1 \cos \varphi_H$ and $V_2 \sin \varphi_H$, respectively, where $V_1$ and $V_2$ are the amplitude of $V_{out1}$ and $V_{out2}$. The field angle $\varphi$ can be calculated using the following equation:

$$\varphi = a\,crtan2\left[-\frac{V_{out2}}{V_2}, -\frac{V_{out1}}{V_1}\right] + \pi, \tag{39}$$

which is equivalent to $\varphi$=acrtan 2 [−sin $\varphi$, −cos $\varphi$]+π. Since the arctan 2 [sin $\varphi$, cos $\varphi$] function gives the angle $\varphi$ in the range from −180° to 180°, a phase shift π was added in the function to map the angle to obtain the range between 0° and 360°.

Figure 38:
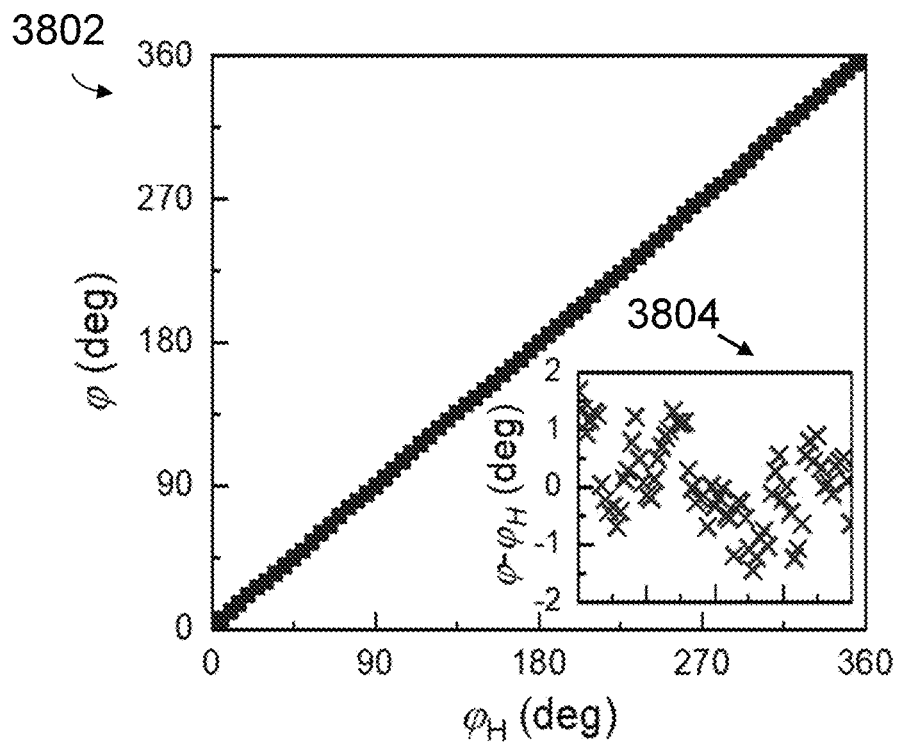
FIG. 38 shows a plot of a rotational angle $\varphi$ as a function of a magnetic field $\varphi_H$ in accordance with an embodiment, where the inset shows a plot of a calculated angle error $\varphi - \varphi_H$ for a range between 0° to 360°.

FIG. 38 shows a plot 3802 of a detected rotational angle $\varphi$ as a function of an actual magnetic field angle $\varphi_H$ for a range between 0° to 360° in accordance with an embodiment. As shown in FIG. 38, a linear relationship between $\varphi$ and $\varphi_H$ is observed. The calculated angle error ($\varphi$−$\varphi_H$) at each position is shown in the inset 3804 of FIG. 38. As shown by the inset 3804 of FIG. 38, the angle error is mostly within 1° except for a few positions, with an average and maximum value of 0.59° and 1.68°, respectively, indicating an accurate angle detection ability of the spin orbit-torque magnetic field sensor. Unlike magnetoresistance sensors which require an additional Hall sensor to differentiate an angle between 0-180° and 180-360° due to its quadratic dependence on the magnetic field angle, only two spin orbit-torque magnetic field sensors are required to resolve a full magnetic field rotation of 360°. Comparing with a SOT-enabled angular position sensor that senses second harmonic Hall voltage, the output voltage of the present spin-orbit torque magnetic field sensor is more than one order of magnitude larger, and in addition, it also does not suffer from any dc offset and/or influence from the planar Hall effect.

The above theoretical analysis and experimental results therefore demonstrate a spin-orbit torque magnetic field sensor that utilizes a longitudinal field dependence of the current-induced magnetization switching in FM/HM bilayers. Particularly, when driven by an ac current, an output voltage that is a time average of a time-varying anomalous Hall voltage can be obtained using the sensor. This output voltage, being an average over a large number of cycles, therefore reduces noise in the output. Further, the output response of the sensor is also linear with respect to the external magnetic field with negligible hysteresis. Any dc offset is also absent or can be removed from the output response.

As a proof-of-concept demonstration as shown in the above embodiments, a Hall bar device comprising a $WTe_2$/Ti/CoFeB heterostructure was used, where the sputtering deposited $WTe_2$ was employed as the SOT generator due to its large spin Hall angle. It should, however, be appreciated that the spin-orbit torque magnetic field sensor is not limited to including this $WTe_2$/Ti/CoFeB heterostructure, and other material systems or other material heterostructures can be used. The above analysis performed for Cases 1), 2) and 3) are also applicable for other magnetic systems (e.g. ferromagnetic or ferrimagnetic) with an effective PMA ($K_\perp^{eff}$). For example, a skilled person will appreciate that a variety of ferromagnetic material/heavy metal (FM/HM) bilayer combinations or ferrimagnetic material/heavy metal combinations can also be used as the magnetic layer 202 of the spin-orbit torque magnetic field sensor 102. Further, a single layer of FM or a single layer of ferrimagnetic material may also be used as the magnetic layer 102, as long as it has a perpendicular magnetic anisotropy (PMA) and a damping-like spin-orbit torque (SOT), and requires the presence of a longitudinal magnetic field for deterministic switching of its magnetization. Still further, in some embodiments where the magnetic layer includes a non-colinear antiferromagnet (AFM), the non-colinear AFM does not exhibit the PMA as mentioned above but rather exhibits a large anomalous Hall effect (AHE) due to the presence of Berry curvature in this non-colinear AFM. In that case, the non-colinear AFM can still be used as the magnetic layer in the spin-orbit torque magnetic field sensor because of its different switchable AFM states (switchable using SOT using a similar principle as outlined above). An example of such non-colinear AFM is $Mn_3Sn$.

Alternative embodiments of the invention include: (i) the magnetic layer 202 comprises a ferromagnetic layer 208, and the ferromagnetic layer 208 comprises cobalt (Co), iron (Fe), nickel (Ni), cobalt iron boron (CoFeB), gadolinium (Gd), yttrium iron garnet (YIG), ferrites, or alloys of Co, Fe, Ni, Mn, Cr, V, CoFeB, Gd, Te, Pt or Ir, or any other ferromagnetic materials with a PMA; (ii) the metal layer 206 comprises a heavy metal (HM), an antiferromagnetic (AFM) material, a topological insulator (TI) or a transition metal dichalcogenides (TMD) or any material with a large spin-orbit interaction (SOI); (iii) the heavy metal includes platinum (Pt), palladium (Pd), tantalum (Ta), tungsten (W), lead (Pb), niobium (Nb), CuPt, AuPt or NiPt; (iv) antiferromagnetic (AFM) material includes IrMn, PtMn or PtNiMn; (v) the TMD includes $WTe_2$, $MoTe_2$ or $PtSe_2$; (vi) the topological insulator includes $Bi_2Se_3$, $Bi_2Te_3$, $Sb_2Te_3$; (vii) the magnetic layer 202 comprises a non-colinear antiferromagnet; (viii) the magnetic layer 202 comprises a single ferromagnetic layer or a single ferrimagnetic layer which is able to generate a SOT using a charge current; and (ix) the spin-orbit torque magnetic field sensor being in the form of a magnetic tunnel junction (instead of a Hall bar as shown in embodiments above) for increasing a signal amplitude by at least 1-2 orders, and therefore significantly improving a magnetic field detectivity.

Although only certain embodiments of the present invention have been described in detail, many variations are possible in accordance with the appended claims. For example, features described in relation to one embodiment may be incorporated into one or more other embodiments and vice versa.

The invention claimed is:

1. A method for detecting a magnetic field using a spin-orbit torque magnetic field sensor, the spin-orbit torque magnetic field sensor comprising a magnetic layer having a switchable magnetic state, the method comprising:
providing an alternating current to the spin-orbit torque magnetic field sensor for creating an oscillatory spin-orbit torque in the magnetic layer to switch the switchable magnetic state between two magnetic states of the magnetic layer in the magnetic field; and
measuring an output voltage of the spin-orbit torque magnetic field sensor, the output voltage being dependent on the magnetic field,
wherein the output voltage is a time average of a time-varying anomalous Hall voltage generated in the magnetic layer in response to the oscillatory spin-orbit torque and the magnetic field, the time-varying anomalous Hall voltage being a function of the alternating current and a Hall resistance of the magnetic layer, and the Hall resistance being associated with a duration in which the switchable magnetization is in each of the two magnetic states, wherein the duration in which the switchable magnetic state is in each of the two magnetic states is associated with a magnitude and a polarity of the magnetic field.

2. The method of claim 1, wherein the output voltage is linearly dependent on the magnetic field.

3. The method of claim 1, further comprising:
providing another spin-orbit torque magnetic field sensor, wherein a longitudinal axis of the another spin-orbit torque magnetic field sensor is perpendicular to a longitudinal axis of the spin-orbit torque magnetic field sensor;
providing another alternating current to the another spin-orbit torque magnetic field sensor in the magnetic field;
measuring another output voltage of the another spin-orbit torque magnetic field sensor, the another output voltage being dependent on the magnetic field and is a time average of a time-varying anomalous Hall voltage generated in the another spin-orbit torque magnetic field sensor; and
calculating an angle of the magnetic field using the output voltage of the spin-orbit torque magnetic field sensor and the another output voltage of the another spin-orbit torque magnetic field sensor.

4. The method of claim 1, further comprising setting an amplitude of the alternating current to be greater than a critical current of the magnetic layer, the critical current having a magnitude at which the Hall resistance of the magnetic layer starts to saturate.

5. The method of claim 1, further comprising setting an amplitude of the alternating current to a predetermined value to provide a zero output voltage at a zero magnetic field.

6. The method of claim 1, wherein providing the alternating current to the spin-orbit torque magnetic field sensor comprises providing the alternating current in a form of a sinusoidal wave, a square wave, a triangular wave or a sawtooth wave.

7. The method of claim 1, wherein the magnetic layer comprises a ferromagnetic layer and a heavy metal layer, and wherein the switchable magnetic state includes a switchable magnetization, the ferromagnetic layer having a perpendicular magnetic anisotropy and the heavy metal layer is adapted to create the oscillatory spin-orbit torque in response to the alternating current to switch the switchable magnetization of the ferromagnetic layer between an up-state and a down-state, the up-state being a state in which the switchable magnetization is in a direction perpendicular to a longitudinal plane of the magnetic layer and the down-state being a state in which the switchable magnetization is in an opposite direction to that of the up-state.

8. The method of claim 7, further comprising operating the spin-orbit torque magnetic field sensor wherein the ferromagnetic layer is in a superparamagnetic state.

9. An apparatus for detecting a magnetic field, the apparatus comprising:
a spin-orbit torque magnetic field sensor, the sensor comprising a magnetic layer having a switchable magnetic state;
a current source adapted to provide an alternating current to the sensor for creating an oscillatory spin-orbit torque in the magnetic layer to switch the switchable magnetic state of the magnetic layer between two magnetic states in the magnetic field; and
a voltmeter adapted to measure an output voltage of the sensor, the output voltage being dependent on the magnetic field,
wherein the output voltage is a time average of a time-varying anomalous Hall voltage generated in the magnetic layer in response to the magnetic field and the periodical switching of the switchable magnetic state, the time-varying anomalous Hall voltage being a function of the alternating current and a Hall resistance of the magnetic layer, the Hall resistance being associated with a duration in which the switchable magnetic state is in each of the two magnetic states, wherein the duration in which the switchable magnetic state is in each of the two magnetic states is associated with a magnitude and a polarity of the magnetic field.

10. The apparatus of claim 9, wherein the magnetic layer comprises a ferromagnetic layer and a metal layer, and wherein the switchable magnetic state includes a switchable magnetization, the ferromagnetic layer having a perpendicular magnetic anisotropy and the metal layer is adapted to create the oscillatory spin-orbit torque in response to the alternating current to switch the switchable magnetization of the ferromagnetic layer between an up-state and a down-state, the up-state being a state in which the switchable magnetization is in a direction perpendicular to a longitudinal plane of the magnetic layer and the down-state being a state in which the switchable magnetization is in an opposite direction to that of the up-state.

11. The apparatus of claim 10, wherein the ferromagnetic layer comprises cobalt (Co), iron (Fe), nickel (Ni), cobalt iron boron (CoFeB), gadolinium (Gd), yttrium iron garnet (YIG), ferrites, or alloys of Co, Fe, Ni, Mn, Cr, V, CoFeB, Gd, Te, Pt or Ir.

12. The apparatus of claim 10, wherein the metal layer comprises a heavy metal, an antiferromagnetic material, a topological insulator or a transition metal dichalcogenides (TMD).

13. The apparatus of claim 12, wherein the heavy metal includes platinum (Pt), palladium (Pd), tantalum (Ta), tungsten (W, lead (Pb), niobium (Nb), CuPt, AuPt or NiPt.

14. The apparatus of claim 12, wherein the antiferromagnetic material includes IrMn, PtMn or PtNiMn.

15. The apparatus of claim 12, wherein the topological insulator includes $Bi_2Se_3$, $Bi_2Te_3$, or $Sb_2Te_3$, or the TMD includes $WTe_2$, $MoTe_2$ or $PtSe_2$.

16. The apparatus of claim 9, wherein the magnetic layer comprises a non-colinear antiferromagnet.

17. The apparatus of claim 9, wherein magnetic layer comprises a ferromagnetic layer or a ferrimagnetic layer, the ferromagnetic layer or the ferrimagnetic layer being adapted to generate a spin current in response to the alternating current for creating the oscillatory spin-orbit torque and to generate the time-varying anomalous Hall voltage in response to the oscillatory spin-orbit torque and the magnetic field.

18. The apparatus of claim 10, wherein the ferromagnetic layer comprises cobalt iron boron (CoFeB) and the metal layer comprises $WTe_2$.

19. The apparatus of claim 9, further comprising:
   another spin-orbit torque magnetic field sensor, wherein a longitudinal axis of the another spin-orbit torque magnetic field sensor is perpendicular to a longitudinal axis of the spin-orbit torque magnetic field sensor,
   another current source adapted to provide another alternating current to the another spin-orbit torque magnetic field sensor in the magnetic field; and
   another voltmeter adapted to measure another output voltage of the another spin-orbit torque magnetic field sensor, the another output voltage being a time average of a time-varying anomalous Hall voltage generated in the another spin-orbit torque magnetic field sensor,
   wherein an angle of the magnetic field is calculated using the output voltage of the spin-orbit torque magnetic field sensor and the another output voltage of the another spin-orbit torque magnetic field sensor.

20. The apparatus of claim 9, wherein the spin-orbit torque magnetic field sensor includes a Hall bar or a Hall cross structure.

* * * * *